United States Patent
Yang et al.

(10) Patent No.: US 9,465,305 B2
(45) Date of Patent: Oct. 11, 2016

(54) METHOD FOR DETERMINING A COMMUTATION OFFSET AND FOR DETERMINING A COMPENSATION MAP FOR A STAGE

(75) Inventors: Pai-Hsueh Yang, Palo Alto, CA (US); Scott Coakley, Belmont, CA (US); Michael B. Binnard, Belmont, CA (US); Kazuhiro Hirano, Ageo (JP); Bausan Yuan, San Jose, CA (US); Shiang-Lung Koo, Fremont, CA (US)

(73) Assignee: NIKON CORPORATION (JP)

( * ) Notice: Subject to any disclaimer, the term of this patent is extended or adjusted under 35 U.S.C. 154(b) by 962 days.

(21) Appl. No.: 13/101,264

(22) Filed: May 5, 2011

(65) Prior Publication Data
US 2012/0113405 A1 May 10, 2012

Related U.S. Application Data

(60) Provisional application No. 61/345,988, filed on May 18, 2010, provisional application No. 61/363,806, filed on Jul. 13, 2010.

(51) Int. Cl.
*H02K 41/00* (2006.01)
*G03F 7/20* (2006.01)
*H02P 6/00* (2016.01)

(52) U.S. Cl.
CPC ....... *G03F 7/70758* (2013.01); *G03F 7/70516* (2013.01); *G03F 7/70775* (2013.01); *H02P 6/006* (2013.01)

(58) Field of Classification Search
CPC ...... H02K 17/28; H02K 27/12; H02K 47/22; B23Q 5/54; H02P 25/04
See application file for complete search history.

(56) References Cited

U.S. PATENT DOCUMENTS

| | | |
|---|---|---|
| 6,836,315 B2 | 12/2004 | Rose |
| 6,992,752 B2 | 1/2006 | DeJongh |
| 7,005,823 B2 | 2/2006 | Houkes et al. |
| 7,205,741 B2 | 4/2007 | Simons et al. |

(Continued)

OTHER PUBLICATIONS

U.S. Appl. No. 13/110,760 (related to present application), filed May 18, 2011, Nikon Corporation U.S. Appl. No. 13/110,760 and its entire prosecution history.

(Continued)

*Primary Examiner* — Shawki S Ismail
*Assistant Examiner* — Zoheb Imtiaz
(74) *Attorney, Agent, or Firm* — Roeder & Broder LLP; Steven G. Roeder

(57) ABSTRACT

A method for determining a commutation offset for a mover (250A) of a mover assembly (220C) that moves and positions a stage (220A) relative to a stage base (220B) includes controlling the mover assembly (220C) in a closed loop fashion to maintain the position of the stage (220A) along a first axis and along a second axis with the stage (220A) levitated above the stage base (220B). The method also includes the steps of (i) directing current to a coil array (240) of the mover assembly (220C) so that the mover assembly (220C) imparts a disturbance on the stage (220A); and (ii) evaluating one or more forces generated by the mover assembly (220C) as a result of the disturbance on the stage (220A) created by the mover (250A). Further, a method for generating a compensation map (1402) includes sequentially directing a plurality of excitation signals to the control of the mover assembly (220C) and determining the control commands that result from the plurality of excitation signals.

41 Claims, 27 Drawing Sheets

(56) References Cited

U.S. PATENT DOCUMENTS

| | | | |
|---|---|---|---|
| 7,468,589 B2 | 12/2008 | Cox et al. | |
| 2005/0285550 A1* | 12/2005 | Simons | G03F 7/70725 318/135 |
| 2009/0001917 A1* | 1/2009 | Hosek | F16C 32/0493 318/491 |
| 2009/0263747 A1* | 10/2009 | Coakley | G03B 27/58 430/311 |

OTHER PUBLICATIONS

Office Action in Taiwanese Patent Application No. 100117307, which claims priority on the present application.

Office Action in Taiwanese Patent Application No. 100117307, which claims priority on the present application. (Document states at bottom: "Date of completion of the search: Jan. 9, 2015.").

\* cited by examiner

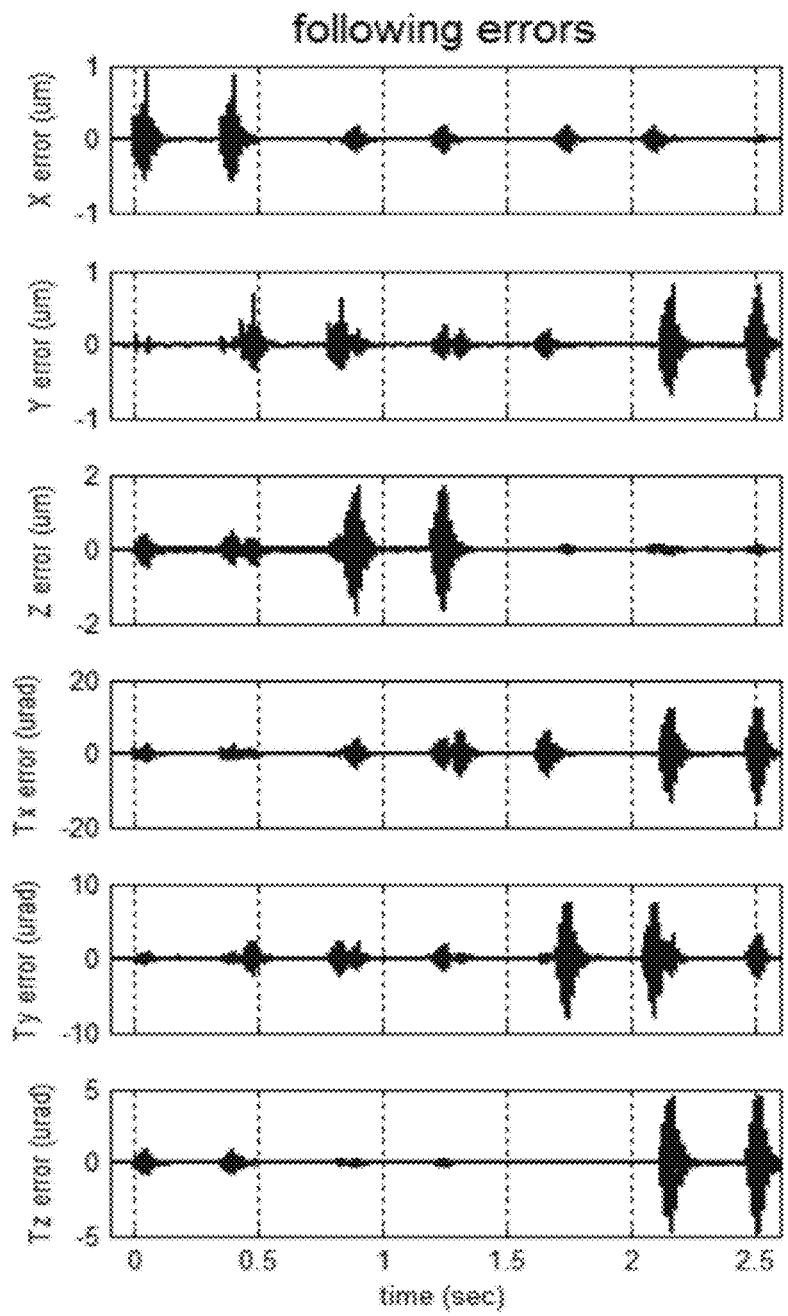

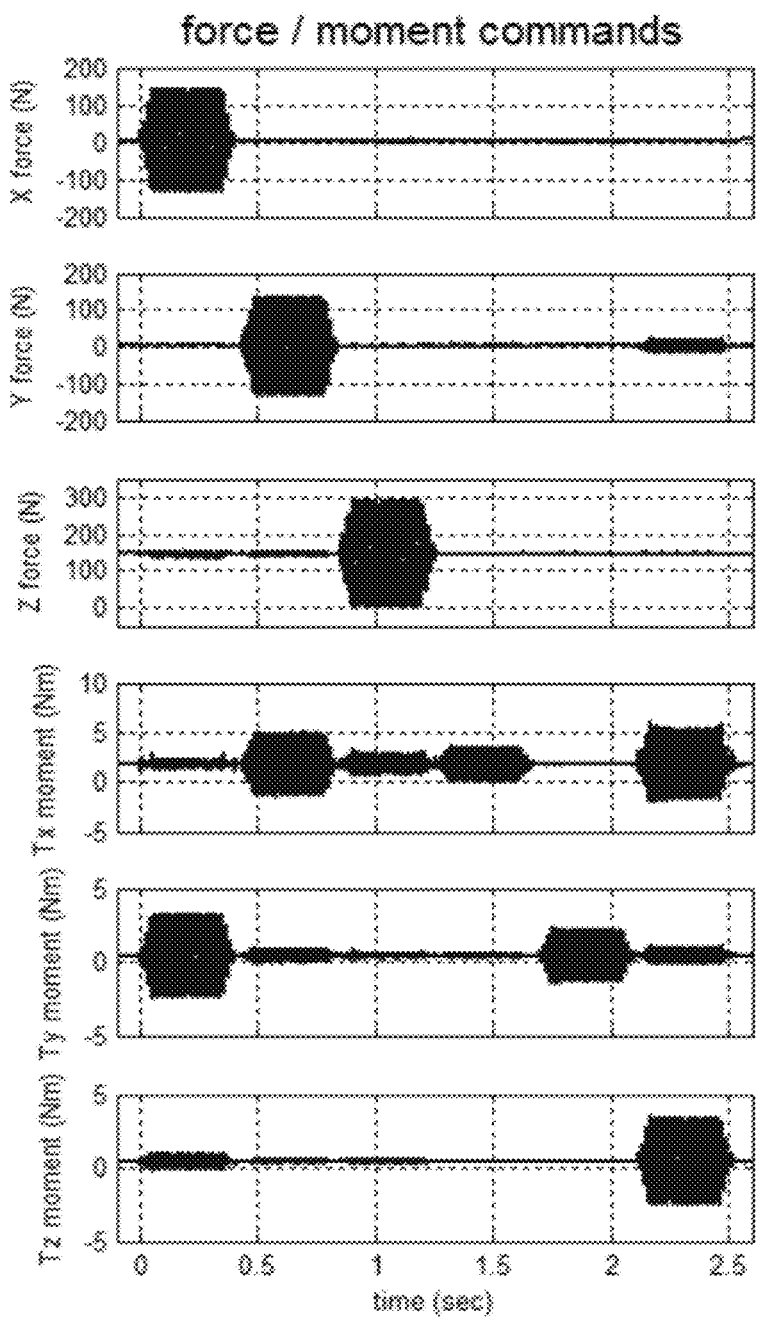

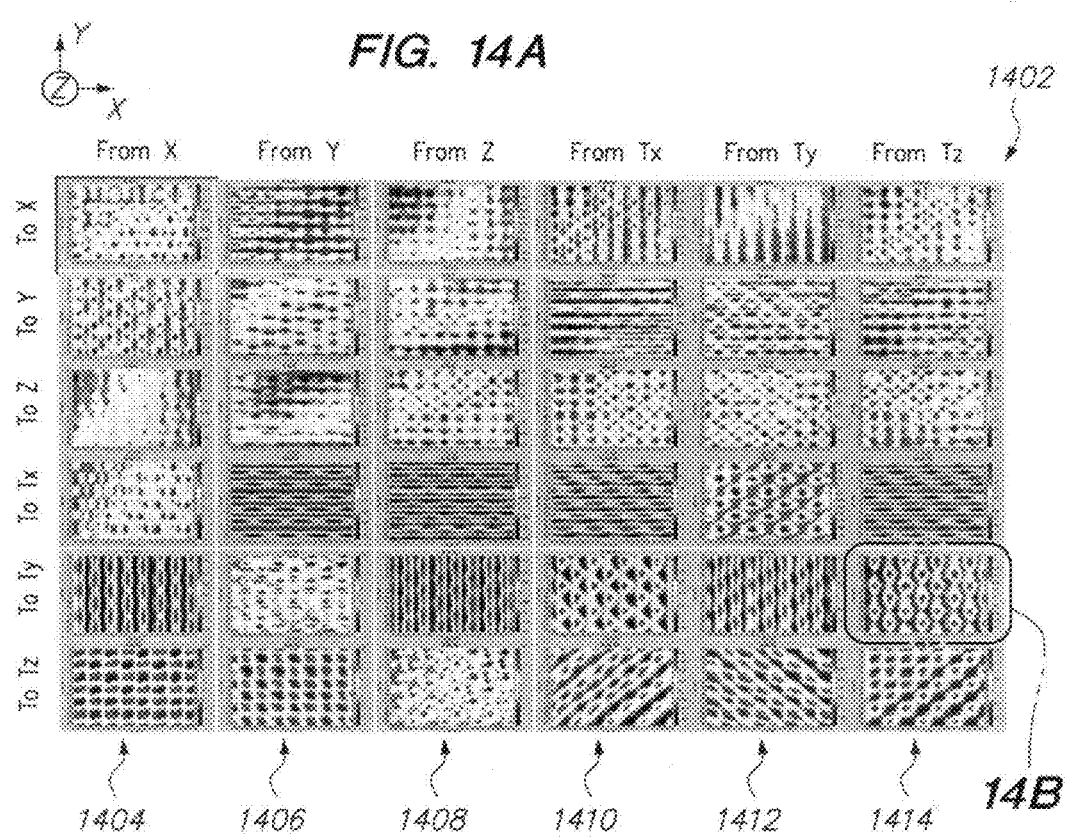

METHOD FOR DETERMINING A COMMUTATION OFFSET AND FOR DETERMINING A COMPENSATION MAP FOR A STAGE

RELATED APPLICATION

The application claims priority on Provisional Application Ser. No. 61/345,988 filed on May 18, 2010, entitled "METHOD FOR DETERMINIG COMMUTATION OFFSET", and on Provisional Application Ser. No. 61/363,806 filed on Jul. 13, 2010, entitled "METHOD FOR DETERMINING COMMUTATION OFFSET". As far as is permitted, the contents of Provisional Application Ser. Nos. 61/345,988 and 61/363,806 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly having an optical axis, a wafer stage assembly that positions a semiconductor wafer, a measurement system, and a control system. Each stage assembly includes one or more movers, and each of the movers includes a coil array that interacts with a magnet assembly. The measurement system constantly monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

In certain designs, the position of the respective stage measured by the measurement system is not an absolute position, but instead is relative to where the stage assembly happens to be when the measurement system is initialized. Therefore, it is imperative to determine an offset value that aligns the measured interferometer position to the actual poles of the magnet assembly for proper commutation of the movers. This offset value is often called the "commutation offset".

The amount of force generated by each mover is a sinusoidal function of how accurately the commutation offset value is determined. For example, if the error between the calculated and real commutation offset is three percent, then the force generated by the mover is approximately ninety-eight percent of the maximum possible (and expected) force. However, for a commutation error of seven percent, the force falls to approximately ninety percent. Thus, it is important to accurately determine the commutation offset for each mover so that each mover operates efficiently and accurately.

SUMMARY

The present invention is directed to a method for determining a commutation offset for a mover of a mover assembly that moves and positions a stage relative to a stage base. In one embodiment, the mover generates a first axis force that moves and positions the stage along a first axis, and a second axis force that moves and positions the stage along a vertically oriented second axis that is orthogonal to the first axis. Further, the mover includes a coil array. The method includes controlling the mover assembly in a closed loop fashion to maintain the position of the stage along the first axis and along the second axis with the stage levitated above the stage base. Additionally, the method includes determining a first commutation offset for the mover. This step can include (i) directing current to the coil array so that the mover imparts a disturbance on the stage, and (ii) evaluating one or more forces generated by the mover assembly as a result of the disturbance on the stage created by the mover.

With some of the methods provided herein, the stage is levitated during the commutation procedure. As a result thereof, the present method can be used for a planar or linear motor arrangement such as a magnetic levitation ("maglev") type stage, which does not have redundant movers that generate forces along the second axis.

The present invention is also directed to a control system for determining a commutation offset for a mover of a mover assembly. The present invention is additionally directed to a stage assembly that moves a work piece, the stage assembly including a stage that retains the work piece and a mover in which the commutation offset is determined utilizing one of the methods provided herein. In yet another embodiment, the present invention is directed to an exposure apparatus that includes an illumination system and a stage assembly that moves the stage relative to the illumination system. In still another embodiment, the present invention is directed to a process for manufacturing a device that includes the steps of providing a substrate and forming an image to the substrate with the exposure apparatus.

In still another embodiment, the present invention is directed to a method for controlling a mover assembly that includes the steps of: controlling the mover assembly with a control system to position the stage at a first test position; applying a first excitation signal with the control system to the mover assembly with the stage at the first test position; and determining a first set of control commands for the first excitation signal. In this embodiment, a second excitation signal can be applied to the mover assembly with the stage at the first test position, and a second set of control commands for the second excitation signal can be determined. Further, in this embodiment, the mover assembly can be controlled with the control system utilizing information from the sets of control commands.

Additionally, the method can include the steps of generating a compensation map from the first set of control commands and the second set of control commands, and controlling the mover assembly with the control system utilizing information from the compensation map.

Moreover, the present invention is directed to a mover assembly that moves and positions a stage relative to a stage base, the mover assembly comprising: a mover that moves and positions the stage relative to the stage base; and a control system that controls the mover, the control system (i) directing current to the mover to position the stage at a first test position; (ii) applying a first excitation signal to the mover with the stage at the first test position; and (iii) determining a first set of control commands for the first excitation signal.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 11B-11G illustrate following errors versus time that result from the excitation signals;

FIGS. 11H-11M illustrate control commands versus time;

FIG. 14A is a simplified illustration of a compensation map;

DESCRIPTION

Figure 1:
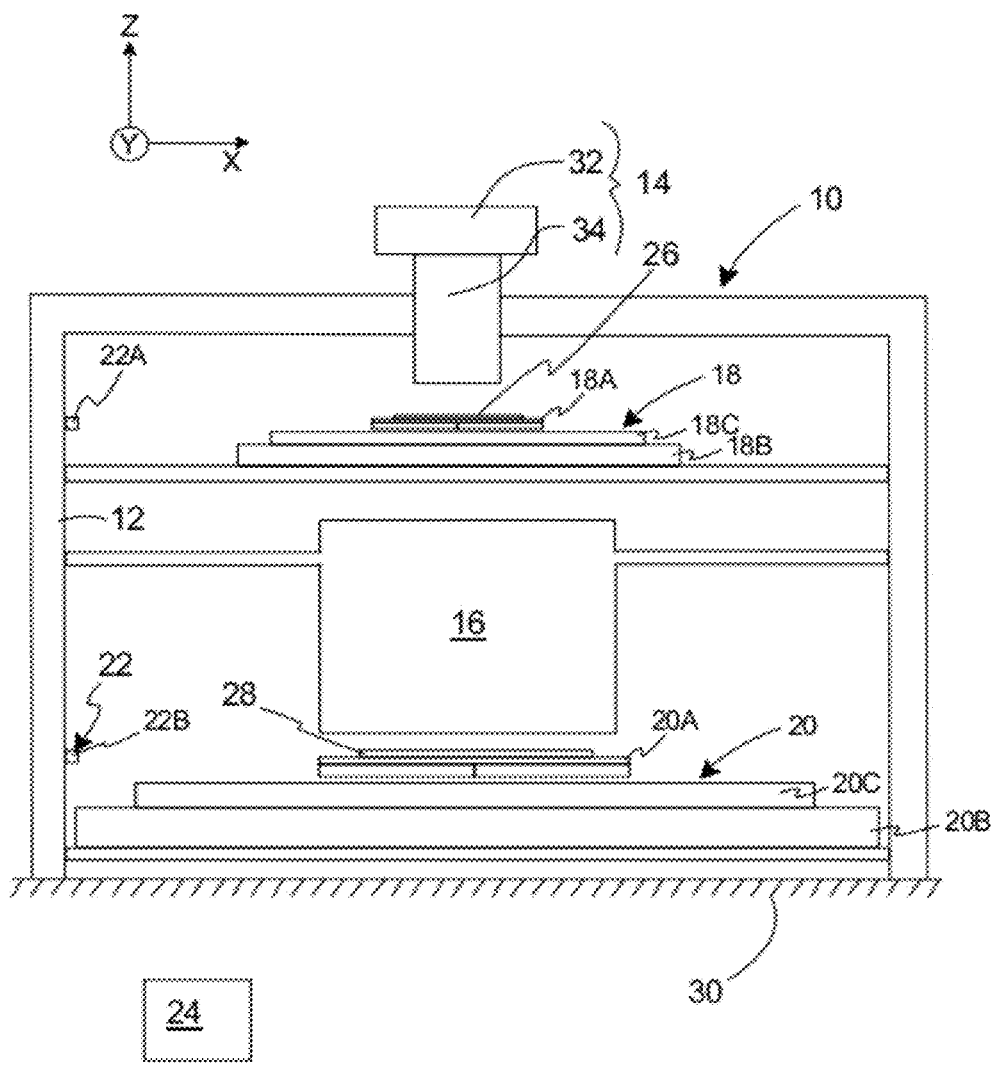
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10. The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

As an overview, in certain embodiments, the control system 24 disclosed herein utilizes one or more unique methods to determine commutation offsets for the movers of one or both of the stage assemblies 18, 20 with improved accuracy. Further, in certain embodiments, the control system 24 disclosed herein utilizes one or more other compensation methods that improve the positioning of the respective stage assemblies 18, 20. As a result thereof, the wafer 28 and/or the reticle 26 can be positioned with improved accuracy, and the stage assemblies 18, 20 can be operated more efficiently. This can result in the manufacturing of higher density wafers 28 with the exposure apparatus 10.

A number of Figures include an orientation system that illustrates an X axis, a Y axis that is orthogonal to the X axis, and the Z axis that is orthogonal to the X and Y axes. It should be noted that any of these axes can also be referred to as the first, second, and/or third axes.

There are a number of different types of lithographic devices. For example, the exposure apparatus 10 can be used as a scanning type photolithography system. Alternatively, the exposure apparatus 10 can be a step-and-repeat type photolithography system. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 is rigid and supports the components of the exposure apparatus 10. The apparatus frame 12 illustrated in FIG. 1 supports the reticle stage assembly 18, the optical assembly 16, and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The illumination source 32 can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam.

The optical assembly 16 projects and/or focuses the light leaving the reticle 26 to the wafer 28. Depending upon the design of the exposure apparatus 10, the optical assembly 16 can magnify or reduce the image illuminated on the reticle 26.

The reticle stage assembly 18 holds and positions the reticle 26 relative to the optical assembly 16 and the wafer 28. In FIG. 1, the reticle stage assembly 18 includes a reticle stage 18A that retains the reticle 26, a reticle stage base 18B, and a reticle stage mover assembly 18C that positions the reticle stage 18A and the reticle 26. The reticle stage mover assembly 18B can be designed to move the reticle 26 with six degrees of freedom (X, Y, and Z axes, and about X, Y, and Z axes) relative to the reticle stage base 18B. In alternate embodiments, the reticle stage mover assembly 18B can be designed to move the reticle 26 with one (Y axis) or three (X and Y axes, and about Z axis) degrees of freedom.

Somewhat similarly, the wafer stage assembly 20 holds and positions the wafer 28 with respect to the projected image of the illuminated portions of the reticle 26. In FIG. 1, the wafer stage assembly 20 includes a wafer stage 20A that retains the wafer 28, a wafer stage base 20B, and a wafer stage mover assembly 20C that positions the wafer stage 20A and the wafer 28. The wafer stage mover assembly 20C can be designed to move the wafer 28 with up to six degrees of freedom (along the X, Y, and Z axes, and about X, Y, and Z axes) relative to the wafer stage base 20B.

The measurement system 22 monitors movement of the reticle 26 and the wafer 28 relative to the optical assembly 16 or some other reference. With this information, the apparatus control system 24 can control the reticle stage assembly 18 to precisely position the reticle 26 and the wafer stage assembly 20 to precisely position the wafer 28. For example, the measurement system 22 can utilize multiple laser interferometers, encoders, autofocus systems, and/or other measuring devices. In FIG. 1, the measurement system 22 includes (i) a reticle measurement system 22A (illustrated as a box) that monitors the position of the reticle stage 18B and the reticle 26, and (ii) a wafer measurement system 22B (illustrated as a box) that monitors the position of the wafer stage 20A.

The control system 24 is connected to the reticle stage assembly 18, the wafer stage assembly 20, and the measurement system 22. The assembly control system 24 receives information from the measurement system 22 and controls the stage assemblies 18, 20 to precisely position the reticle 26 and the wafer 28. The assembly control system 24 can include one or more processors and circuits.

Figure 2A:
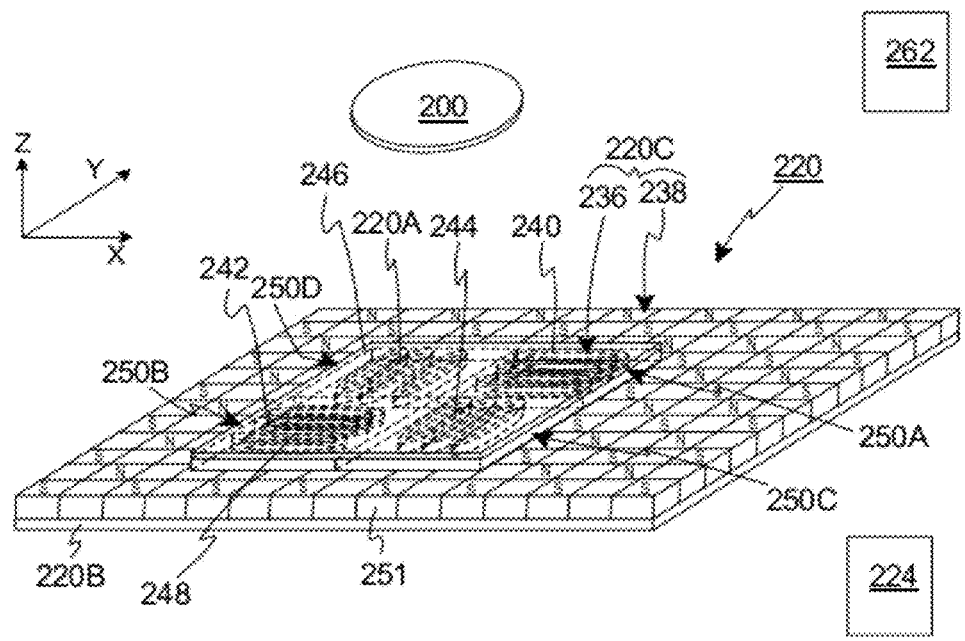
FIG. 2A is a simplified top perspective illustration of a mover assembly having features of the present invention.

FIG. 2A is a simplified schematic illustration of a control system 224, and a stage assembly 220 that positions a work piece 200 (illustrated above the stage assembly 220) with improved accuracy and improved efficiency. In one embodiment, the work piece 200 can be the wafer 28 (illustrated in FIG. 1) and the stage assembly 220 can be used as the wafer stage assembly 22. Alternatively, the stage assembly 220 can be used to move and position other types of work pieces 200 (e.g. the reticle 26 illustrated in FIG. 1) during manufacturing and/or inspection.

In FIG. 2A, the stage assembly 220 includes a stage 220A, a stage base 220B, and a stage mover assembly 220C. The design of these components can be varied to suit the requirements of the stage assembly 220. The stage 220A selectively retains the work piece 200. For example, the stage 220A can include a chuck for selectively retaining the work piece 200. The stage base 220B supports a portion of the stage mover assembly 220C. In FIG. 2A, the stage 220A is a rigid, generally rectangular shaped plate, and the stage base 220B is also a rigid, generally rectangular shaped plate.

The stage mover assembly 220C moves the stage 220A and the work piece 200 relative to the stage base 220B. In FIG. 2A, the stage mover assembly 220C is designed to move the stage 220A with six degrees of freedom, namely along the X axis, along the Y axis, along the Z axis, about the X axis (theta X (Tx)), about the Y axis (theta Y (Ty)), and about the Z axis (theta Z (Tz)). Alternatively, the stage mover assembly 220C can be designed to move the stage 220A with fewer than six degrees of freedom.

In FIG. 2A, the stage mover assembly 220C includes a coil assembly 236 that is fixed to and moves with the stage 220A, and a magnet assembly 238 that is fixed to the stage base 220B that cooperate to define a planar motor. In this embodiment, the coil assembly 236 includes a first YZ coil array 240, a second YZ coil array 242, a first XZ coil array 244, and a second XZ coil array 246. In this embodiment, the stage 220A can be divided into four quadrants, and one of the coil arrays 240, 242, 244, 246 is secured to each of the quadrants. More specifically, in this embodiment, (i) the first XZ coil array 244 is secured to a right front quadrant of the stage 220A; (ii) the first YZ coil array 240 is secured to a right rear quadrant of the stage 220A; (iii) the second YZ coil array 242 is secured to a left front quadrant of the stage 220A; and (iv) the second XZ coil array 246 is secured to a left rear quadrant of the stage 220A. Moreover, in this embodiment, the YZ coil arrays 240, 242 are oriented so that their coil wires are aligned perpendicular to the Y axis, and the XZ coil arrays 244, 246 are oriented so that their coil wires are aligned perpendicular to the X axis. Alternatively, the arrangement of the coil arrays 240, 242, 244, 246 can be different than that illustrated in FIG. 2A.

As provided herein, each coil array 240, 242, 244, 246 includes one or more coils 248. In FIG. 2A, the stage mover assembly 220C includes four, three phase motors. Thus, each coil array 240, 242, 244, 246 includes a multiple of three coils 248. In the simplified example illustrated in FIG. 2A, each of the coil arrays 240, 242, 244, 246 includes three partly overlapping coils 248. For each coil array 240, 242, 244, 246, (i) one of the coils 248 can be referred to as the U phase coil; (ii) one of the coils 248 can be referred to as the V phase coil; and (iii) one of the coils 248 can be referred to as the W phase coil. A suitable coil array is described in detail in U.S. Pat. No. 6,208,045 and U.S. Pat. No. 7,205,741 B1, the contents of which are incorporated herein by reference. Alternatively, for example, each coil array 240, 242, 244, 246 can be a two phase system that includes a multiple of two coils 248.

Further, in FIG. 2A, the coil arrays 240, 242, 244, 246 are designed and positioned (i) so that current can be directed to the first YZ coil array 240 and the second YZ coil array 242 to create forces on the stage along the Y axis and along the Z axis; and (ii) so that current can be directed to the first XZ coil array 244 and the second XZ coil array 246 to create forces on the stage 220A along the X axis and along the Z axis. With this design, (i) the first YZ coil array 240 cooperates with the magnet array 238 to define a first YZ mover 250A that generates a first Y axis force (oriented along the Y axis) that moves the stage 220A along the Y axis, and that generates a first Z axis force (oriented along the Z) that moves the stage 220A along the Z axis; (ii) the second YZ coil array 242 cooperates with the magnet array 238 to define a second YZ mover 250B that generates a second Y axis force (oriented along the Y axis) that moves the stage 220A along the Y axis, and that generates a second Z axis force (oriented along the Z axis) that moves the stage 220A along the Z along the Z axis; (iii) the first XZ coil array 244 cooperates with the magnet array 238 to define a first XZ mover 250C that generates a first X axis force (oriented along the X axis) that moves the stage 220A along the X axis, and that generates a third Z axis force (oriented along the Z) that moves the stage 220A along the Z axis; and (iv) the second XZ coil array 246 cooperates with the magnet array 238 to define a second XZ mover 250D that generates a second X axis force (oriented with the X axis) that moves the stage 220A along the X axis, and that generates a fourth Z axis force (oriented with the Z axis) that moves the stage 220A along the Z axis.

It should be noted that any of the X, Y, or Z axis forces can alternatively be referred to as a first axis force, a second axis force, or a third axis force.

Moreover, in FIG. 2A, the magnet assembly 238 includes a two dimensional array (orientated along the X and Y axes) of magnets 251 that are secured to the stage base 220B. In one non-exclusive embodiment, the magnets 251 are configured in a checkerboard pattern with a plurality of rows in the X direction, and a plurality of columns in the Y direction. In this embodiment, the polar axes of all magnets 251 in the magnet assembly 238 are aligned parallel to the Z direction (perpendicular to the X-Y coordinate plane). Alternatively, for example, the magnets 251 can be arranged so that the rows are at an angle (e.g. forty-five degrees) relative to the X direction, and the columns are at an angle (e.g. forty-five degrees) relative to the Y direction.

Further, in FIG. 2A, the magnets 251 within any row or column have the same polarity. For example, all of the magnets 251 in right most column have the S pole facing upward (labeled with an "S"), and all of the magnets 251 in second to the right most column have the N pole facing upward (labeled with an "N"). In FIG. 2A, there are twelve rows of magnets 251 and fifteen columns of magnets 251. In some embodiments, particularly those involving moving coil motors, the numbers of rows and columns in a magnetic assembly 238 are substantially larger, providing for a larger desired range of travel. In this embodiment, the magnets 251 are all equal in size and square in cross-section, although magnets 251 of other shapes are also possible.

In an alternative embodiment, the stage mover assembly can be designed so that the coil assembly 236 is fixed to the stage base 220B and the magnet assembly 238 is secured to and moves with the stage 220A. Alternatively or additionally, the stage mover assembly can include one or more linear motors or another type of mover.

In this embodiment, the control system 224 independently and concurrently directs a different current to the each of the three (U, V, W) phase coils 248 for each of the coil arrays 240, 242, 244, 246 to precisely position the work piece 200 and the stage 220A. Stated in another fashion, in this embodiment, the control system 224 directs a three phase commutated electric current to the each of the coil arrays 240, 242, 244, 246. With this design, the coil arrays 240, 242, 244, 246 are powered to move relative to the stationary magnet assembly 238. Alternatively, the stage mover assembly 220C can be designed so that the magnet assembly 238 moves relative to stationary coil arrays 240, 242, 244, 246. The control system 224 can include one or more processors that are programmed to perform the steps provided herein.

In one embodiment, to control the first YZ mover 250A, the control system 224 utilizes the following motor commutations to determine the current to be directed to the different phases of the first YZ coil array 240:

$$\begin{pmatrix} I_{u,YZ1} \\ I_{v,YZ1} \\ I_{w,YZ1} \end{pmatrix} = \quad \text{Equation (1)}$$

$$\begin{pmatrix} \sin\left(2\pi \cdot \frac{y + y_{o,YZ1}}{L}\right) & \cos\left(2\pi \cdot \frac{y + y_{o,YZ1}}{L}\right) \\ \sin\left(2\pi \cdot \frac{y + y_{o,YZ1}}{L} + \frac{2\pi}{3}\right) & \cos\left(2\pi \cdot \frac{y + y_{o,YZ1}}{L} + \frac{2\pi}{3}\right) \\ \sin\left(2\pi \cdot \frac{y + y_{o,YZ1}}{L} + \frac{4\pi}{3}\right) & \cos\left(2\pi \cdot \frac{y + y_{o,YZ1}}{L} + \frac{4\pi}{3}\right) \end{pmatrix}$$

$$\cdot \begin{pmatrix} A_{y,YZ1} \\ A_{z,YZ1} \end{pmatrix}$$

$$A_{y,YZ1} = \frac{F_{Y1}}{k_{y,YZ1}}$$

$$A_{z,YZ1} = \frac{F_{Z1}}{k_{z,YZ1}}$$

For the first YZ coil array 240, Equation (1) is the motor commutation formula, used to determine the current commands $I_{u,YZ1}$, $I_{v,YZ1}$, and $I_{w,YZ1}$ directed to U, V, W phase coils respectively. Further, in Equation (1), (i) y is the present measured position along the Y axis of the coil assembly 236 (e.g. as measured with the measurement system 22 illustrated in FIG. 1); (ii) $y_{o,YZ1}$ is the commutation offset of the first YZ coil array 240; (iii) $k_{y,YZ1}$ and $k_{z,YZ1}$ are the motor force constants along Y and Z axis of the first YZ mover 250A, (iv) $F_{Y1}$ and $F_{Z1}$ are the motor force commands along the Y and Z axes of the first YZ mover 250A, determined by the control system 224, (v) $A_{y,ZY1}$ and $A_{z,ZY1}$ are the required current amplitudes required to produce the desired force along Y and Z axes respectively for the first YZ mover 250A and (vi) L is the associated motor commutation pitch.

Somewhat similarly, to control the second YZ mover 250B, the control system 224 utilizes the following motor commutations to determine the magnitude of the current to be directed to the U, V, W phases of the second YZ coil array 242:

$$\begin{pmatrix} I_{u,YZ2} \\ I_{v,YZ2} \\ I_{w,YZ2} \end{pmatrix} = \quad \text{Equation (2)}$$

-continued $$\begin{pmatrix} \sin\left(2\pi \cdot \frac{y+y_{o,YZ2}}{L}\right) & \cos\left(2\pi \cdot \frac{y+y_{o,YZ2}}{L}\right) \\ \sin\left(2\pi \cdot \frac{y+y_{o,YZ2}}{L} + \frac{2\pi}{3}\right) & \cos\left(2\pi \cdot \frac{y+y_{o,YZ2}}{L} + \frac{2\pi}{3}\right) \\ \sin\left(2\pi \cdot \frac{y+y_{o,YZ2}}{L} + \frac{4\pi}{3}\right) & \cos\left(2\pi \cdot \frac{y+y_{o,YZ2}}{L} + \frac{4\pi}{3}\right) \end{pmatrix} \cdot$$

$$\begin{pmatrix} A_{y,YZ2} \\ A_{z,YZ2} \end{pmatrix}$$

$$A_{y,YZ2} = \frac{F_{Y2}}{k_{y,YZ2}}$$

$$A_{z,YZ2} = \frac{F_{Z2}}{k_{z,YZ2}}$$

For the second YZ coil array 242, Equation (2) is the motor commutation formula, used to determine the current commands $I_{u,YZ2}$, $I_{v,YZ2}$, and $I_{w,YZ2}$ directed to U, V, W phase coils respectively. Further, in Equation (2), (i) y is the present measured position along the Y axis of the coil assembly 236 (e.g. as measured with the measurement system 22 illustrated in FIG. 1); (ii) $y_{o,YZ2}$ is the commutation offset of the second YZ coil array 242; (iii) $k_{y,YZ2}$ and $k_{z,YZ2}$ are the motor force constants along Y and Z axis of the second YZ mover 250B (iv) $F_{Y2}$ and $F_{Z2}$ are the motor force commands along the Y and Z axes of the second YZ mover 250B, determined by the control system 224, (v) $A_{y,YZ2}$ and $A_{z,YZ2}$ are the required current amplitudes required to produce the desired force along Y and Z axes respectively for the second YZ mover 250B and (vi) L is the associated motor commutation pitch.

Further, to control the first XZ mover 250C, the control system 224 utilizes the following motor commutations to determine the magnitude of the current to be directed to the different phases of the first XZ coil array 244:

$$\begin{pmatrix} I_{u,XZ1} \\ I_{v,XZ1} \\ I_{w,XZ1} \end{pmatrix} = \qquad \text{Equation (3)}$$

$$\begin{pmatrix} \sin\left(2\pi \cdot \frac{x+x_{o,XZ1}}{L}\right) & \cos\left(2\pi \cdot \frac{x+x_{o,XZ1}}{L}\right) \\ \sin\left(2\pi \cdot \frac{x+x_{o,XZ1}}{L} + \frac{2\pi}{3}\right) & \cos\left(2\pi \cdot \frac{x+x_{o,XZ1}}{L} + \frac{2\pi}{3}\right) \\ \sin\left(2\pi \cdot \frac{x+x_{o,XZ1}}{L} + \frac{4\pi}{3}\right) & \cos\left(2\pi \cdot \frac{x+x_{o,XZ1}}{L} + \frac{4\pi}{3}\right) \end{pmatrix} \cdot$$

$$\begin{pmatrix} A_{x,XZ1} \\ A_{z,XZ1} \end{pmatrix}$$

$$A_{x,XZ1} = \frac{F_{X1}}{k_{x,XZ1}}$$

$$A_{z,XZ1} = \frac{F_{Z3}}{k_{z,XZ1}}$$

For the first XZ coil array 244, Equation (3) is the motor commutation formula, used to determine the current commands $I_{u,XZ1}$, $I_{v,XZ1}$, and $I_{w,XZ1}$ directed to U, V, W phase coils respectively. Further, in Equation (3), (i) X is the present measured position along the X axis of the coil assembly 236 (e.g. as measured with the measurement system 22 illustrated in FIG. 1); (ii) $x_{o,XZ1}$ is the commutation offset of the first XZ coil array 244; (iii) $k_{x,XZ1}$ and $k_{z,XZ1}$ are the associated motor force constants along X and Z axis of the first XZ mover 250C, (iv) $F_{X1}$ and $F_{Z3}$ are the motor force commands along the X and Z axes of the first XZ mover 250C, determined by the control system 224, (v) $A_{x,XZ1}$ and $A_{z,XZ1}$ are the required current amplitudes required to produce the desired force along X and Z axes respectively for the first XZ mover 250C and (vi) L is the associated motor commutation pitch.

Moreover, to control the second XZ mover 250D, the control system 224 utilizes the following motor commutations to determine the magnitude of the current to be directed to the different phases of the second XZ coil array 246:

$$\begin{pmatrix} I_{u,XZ2} \\ I_{v,XZ2} \\ I_{w,XZ2} \end{pmatrix} = \qquad \text{Equation (4)}$$

$$\begin{pmatrix} \sin\left(2\pi \cdot \frac{x+x_{o,XZ2}}{L}\right) & \cos\left(2\pi \cdot \frac{x+x_{o,XZ2}}{L}\right) \\ \sin\left(2\pi \cdot \frac{x+x_{o,XZ2}}{L} + \frac{2\pi}{3}\right) & \cos\left(2\pi \cdot \frac{x+x_{o,XZ2}}{L} + \frac{2\pi}{3}\right) \\ \sin\left(2\pi \cdot \frac{x+x_{o,XZ2}}{L} + \frac{4\pi}{3}\right) & \cos\left(2\pi \cdot \frac{x+x_{o,XZ2}}{L} + \frac{4\pi}{3}\right) \end{pmatrix} \cdot$$

$$\begin{pmatrix} A_{x,XZ2} \\ A_{z,XZ2} \end{pmatrix}$$

$$A_{x,XZ2} = \frac{F_{X2}}{k_{x,XZ2}}$$

$$A_{z,XZ2} = \frac{F_{Z4}}{k_{z,XZ2}}$$

For the second XZ coil array 246, Equation (4) is the motor commutation formula, used to determine the current commands $I_{u,XZ2}$, $I_{v,XZ2}$, and $I_{w,XZ2}$ directed to U, V, W phase coils respectively. Further, in Equation (4), (i) X is the present measured position along the X axis of the coil assembly 236 (e.g. as measured with the measurement system 22 illustrated in FIG. 1); (ii) $x_{o,XZ2}$ is the commutation offset of the second XZ coil array 246; (iii) $k_{x,XZ2}$ and $k_{z,XZ2}$ are the associated motor force constants along X and Z axis of the second XZ mover 250D, (iv) $F_{X2}$ and $F_{Z4}$ are the motor force commands along the X and Z axes of the second XZ mover 250D, determined by the control system 224, (v) $A_{x,XZ2}$ and $A_{z,XZ2}$ are the required current amplitudes required to produce the desired force along X and Z axes respectively for the second XZ mover 250C and (vi) L is the associated motor commutation pitch.

It should be noted that the commutation offset $y_{o,YZ1}$, $y_{o,YZ2}$, $x_{o,XZ1}$, $x_{o,XZ2}$ for each mover 250A-250D is not known. The present invention teaches various methods to estimate the commutation offset $y_{o,YZ1}$, $y_{o,YZ2}$, $x_{o,XZ1}$, $x_{o,XZ2}$ for each of the movers 250A-250D. In the embodiment illustrated in FIG. 2, the movers 250A-250D must be activated to levitate the stage 220A (along the Z axis) during the process of determining the commutation offset for each of the movers 250A-250D. Moreover, in certain methods provided herein, during the estimation of a selected commutation offset, current is directed to the corresponding coil array to impart a disturbance on the stage. Subsequently, the forces generated by the mover assembly as a result of the disturbance on the stage are evaluated to estimate the commutation offset.

Figure 2B:
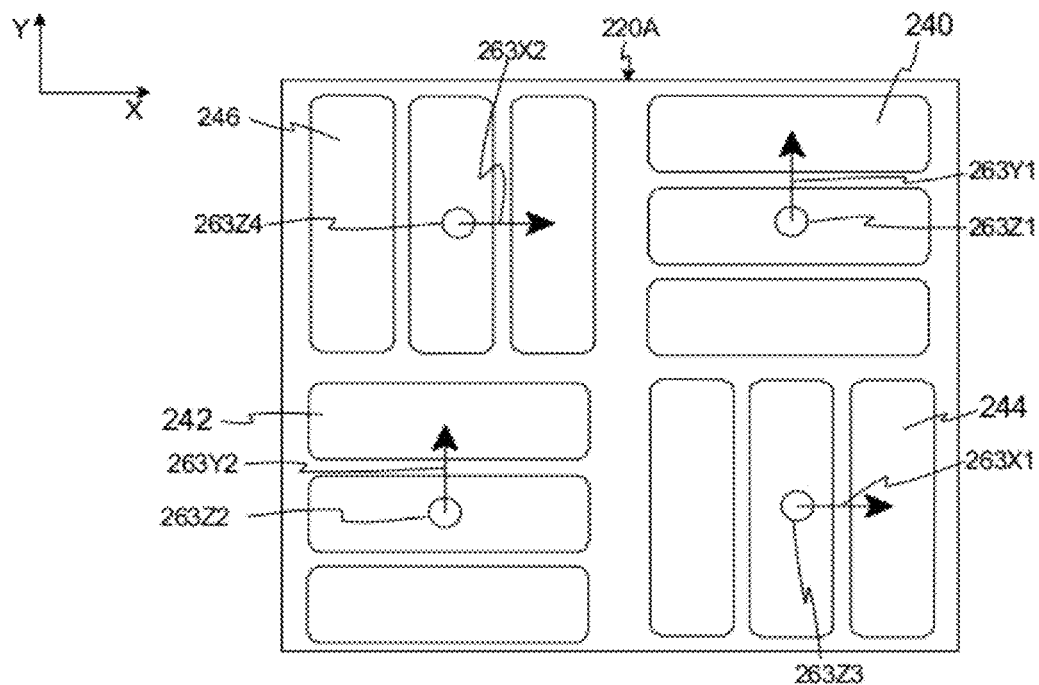
FIG. 2B is a simplified view of a portion of the mover assembly of FIG. 2A.

FIG. 2B is a simplified bottom view of stage 220A and the coil arrays 240, 242, 244, 246. As provided above, (i) current directed to the first YZ coil array 240 generates the first Y axis force 263Y1, and the first Z axis force 263Z1 (illustrated as a circle); (ii) current directed to the second YZ coil array 242 generates the second Y axis force 263Y2, and the second Z axis force 263Z2 (illustrated as a circle); (iii) current directed to the first XZ coil array 244 generates the first X axis force 263X1, and the third Z axis force 263Z3 (illustrated as a circle); and (iv) current directed to the second XZ coil array 246 generates the second X axis force 263X2 that moves the stage 220A along the X axis, and the fourth Z axis force 263Z4 (illustrated as a circle).

Figure 3:
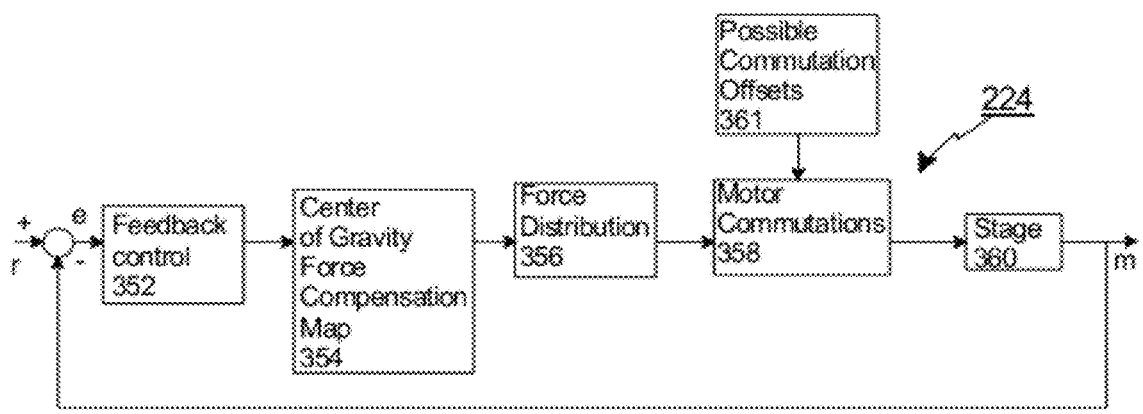
FIG. 3 is a simplified schematic of a control system that can be used to control the mover assembly of FIG. 2A.

FIG. 3 is a simplified control block diagram of the control system 224 that can be used to control the stage mover assembly 220C (illustrated in FIG. 2) to precisely position the work piece 200 (illustrated in FIG. 2). In FIG. 3, (i) "r" represents a desired reference position, e.g. the desired trajectory (along the X, Y, and Z axes, and about the X, Y, and Z axes) of the work piece 200 at a particular moment in time; (ii) "m" represents the measured, actual momentary, position (along the X, Y, and Z axes, and about the X, Y, and Z axes) of the work piece 200 as measured by the measurement system 22 (illustrated in FIG. 1) at a particular moment in time; and (iii) "e" represents a following error (along the X, Y, and Z axes, and about the X, Y, and Z axes), e.g. the error between the desired position "r" and the measured output position "m" of the work piece 200 at a particular moment in time.

In FIG. 3, starting at the left side of the control block diagram, the desired trajectory "r" is fed into the control system 224 along with the measured position "m". Next, the control system 224 determines the following error "e". Subsequently, the following error "e" is fed into a feedback control 352 of the control system 224. The feedback control 352 determines the forces along the X, Y and/or Z axes that are necessary to correct the following error (e.g. the forces necessary to move a center of gravity ("CG") of the stage 220A to the desired trajectory "r"). In certain embodiments, the one or more of the movers 250A-250D of the stage mover assembly 220C may not push through the center of gravity of the stage 220A. In these embodiments, the control system 224 can include a center of gravity force compensation map 354 that compensates for this.

Next, based on the following error "e", the force distribution 356 determines the force commands for each of the movers 250A-250D necessary to correct the following error. More specifically, the control system determines the required magnitude of (i) a first Y axis force command ($F_{Y1}$) and a first Z axis force command ($F_{Z1}$) for the first YZ mover 250A; (ii) a second Y axis force command ($F_{Y2}$) and a second Z axis force command ($F_{Z2}$) for the second YZ mover 250B; (iii) a first X axis force command ($F_{X1}$) and a third Z axis force command ($F_{Z3}$) for the first XZ mover 250C; and (iv) a second X axis force command ($F_{X2}$) and a fourth Z axis force command ($F_{Z4}$) for the second XZ mover 250D. Next, from these force commands, the amplitudes of the currents can be determined.

Subsequently, the motor commutations 358 are utilized to determine the currents that are directed to the U, V, W phases of the coil arrays 240, 242, 244, 246. The currents $I_{u,YZ1}$, $I_{v,YZ1}$, $I_{w,YZ1}$, $I_{u,YZ2}$, $I_{v,YZ2}$, $I_{w,YZ2}$, $I_{u,XZ1}$, $I_{v,XZ1}$, $I_{w,XZ1}$, $I_{u,XZ2}$, $I_{v,XZ2}$, $I_{w,XZ2}$ can be calculated using Equations 1-4. Next, at block 360, the current is directed to the movers 250A-250D and this causes the stage to move.

It should be noted that unless the commutation offsets $y_{o,YZ1}$, $y_{o,YZ2}$, $x_{o,XZ1}$, $x_{o,XZ2}$ for each mover 250A-250D is accurately estimated, that the movers 250A-250D will not function as efficiently and the positioning of the work piece 200 can be adversely influenced. For example, if the commutation offsets $y_{o,YZ1}$, $y_{o,YZ2}$, $x_{o,XZ1}$, $x_{o,XZ2}$ are not correct, the required forces will be larger and the amplitudes of the currents will have to be larger to move the stage to the desired position.

The present invention provides a number of different ways to accurately estimate the commutation offsets $y_{o,YZ1}$, $y_{o,YZ2}$, $x_{o,XZ1}$, $x_{o,XZ2}$. In certain embodiments, the control system 224 includes a possible commutation offset block 361. With this design, during the process of estimating the commutation offset of a particular mover, various possible commutation offsets can be used in the respective commutation formulas to determine the current for the mover that is being evaluated. These processes are described in more detail below.

It should be noted that the methods provided herein can be utilized with movers in which the coils move relative to stationary magnets or the designs in with the magnets move relative to stationary coils.

It should also be noted that the control system 224 can automatically calculate the commutation offset for each mover every time the system is started or any other time deemed appropriate.

Figure 4A:
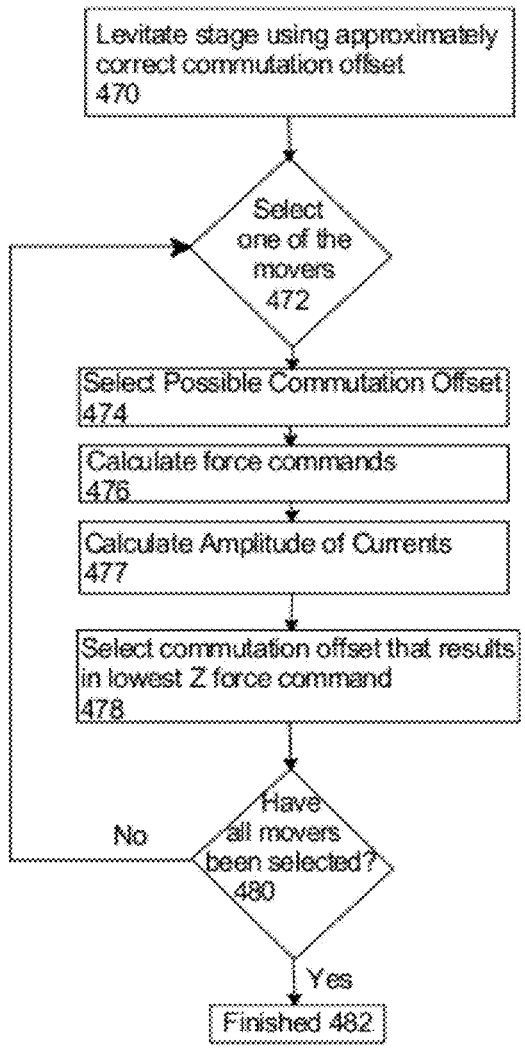
FIG. 4A is a flow chart that illustrates a first process that can be used to estimate the commutation offsets for the mover assembly of FIG. 2A.

FIG. 4A is a flow chart that illustrates a first process that can be used by the control system 224 to estimate the commutation offset $y_{o,YZ1}$, $y_{o,YZ2}$, $x_{o,XZ1}$, $x_{o,XZ2}$ for each of the movers 250A-250D. In this embodiment, at step 470, the stage is levitated using all of the movers 250A-250D. For example, during step 470, an approximately correct commutation offset can be used for each of the movers 250A-250D. One way to determine an approximate commutation offset for each of the movers 250A-250D is to use a sensor 262 (illustrated as a box in FIG. 2 away from the stage assembly 220) to sense the approximate relative position between the respective coil array 240, 242, 244, 246 and magnet assembly 238. For example, the sensor 262 can be a hall sensor or another type of sensor. As long as the approximate commutation offset $y_{o,YZ1}$, $y_{o,YZ2}$, $x_{o,XZ1}$, $x_{o,XZ2}$ is relatively close to the correct value, the movers 250A-250D should be able to levitate the stage. Alternatively, it can be assumed that everything is mechanically perfect when the stage assembly is put together. This sometimes can be good enough to allow the movers 250A-250D to levitate the stage.

Next, the commutation offset $y_{o,YZ1}$, $y_{o,YZ2}$, $x_{o,XZ1}$, $x_{o,XZ2}$ for each of the movers 250A-250D is individually and sequentially determined. More specifically, at step 472, one of the movers 250-250D is selected for determining its commutation offset. For example, the first YZ mover 250A can be initially selected to determine the first YZ commutation offset ("$y_{o,YZ1}$"). Next, with the stage held in a substantially constant position (along the X, Y, and Z axes, and about the X, Y, and Z axes) through closed loop control of the movers 250A-250D, the control system 224 artificially adjusts the first YZ commutation offset of the first YZ coil array 240 in Equation 1. Stated in another fashion, during this step, the control system 224 sequentially utilizes a number of alternative possible commutation offsets to be used as the first YZ commutation offset in Equation 1.

For each alternative possible commutation offset, at step 476, the control system 224 determines (i) the corresponding Y force command ("$F_{Y1}$") for the first YZ mover 250A, and (ii) the corresponding Z force command ("$F_{Z1}$") for the first YZ mover 250A necessary to maintain the stage in the correct, levitated position. Subsequently, at step 477, the control system subsequently, determines the amplitude of the current ($A_{y,XZ1}$) required to produce the Y force command ("$F_{Y1}$"); and the amplitude of the current ($A_{z,ZY1}$) required to produce the Z force command ("$F_{Z1}$").

As the possible commutation offset changes, the force commands and the corresponding current commands generated by the control system 224 will change. This will create a disturbance on the stage. As provided herein, as the possible commutation offset approaches the correct value, the Z force command $F_{Z1}$ and the corresponding Z axis amplitude of the current ($A_{z,ZY1}$) for the first YZ mover 250A will decrease; and as the possible commutation offset moves away from the correct value, the Z force command $F_{Z1}$ and the corresponding Z axis amplitude of the current ($A_{z,YZ1}$) for the first YZ mover 250A will increase. Stated in another fashion, absent external disturbances, the correct possible commutation offset occurs at the lowest Z force command $F_{Z1}$ and the lowest Z axis amplitude of the current ($A_{z,YZ1}$). This is because, as the possible commutation offset approaches the correct value, the first YZ mover 250A becomes more efficient and a smaller current is necessary to maintain the position of the stage. Thus, at step 478, in one embodiment, the control system 224 determines the correct value for the first YZ commutation offset $y_{o,YZ1}$ value by determining the lowest Z force command $F_{Z1}$ and/or the lowest corresponding Z axis amplitude of the current ($A_{z,YZ1}$) necessary to maintain the position of the stage.

Figure 4B:
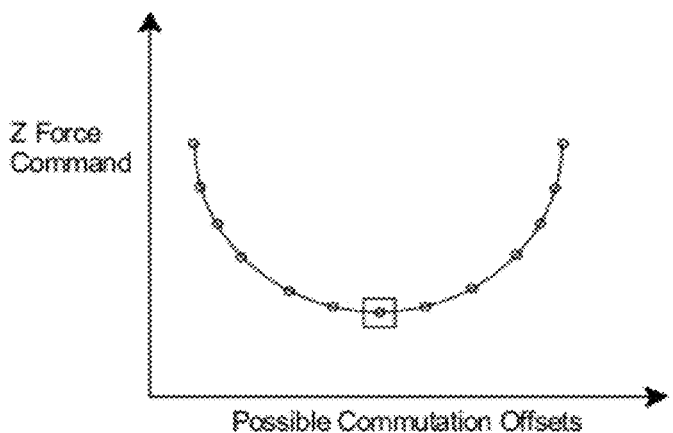
FIG. 4B is a simplified illustration of how force commands vary relative to possible commutation offsets.

FIG. 4B is a simplified graphic illustration of how the Z force command corresponds to various possible commutation offsets $y_{o,YZ1}$. In this embodiment, the control system 224 identifies the lowest value of Z force command $F_{Z1}$ on the curve and subsequently identifies its corresponding possible commutation offset as the first YZ commutation offset $y_{o,YZ1}$. Alternatively, the control system 224 identifies the lowest value of Z axis amplitude of the current $A_{z,YZ1}$, and subsequently identifies its corresponding possible commutation offset as the first YZ commutation offset $y_{o,YZ1}$. In FIG. 4B, the correct commutation offset is circled with a square.

Referring back to FIG. 4A, after the first YZ commutation offset $Y_{o,YZ1}$ is determined, at step 480, the control system 224 determines if all of the movers 250A-250D have been selected. If not, the next mover 250A-250D, e.g. the second YZ mover 250B, is selected, and the process is repeated to determine the second YZ commutation offset ("$Y_{o,YZ2}$"). Again, with the stage held in a substantially constant position through closed loop control of the movers 250A-250D, the control system 224 utilizes a plurality of possible commutation offsets in Equation 2 to direct current to the second YZ coil array 242. For each alternative possible commutation offset, the control system 224 determines (i) the corresponding Y force command ("$F_{Y2}$") and the Y axis amplitude of the current ($A_{y,YZ2}$); and (ii) the corresponding Z force command ("$F_{Z2}$") and the Z axis amplitude of the current ($A_{z,YZ2}$) necessary to maintain the stage in the correct, levitated position. The control system 224 determines the correct value for the second YZ commutation offset $Y_{o,YZ2}$ value by determining the lowest Z force command $F_{Z2}$ or the lowest Z axis amplitude of the current ($A_{Z,YZ2}$) necessary to maintain the position of the stage.

This process is again repeated for the first XZ mover 250C to determine the first XZ commutation offset ("$x_{o,XZ1}$"). Again, with the stage held in a substantially constant position through closed loop control of the movers 250A-250D, the control system 224 utilizes a plurality of possible commutation offsets in Equation 3 to direct current to the first XZ coil array 244. For each alternative possible commutation offset, the control system 224 determines (i) the corresponding X force command ("$F_{X1}$") and the X axis amplitude of the current ($A_{x,XZ1}$); and (ii) the corresponding Z force command ("$F_{Z3}$") and the Z axis amplitude of the current ("$A_{z,XZ1}$") necessary to maintain the stage in the correct, levitated position. The control system 224 determines the correct value for the first XZ commutation offset $x_{o,XZ1}$ value by determining the lowest Z force command $F_{Z3}$ or the lowest Z axis amplitude of the current ("$A_{z,XZ1}$") necessary to maintain the position of the stage.

Finally, the process is repeated for the second XZ mover 250D to determine the second XZ commutation offset ("$x_{o,XZ2}$"). Again, with the stage held in a substantially constant position through closed loop control of the movers 250A-250D, the control system 224 utilizes a plurality of possible commutation offsets in Equation 4 to direct current to the second XZ coil array 246. For each alternative second XZ commutation offset, the control system 224 determines (i) the corresponding X force command ("$F_{X2}$") and the X axis amplitude of the current ($A_{z,XZ2}$); and (ii) the corresponding Z force command ("$F_{Z4}$") and the Z axis amplitude of the current ($A_{z,XZ2}$) necessary to maintain the stage in the correct, levitated position. The control system 224 determines the correct value for the second XZ commutation offset $x_{o,XZ2}$ value by determining the lowest Z force command $F_{Z4}$ or the lowest Z axis amplitude of the current ($A_{z,XZ2}$) necessary to maintain the position of the stage.

After all of the movers 250A-250D have been selected, this commutation process is completed at step 482. It should be noted that one advantage of this method is that it relies on adjusting only the Z force. As a result thereof, any disturbance forces along X and Y axes should not adversely influence the calculations of the commutation offsets. It should also be noted that the sequence of determining the commutation offsets for the movers 250A-250D can be different than that described herein.

In summary, with this embodiment, a constant Z force is required from each of the movers 250A-250D to support the weight of the stage. Next, the commutation offset for one mover 250A-250D at a time can be smoothly adjusted. As the possible offset changes, the required commutation amplitude to provide the necessary Z force will change. As the possible offset approaches the correct value, the Z commutation amplitude will decrease, although the actual Z force remains constant. In this way, the software of the control system 224 can search for the commutation offset where the constant Z force is produced with the minimum commutation amplitude. This value should be the correct commutation offset to use for that mover.

Figure 5A:
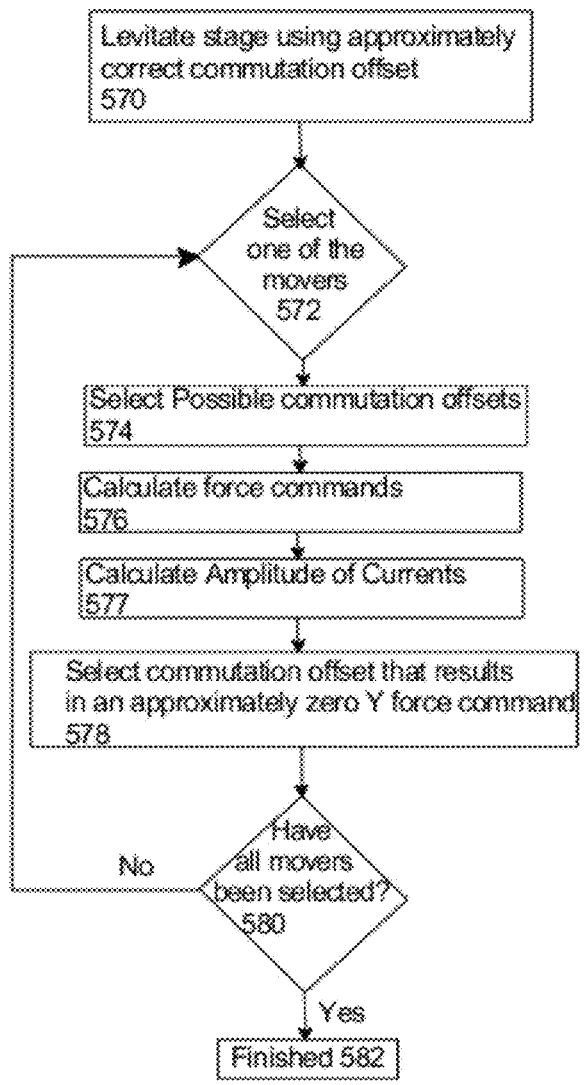
FIG. 5A is a flow chart that illustrates another process that can be used to estimate the commutation offsets for the mover assembly of FIG. 2A.

FIG. 5A is a flow chart that illustrates a different process that can be used by the control system 224 to estimate the commutation offset $y_{o,YZ1}$, $y_{o,YZ2}$, $x_{o,XZ1}$, $x_{o,XZ2}$ for each of the movers 250A-250D. In this embodiment, at step 570, the stage is levitated using all of the movers 250A-250D. For example, during step 570, an approximately correct commutation offset can be used for each of the movers 250A-250D.

Next, the commutation offset $y_{o,YZ1}$, $y_{o,YZ2}$, $x_{o,XZ1}$, $x_{o,XZ2}$ for each of the movers 250A-250D is individually and sequentially determined. More specifically, at step 572, one of the movers 250-250D is selected for determining its commutation offset. For example, the first YZ mover 250A can be initially selected to determine the first YZ commutation offset ("$y_{o,YZ1}$"). Next, at step 574, with the stage held in a substantially constant position through closed loop control of the movers 250A-250D, the control system 224 sequentially selects a number of alternative possible commutation offsets for use in Equation 1.

For each alternative possible commutation offset, at step 576, the control system 224 determines (i) the corresponding Y force command ("$F_{Y1}$") for the first YZ mover 250A, and (ii) the corresponding Z force command ("$F_{Z1}$") for the first YZ mover 250A necessary to maintain the stage in the correct position along the Y axis. Subsequently, at step 577, the control system subsequently, determines the Y axis amplitude of the current ($A_{y,YZ1}$) required to produce the Y force command ("$F_{Y1}$"); and the Z axis amplitude of the current ($A_{z,YZ1}$) required to produce the Z force command ("$F_{Z1}$").

As the possible commutation offset changes, the force commands and the corresponding current commands generated by the control system 224 will change. More specifically, absence disturbances, as the possible commutation offset approaches the correct value, the Y force command $F_{Y1}$ and the corresponding Y axis amplitude of the current ($A_{y,YZ1}$) for the first YZ mover 250A will approach zero; and as the possible commutation offset moves away from the correct value, the Y force command $F_{Y1}$ and the corresponding Y axis amplitude of the current ($A_{y,YZ1}$) for the first YZ mover 250A will move away from zero. Stated in another fashion, absent disturbances, the correct possible commutation offset occurs at a zero Y force command $F_{Y1}$ and a zero Y axis amplitude of the current ($A_{y,YZ1}$). This is because, absent disturbances, zero force is required to maintain the position of the stage along the Y axis. Thus, at step 578, in one embodiment, the control system 224 determines the correct value for the first YZ commutation offset $y_{o,YZ1}$ value by determining when the Y force command $F_{Y1}$ and/or the corresponding Y axis amplitude of the current ($A_{Y1}$) is zero.

Figure 5B:
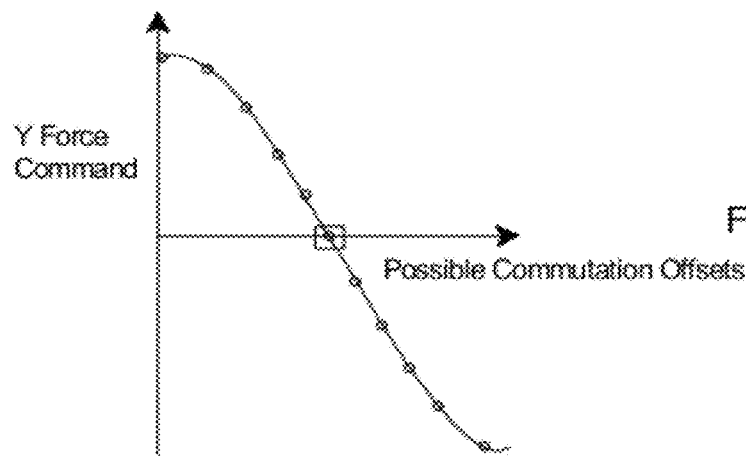
FIG. 5B is a simplified illustration of how force commands vary relative to possible commutation offsets.

FIG. 5B is a graphic illustration of how the Y force command corresponds to various first YZ commutation offsets $y_{o,YZ1}$. In this embodiment, the control system 224 identifies when the Y force command $F_{Y1}$ is equal to zero, and subsequently identifies its corresponding possible commutation offset as the first YZ commutation offset $y_{o,YZ1}$. In FIG. 5B, the correct commutation offset is circled with a square. One advantage of this method is that the Y force command $F_{Y1}$ versus YZ commutation offset $y_{o,YZ1}$ curve crosses zero and has a maximum slope at zero (the correct YZ commutation offset $y_{o,YZ1}$). This makes it easier to determine the proper YZ commutation offset $y_{o,YZ1}$.

Referring back to FIG. 5A, after the first YZ commutation offset $y_{o,YZ1}$ is determined, at step 578, the control system 224 determines if all of the movers 250A-250D have been selected. If not, the next mover 250A-250D, e.g. the second YZ mover 250B, is selected, and the process is repeated to determine the second YZ commutation offset ("$y_{o,YZ2}$"). Again, with the stage held in a substantially constant position through closed loop control of the movers 250A-250D, the control system 224 utilizes a plurality of possible commutation offsets in Equation 2 to direct current to the second YZ coil array 242. For each alternative possible commutation offset, the control system 224 determines (i) the corresponding Y force command ("$F_{Y2}$") and Y axis amplitude of the current ($A_{y,YZ2}$); and (ii) the corresponding Z force command ("$F_{Z2}$") and the Z axis amplitude of the current ($A_{z,YZ2}$) necessary to maintain the stage in the correct position. The control system 224 determines the correct value for the second YZ commutation offset $y_{o,YZ2}$ value by determining when the Y force command $F_{Y2}$ and/or the corresponding Y axis amplitude of the current ($A_{y,YZ2}$) is zero or approximately zero.

This process is again repeated for the first XZ mover 250C to determine the second XZ commutation offset ("$x_{o,XZ1}$"). Again, with the stage held in a substantially constant position through closed loop control of the movers 250A-250D, the control system 224 utilizes a plurality of possible commutation offsets in Equation 3 to direct current to the first XZ coil array 244. For each alternative possible commutation offset, the control system 224 determines (i) the corresponding X force command ("$F_{X1}$") and the X axis amplitude of the current ($A_{x,XZ1}$); and (ii) the corresponding Z force command ("$F_{Z3}$") and the Z axis amplitude of the current ($A_{z,XZ1}$) necessary to maintain the stage in the correct position. The control system 224 determines the correct value for the first XZ commutation offset $x_{o,XZ1}$ value by determining when the X force command $F_{X1}$ and/or the corresponding X axis amplitude of the current ($A_{x,XZ1}$) is zero.

Finally, the process is repeated for the second XZ mover 250D to determine the second XZ commutation offset ("$x_{o,XZ2}$"). Again, with the stage held in a substantially constant position through closed loop control of the movers 250A-250D, the control system 224 utilizes a plurality of possible commutation offsets in Equation 4 to direct current to the second XZ coil array 246. For each alternative possible commutation offset, the control system 224 determines (i) the corresponding X force command ("$F_{X2}$") and the X axis amplitude of the current ($A_{o,XZ2}$); and (ii) the corresponding Z force command ("$F_{Z4}$") and the Z axis amplitude of the current ($A_{z,XZ2}$) necessary to maintain the stage in the correct position. The control system 224 determines the correct value for the second XZ commutation offset $x_{o,XZ2}$ value by determining when the X force command $F_{X2}$ and/or the corresponding X axis amplitude of the current ($A_{x,XZ2}$) is zero or approximately zero.

After all of the movers 250A-250D have been selected, this commutation process is completed at step 582.

Figure 6:
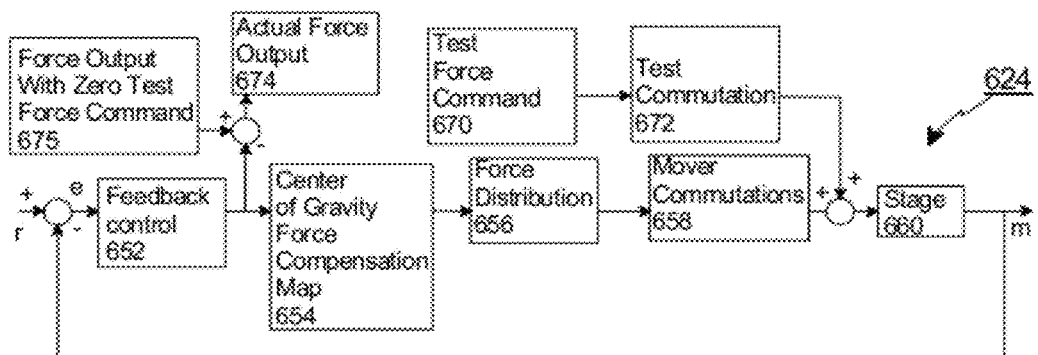
FIG. 6 is a simplified schematic of another embodiment of control system that can be used to control the mover assembly of FIG. 2A.

FIG. 6 is a simplified control block diagram of another embodiment of a control system 624 that can be used to determine the commutation offset for each of the movers 250A-250D (illustrated in FIG. 2). In this embodiment, the control block diagram 624 is somewhat similar to the control block diagram illustrated in FIG. 3. However, in FIG. 6, the control system 624 includes three test related blocks, namely a test force command block 670, a test commutation block 672, and an actual force output block 674.

It should be noted that the test related blocks 670, 672, 674 are used to evaluate only one mover 250A-250D at a time, and only during the determination of its commutation offset. Stated in another fashion, during the calibration of each mover, the test related blocks 670, 672, 674 are used with the closed loop control the mover 250A-250D being evaluated, and the test related blocks 670, 672, 674 are not used to control the movers 250A-250D that are not currently being evaluated. Subsequently, after all of the movers 250A-250D have been evaluated, the control block diagram 624 without the test related blocks 670, 672, 674 can be used to control the movers 250A-250D during usage of the stage assembly.

In FIG. 6 (similar to FIG. 3), (i) "r" represents a desired reference position; (ii) "m" represents the measured, actual momentary, position; and (iii) "e" represents a following error between the desired position "r" and the measured output position "m". Further, starting at the left side of the control block diagram 624, the desired trajectory "r" is fed into the control system 624 along with the measured position "m". Next, the control system 624 determines the following error "e". Subsequently, the following error "e" is fed into a feedback control 652 of the control system 624. The feedback control 652 determines the forces along the X, Y and/or Z axes that are necessary to correct the following error (e.g. the forces necessary to move a center of gravity ("CG") of the stage 220A to the desired trajectory "r"). One or more of the movers 250A-250D of the stage mover assembly 220C may not push through the center of gravity of the stage 220A. In these embodiments, the control system 624 can include a center of gravity force compensation map 654 that compensates for this.

Next, a force distribution 656 determines the force commands for each of the movers 250A-250D necessary to correct the following error. Based on the following error "e", the control system 224 determines the magnitude of the forces generated by the movers 250A-250D necessary to correct the following error. More specifically, the control system determines the required magnitude of (i) a first Y force command ($F_{Y1}$) and a first Z force command ($F_{Z1}$) for the first YZ mover 250A; (ii) a second Y force command ($F_{Y2}$) and a second Z force command ($F_{Z2}$) for the second YZ mover 250B; (iii) a first X force command ($F_{X1}$) and a third Z force command ($F_{Z3}$) for the first XZ mover 250C; and (iv) a second X force command ($F_{X2}$) and a fourth Z force command ($F_{Z4}$) for the second XZ mover 250D. Subsequently, from these force commands, the amplitudes of the currents can be determined. More specifically, (i) $A_{y,YZ1}$ can be determined from the first Y force command $F_{Y1}$; (ii) $A_{z,YZ1}$ can be determined from the first Z force command $F_{Z1}$; (iii) $A_{y,YZ2}$ can be determined from the second Y force command $F_{Y2}$; (iv) $A_{z,YZ2}$ can be determined from the second Z force command $F_{Z2}$; (v) $A_{z,XZ1}$ can be determined from the first X force command $F_{X1}$; (vi) $A_{z,XZ1}$ can be determined from the third Z force command $F_{Z3}$; (vii) $A_{x,XZ2}$ can be determined from the second X force command $F_{X2}$; and (viii) $A_{z,XZ2}$ can be determined from the fourth Z force command $F_{Z4}$.

With the present invention, the control system 624 imparts a test force command 670 on the selected mover 250A-250D at block 670. The magnitude of the test force can be varied pursuant to the teachings provided herein. The test force command should be large enough to have a good signal to noise ratio, but small enough not to make the closed loop control of the position of the stage unstable. In one non-exclusive embodiment, the test force command can be sixty Newton. Alternatively, the test force command can be greater or less than sixty Newton To maintain the same closed-loop system behaviors during calibration, an extra motor commutation function may be conducted to transform the test force command to test current commands for the mover 250A-250D that is being calibrated. Those test current commands then are added up to those in the closed loop before being sending out to the amplifiers. More specifically, the test commutation 672 and the mover commutations 658 are utilized to determine the currents that are directed to the U, V, W phases of the particular coil array 240, 242, 244, 246 being calibrated. Further, the mover commutations 658 (without the test commutation 672) are utilized to determine the currents that are directed to the U, V, W phases of the other coil arrays 240, 242, 244, 246 that are not currently being tested. Thus, during calibration, for the three movers 250A-250D that are not currently being tested, the U, V, W currents can be calculated using Equations 1-4.

If the mover 250A-250D being tested is a YZ mover 250A, 250B, the following commutation equations can be used to determine the magnitude of the current to be directed to the different phases of that YZ mover 250A, 250B:

$$\begin{pmatrix} I_{u,YZ} \\ I_{v,YZ} \\ I_{w,YZ} \end{pmatrix} = \quad \text{Equation 5}$$

-continued $$\begin{pmatrix} \sin\left(2\pi \cdot \frac{y+y_{o,YZ}}{L}\right) & \cos\left(2\pi \cdot \frac{y+y_{o,YZ}}{L}\right) \\ \sin\left(2\pi \cdot \frac{y+y_{o,YZ}}{L} + \frac{2\pi}{3}\right) & \cos\left(2\pi \cdot \frac{y+y_{o,YZ}}{L} + \frac{2\pi}{3}\right) \\ \sin\left(2\pi \cdot \frac{y+y_{o,YZ}}{L} + \frac{4\pi}{3}\right) & \cos\left(2\pi \cdot \frac{y+y_{o,YZ}}{L} + \frac{4\pi}{3}\right) \end{pmatrix} \cdot$$

$$\begin{pmatrix} A_{y,YZ} \\ A_{z,YZ} \end{pmatrix} + \begin{pmatrix} \sin\left(2\pi \cdot \frac{y+y_{o,TE}}{L}\right) \\ \sin\left(2\pi \cdot \frac{y+y_{o,TE}}{L} + \frac{2\pi}{3}\right) \\ \sin\left(2\pi \cdot \frac{y+y_{o,TE}}{L} + \frac{4\pi}{3}\right) \end{pmatrix} \cdot A_T.$$

In this Equation, (i) $I_{u,YZ}$ is the current directed to the U phase coil(s); (ii) $I_{v,YZ}$ is the current directed to the V phase coil(s); (iii) $I_{w,YZ}$ is the current directed to the W phase coil(s); (iv) y is the present measured position along the Y axis; (v) $A_{y,YZ}$ is the amplitude of the current ("Y axis current amplitude") required to produce the desired force along the Y axis for the selected YZ mover 250A/B determined by the control system 224; (vi) $A_{z,YZ}$ is the amplitude of the current ("Z axis current amplitude") required to produce the desired force along the Z axis for the selected YZ mover 250A/B determined by the control system 224; (vii) $A_T$ the amplitude of the current ("Test current amplitude") required to produce the desired test force along the Y axis for the selected YZ mover 250A/B determined by the control system 224; (vii) $y_{o,YZ}$ is the default offset, roughly determined beforehand and (viii) $y_{o,TE}$ is a possible test offset.

It should be noted that these equations combine both the test commutation 672 and the mover commutations 658 into the same equation. Further, during the process of estimating the commutation offset of a particular YZ mover 250A, 250B, various possible test offsets are sequentially used in Equation (5) to determine the current for the mover that is being evaluated.

Somewhat similarly, if the mover being tested is a XZ mover 250C, 250D, the following commutation equations can be used to determine the magnitude of the current to be directed to the different phases of that XZ mover:

$$\begin{pmatrix} I_{u,XZ} \\ I_{v,XZ} \\ I_{w,XZ} \end{pmatrix} = \quad \text{Equation (6)}$$

$$\begin{pmatrix} \sin\left(2\pi \cdot \frac{x+x_{o,XZ}}{L}\right) & \cos\left(2\pi \cdot \frac{x+x_{o,XZ}}{L}\right) \\ \sin\left(2\pi \cdot \frac{x+x_{o,XZ}}{L} + \frac{2\pi}{3}\right) & \cos\left(2\pi \cdot \frac{x+x_{o,XZ}}{L} + \frac{2\pi}{3}\right) \\ \sin\left(2\pi \cdot \frac{x+x_{o,XZ}}{L} + \frac{4\pi}{3}\right) & \cos\left(2\pi \cdot \frac{x+x_{o,XZ}}{L} + \frac{4\pi}{3}\right) \end{pmatrix} \cdot$$

$$\begin{pmatrix} A_{x,XZ} \\ A_{z,XZ} \end{pmatrix} + \begin{pmatrix} \sin\left(2\pi \cdot \frac{x+x_{o,TE}}{L}\right) \\ \sin\left(2\pi \cdot \frac{x+x_{o,TE}}{L} + \frac{2\pi}{3}\right) \\ \sin\left(2\pi \cdot \frac{x+x_{o,TE}}{L} + \frac{4\pi}{3}\right) \end{pmatrix} \cdot A_T.$$

In Equation 6, (i) $I_{u,XZ}$ is the current directed to the U phase coil(s); (ii) $I_{v,XZ}$ is the current directed to the V phase coil(s); (iii) $I_{w,XZ}$ is the current directed to the W phase coil(s); (iv) X is the present measured position along the X axis; (v) $A_{x,XZ}$ is the amplitude of the current ("X axis current amplitude") required to produce the desired force along the X axis for the selected XZ mover 250C, 250D determined by the control system 224; (vi) $A_{z,XZ}$ is the amplitude of the current ("Z axis current amplitude") required to produce the desired force along the Z axis for the selected XZ mover 250C, 250D determined by the control system 224; (vii) $A_T$ is the amplitude of the current ("Test current amplitude") required to produce the desired test force along the X axis for the selected XZ mover 250C, 250D determined by the control system 224; (vii) $x_{o,YZ}$ is the default offset, roughly determined beforehand, and (viii) $x_{o,TE}$ is a possible test offset.

Next, at block 660, the current is directed to the movers 250A-250D and this causes the stage to move. It should be noted that the force output block 674 is used to determine the actual force along the X, Y and Z axis that results from the test force being imparted by the mover being tested. Stated in another fashion, when the test force is imparted by the mover being evaluated, the control system 624 operating in a closed loop fashion, must determine the other forces necessary to maintain the position of the stage. Thus, the force output block 674 is used to provide the actual force imparted on the stage by the test force command.

As provided herein, if one of the YZ movers is being tested, and if the test offset is close to optimal, a test force command of sixty Newton along the Y axis will impart an actual force on the stage of (i) approximately sixty Newton and reaching its maximal magnitude along the Y axis, (ii) approximately zero Newton along the Z axis, and (iii) approximately zero Newton along the X axis. However, when the test offset is not correct, a test force command of sixty Newton along the Y axis will result in an actual force on the stage of (i) less than sixty Newton along the Y axis, (ii) non-zero Newton along the Z axis, and (iii) non-zero Newton along the X axis. Similarly, if one of the XZ movers is being tested, and if the test offset is close to optimal, a test force command of sixty Newton along the X axis will impart an actual force on the stage of (i) approximately sixty Newton and reaching its maximal magnitude along the X axis, (ii) approximately zero Newton along the Z axis, and (iii) approximately zero Newton along the Y axis. However, when the test offset is not correct, a test force command of sixty Newton along the X axis will result in an actual force on the stage of (i) less than sixty Newton along the X axis, (ii) non-zero Newton along the Z axis, and (iii) non-zero along the Y axis.

It should be noted that, in order to measure the resulting force generated by the test force command 670, the original stage center-of-gravity force command values before calibration with a zero test force command 675 needs to be subtracted from those during calibration prior to the force output block 674.

Figure 7:
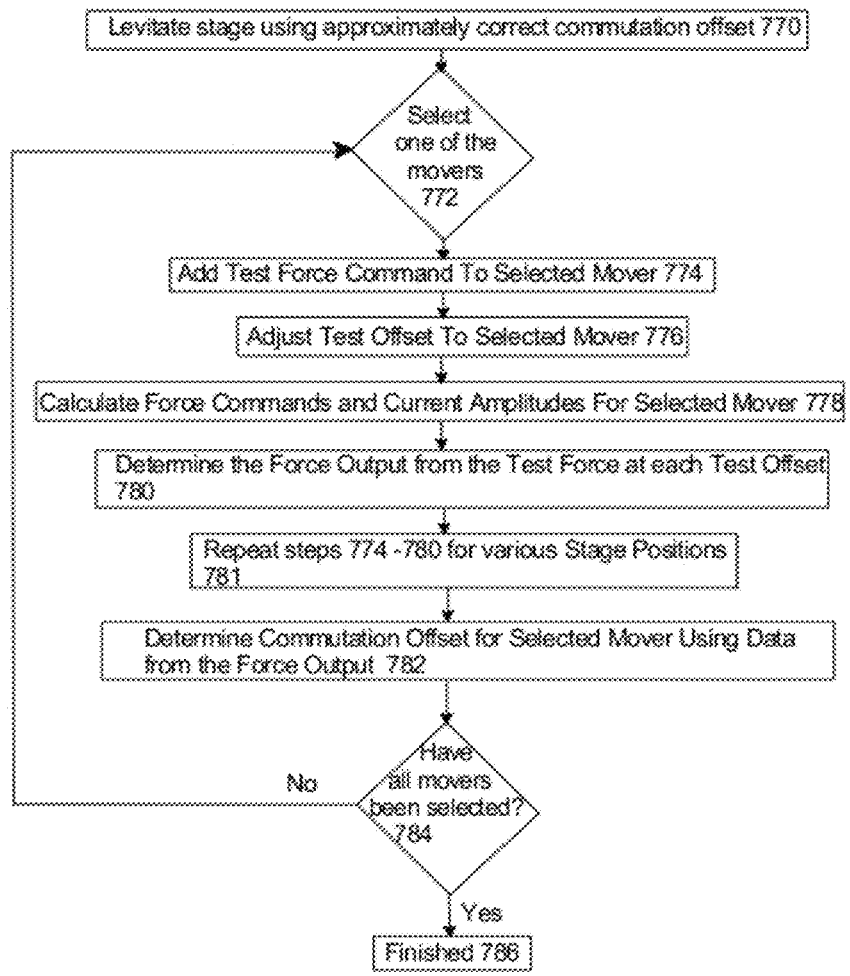
FIG. 7 is a flow chart that illustrates yet another process that can be used to estimate the commutation offsets for the mover assembly of FIG. 2A.

FIG. 7 is a flow chart that illustrates a process that can be used by the control system 624 to sequentially estimate the commutation offset $y_{o,YZ1}$, $y_{o,YZ2}$, $x_{o,XZ1}$, $x_{o,XZ2}$ for each of the movers 250A-250D. In this embodiment, at step 770, the stage is levitated using all of the movers 250A-250D. For example, during step 770, an approximately correct commutation offset can be used for each of the movers 250A-250D.

Figure 8A:
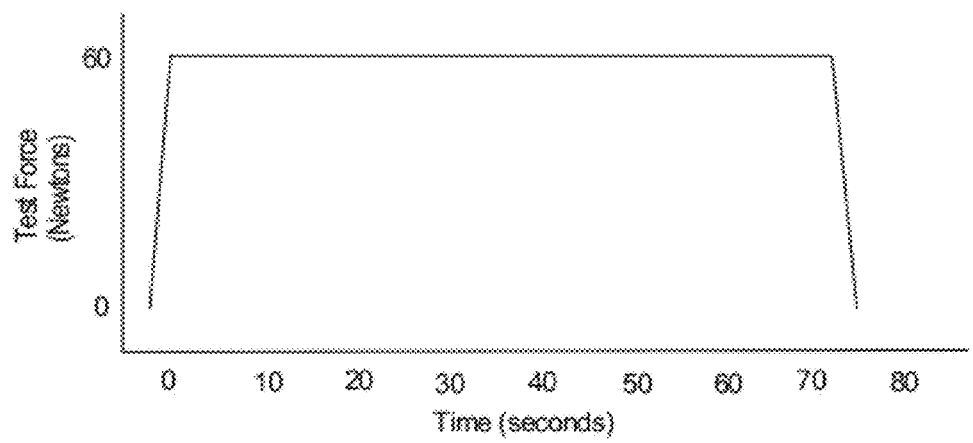
FIG. 8A is a graph that illustrates test force versus time.

Next, the commutation offset $y_{o,YZ1}$, $y_{o,YZ2}$, $x_{o,XZ1}$, $x_{o,XZ2}$ for each of the movers 250A-250D is individually and sequentially determined while the stage is maintained in a levitated position using closed loop control. More specifically, at step 772, one of the movers 250-250D is selected for determining its commutation offset. For example, the first XZ mover 250C can be initially selected to determine the first XZ commutation offset ("$x_{o,XZ1}$"). Next, with the stage held in a substantially constant position through closed loop control of the movers 250A-250D, the control system 224 applies a test force along the X axis, e.g. sixty Newton to the command of the first XZ mover 250C. FIG. 8A is graph that illustrates a test force (entered into the test force command 670 of FIG. 6) versus time. In this example, the test force command of sixty Newton along the X axis is applied from time zero to time seventy-two seconds by the first XZ mover 250C.

Figure 8B:
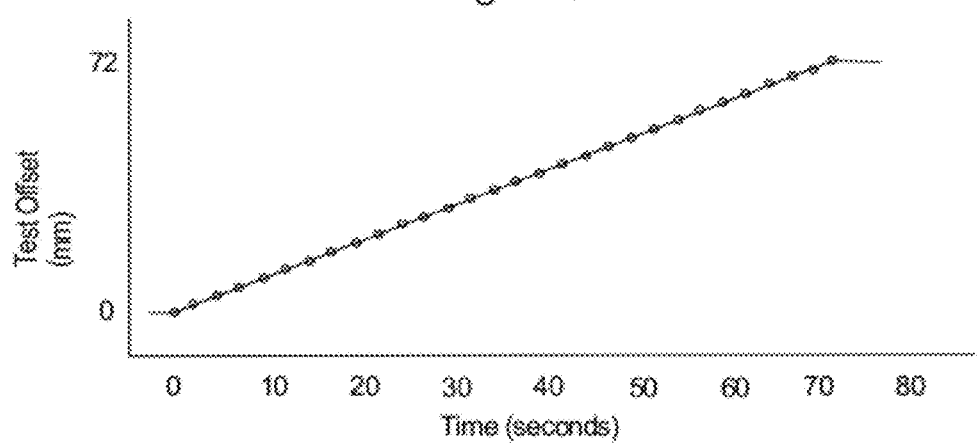
FIG. 8B is a graph that illustrates test offset versus time.

At this time, current to the U, V, W, phases of the first XZ mover 250C are determined. At step 776, the possible test offsets are sequentially varied. FIG. 8B is graph that illustrates possible test offsets versus time. In this example, the possible test offset varies from zero to seventy-two millimeters from time zero to time seventy-two seconds. In this example, the test offset for the test force command is gradually changed from the default value to cover the entire commutation pitch (72 mm). The test offset will then generate extra three phase current commands for the mover that is being calibrated. These extra three phase current commands versus time are illustrate in FIG. 8C.

Figure 8C:
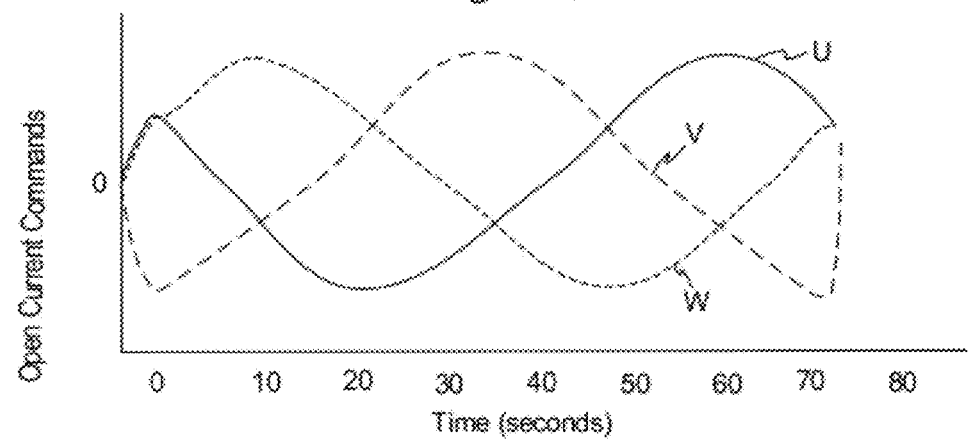
FIG. 8C is a graph that illustrates current commands versus time.

At step 778, the control system calculates the force commands and the corresponding current amplitudes for each test offset for the selected mover. Stated in another fashion, in the present example, for each possible test offset, current to the U, V, W, phases of the first XZ mover 250C are determined, and the forces are applied to the stage. FIG. 8C is graph that illustrates the resulting open current commands directed to the U phase (illustrated with a solid line), the V phase (illustrated with a long dashed line), and the W phase (illustrated with a short dashed line) for the first XZ mover 250C versus time. Basically, FIG. 8C illustrates how the current to the U, V, W phases of the first XZ mover 250C varies with a constant test force, and a changing test offset.

Figure 8D:
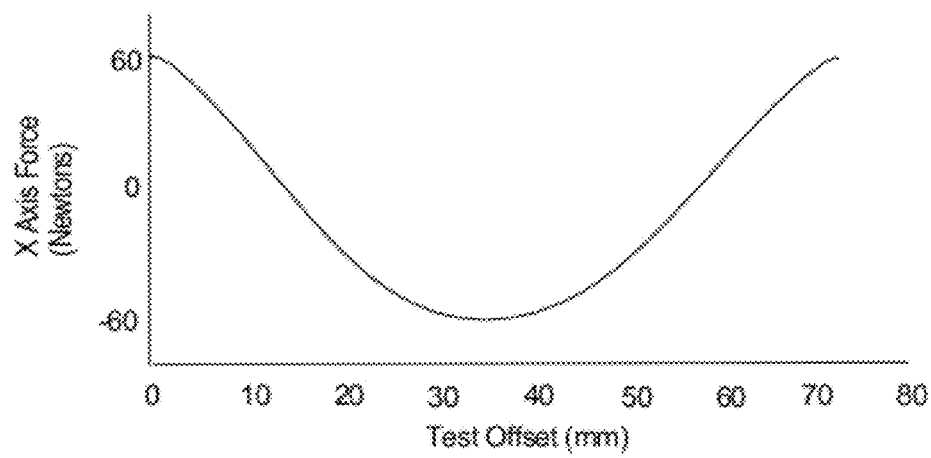
FIG. 8D is a graph that illustrates X axis force versus test offset.
Figure 8E:
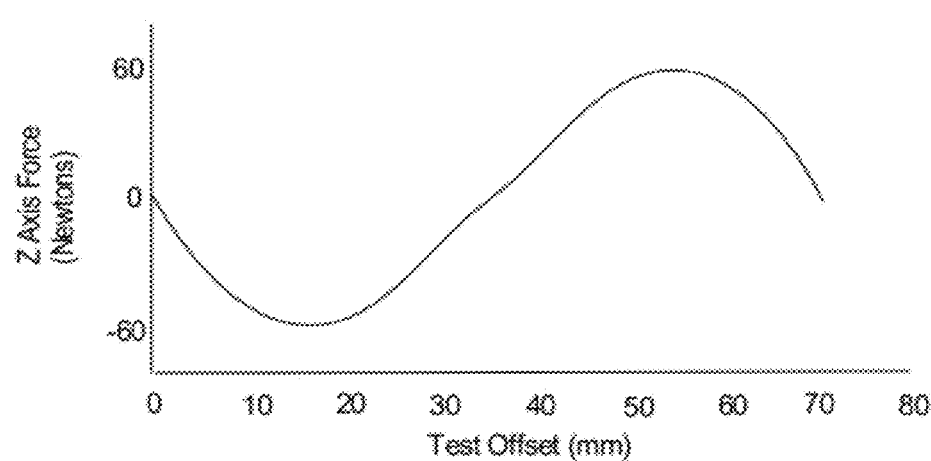
FIG. 8E is a graph that illustrates Z axis force versus test offset.
Figure 8F:
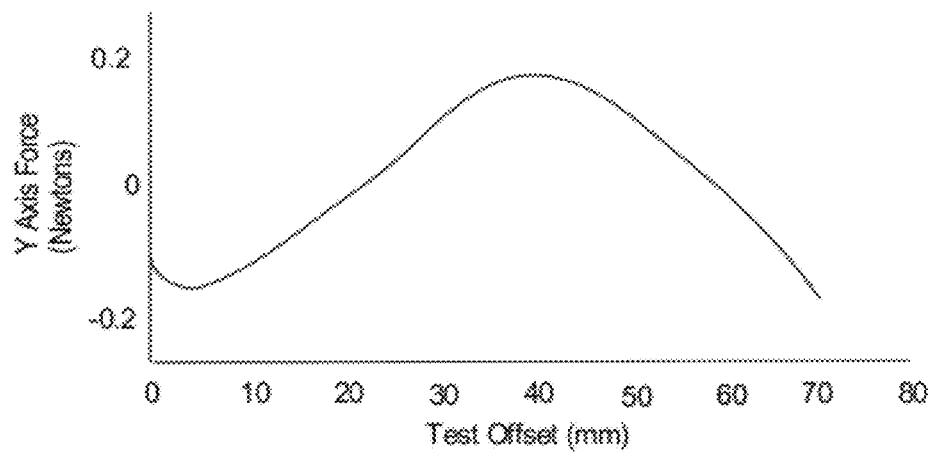
FIG. 8F is a graph that illustrates Y axis force versus test offset.

Next, at step 780, the actual force output from the test force command for each test offset is determined by the force output 674 (illustrated in FIG. 6). FIG. 8D is a graph that illustrates the X axis force imparted on the stage as a result of the test force for each test offset; FIG. 8E is a graph that illustrates the Z axis force imparted on the stage as a result of the test force for each test offset; and FIG. 8F is a graph that illustrates the Y axis force imparted on the stage as a result of the test force for each test offset. It should be noted that for the XZ mover, the X force and the Z force vary greatly as the test offset varies, while the Y force varies only slightly as the test offset varies.

Referring back to FIG. 7, at step 782, using the data regarding the actual force output, the control system determines the first XZ commutation offset for the first XZ mover 250C.

The actual procedure used to determine the first XZ commutation offset from this data can be varied. As one non-exclusive example, the control system 624 can utilize the X axis force data (illustrated in FIG. 8D) to determine the first XZ commutation offset. In this example, the first XZ mover 250C was designed and assembled so that the first XZ coil array 244 is properly aligned at the X position of thirty-six millimeters. However, referring to FIG. 8D, the X force data has the largest negative value at a test offset of approximately 35.35 millimeters. In this example, the first XZ commutation offset can be determined by the absolute value of the X designed position minus the test offset. In this simplified example, the first XZ commutation offset is 0.65 (|36−35.35|=0.65).

In an alternative embodiment, the control system 624 can utilize the Z axis force data (illustrated in FIG. 8E) to determine the first XZ commutation offset. In this example, the first XZ mover 250C was designed and assembled so that the first XZ coil array 244 is properly aligned at the Z position of eighteen millimeters. However, referring to FIG. 8E, the Z axis force data has the largest negative value at a test offset of approximately 17.42 millimeters. In this example, the first XZ commutation offset can be determined by the absolute value of the Z designed position minus the test offset. In this simplified example, the first XZ commutation offset is 0.58 (|18−17.42|=0.58).

In yet another embodiment, the first XZ commutation offset can be the average value of that determined utilizing the X axis force data and the Z axis force data. In the example provided herein, the first XZ commutation offset would be equal to 0.615 ((0.65+0.58)/2=0.615).

Referring back to FIG. 7, in still another embodiment, for each selected mover, at optional step 781 (illustrated with a dashed box), the previously described steps 774-780 can be repeated for a number of alternative positions for the stage relative to the stage base. The number of alternative positions can be varied. For example, with a constant Z position of the stage, steps 774-780 can be repeated for a first X-Y stage position, a second X-Y stage position, a third X-Y stage position, and a fourth X-Y stage position. In this example, stage is moved along the X axis and/or the Y axis between the different X-Y stage positions.

Figure 8G:
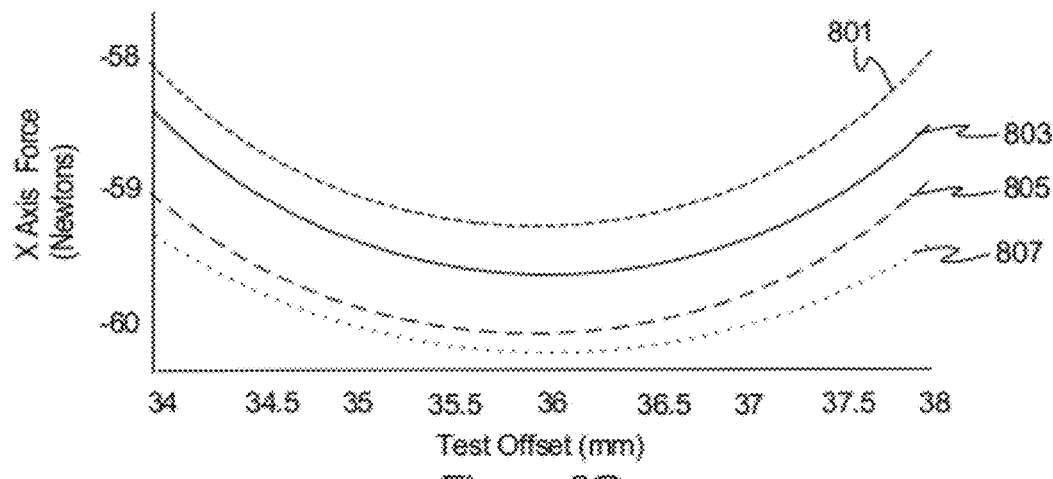
FIG. 8G is a graph that illustrates X axis force versus test offset for a plurality of alternative positions.
Figure 8H:
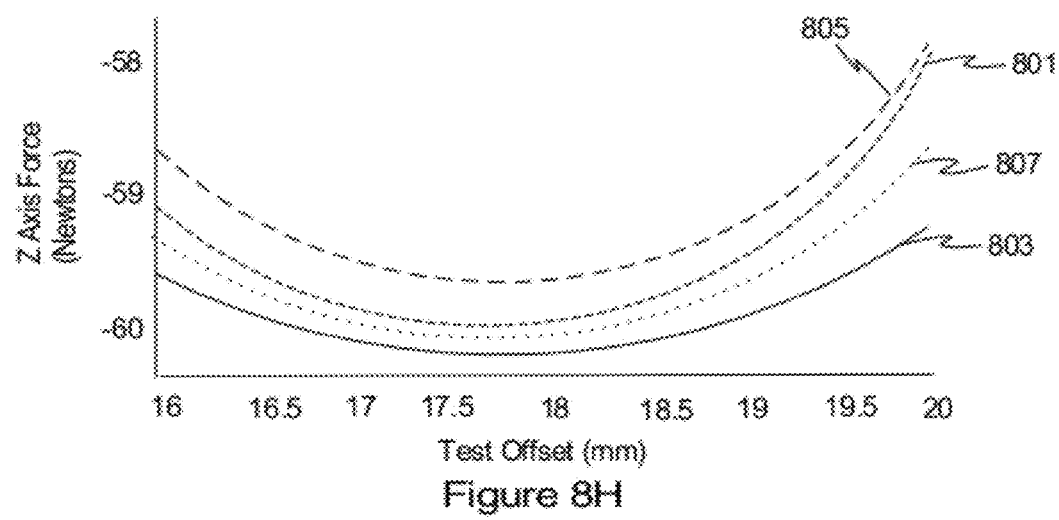
FIG. 8H is a graph that illustrates Z axis force versus test offset for a plurality of alternative positions.

FIG. 8G is a graph that illustrates the X axis force imparted on the stage as a result of the test force for a portion of the test offsets and for each X-Y stage position; and FIG. 8H is a graph that illustrates the Z axis force imparted on the stage as a result of the test force for a portion of the test offsets and for each X-Y stage position. It should be noted that in FIGS. 8G and 8H, (i) line 801 (short dashes) represents the results for the first X-Y stage position, (ii) line 803 (solid line) represents the results for the second X-Y stage position, (iii) line 805 (long dashes) represents the results for the third X-Y stage position, and (iv) line 807 (dotted line) represents the results for the fourth X-Y stage position. Further, for clarity, (i) in FIG. 8G, the test offsets are only illustrated near the designed position of 36 millimeters; and (ii) in FIG. 8H, the test offsets are only illustrated near the designed position of 18 millimeters.

In this example, the first XZ commutation offset can be determined from the absolute value of the X designed position minus the average value of the test offset for each X-Y stage position using the X axis forces. Referring to FIG. 8G, in this simplified example, (i) for the first X-Y stage position, the test offset is 35.9; (ii) for the second X-Y stage position, the test offset is 35.8; (iii) for the third X-Y stage position, the test offset is 35.7; and (iv) for the fourth X-Y stage position, the test offset is 36.2. In this embodiment, the first XZ commutation offset is 0.1 (|36−((35.9+35.8+35.7+36.2)/4)|=0.1).

Alternatively, in this example, the first XZ commutation offset can be determined the absolute value of the Z designed position minus the average value of the test offset for each X-Y stage position using the Z axis forces. Referring to FIG. 8H, in this simplified example, (i) for the first X-Y stage position, the test offset is 17.7; (ii) for the second X-Y stage position, the test offset is 17.8; (iii) for the third X-Y stage position, the test offset is 17.9; and (iv) for the fourth X-Y stage position, the test offset is 17.6. In this embodiment, the first XZ commutation offset is 0.25 (|18−((17.7+17.8+17.9+17.6)/4)|=0.25).

In yet another embodiment, the first XZ commutation offset can be the average value of that determined utilizing the X axis force data and the Z axis force data for the plurality of X-Y positions. In this example, first XZ commutation offset is 0.175 ((0.1+0.25)/2=0.175).

Figure 8I:
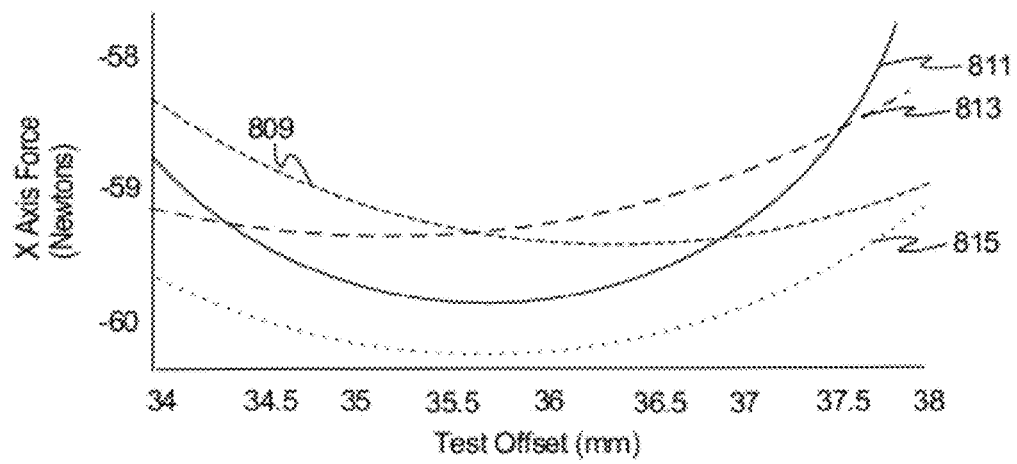
FIG. 8I is a graph that illustrates X axis force versus test offset for a plurality of alternative positions.
Figure 8J:
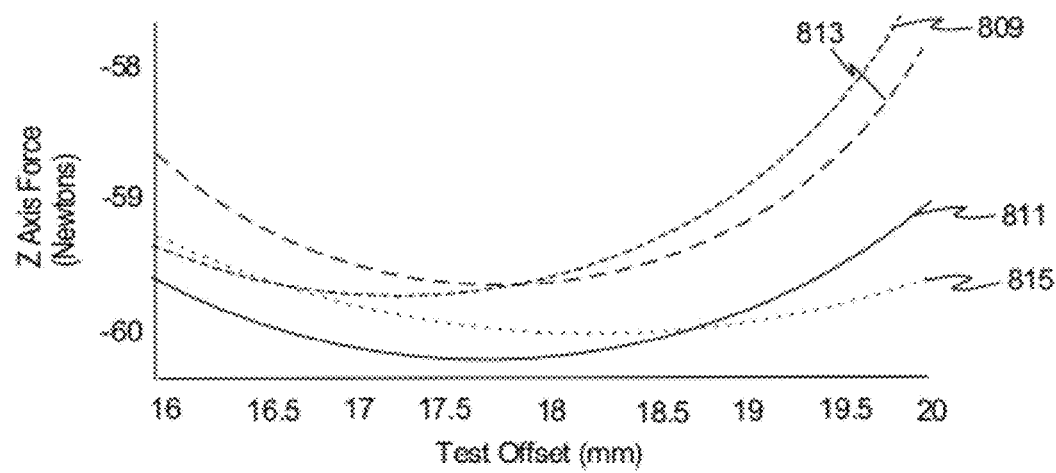
FIG. 8J is a graph that illustrates Z axis force versus test offset for a plurality of alternative positions.

In still another alternative embodiment, the stage can be maintained at a substantially constant X-Y position and the Z axis position of the stage can be changed. For example, with a constant X-Y position of the stage, steps 774-780 can be repeated for a first Z stage position, a second Z stage position, a third Z stage position, and a fourth Z stage position. FIG. 8I is a graph that illustrates the X axis force imparted on the stage as a result of the test force for a portion of the test offsets and for each Z stage position; and FIG. 8J is a graph that illustrates the Z axis force imparted on the stage as a result of the test force for a portion of the test offsets and for each Z stage position. It should be noted that in FIGS. 8I and 8J, (i) line 809 (short dashes) represents the results for the first Z stage position, (ii) line 811 (solid line) represents the results for the second Z stage position, (iii) line 813 (long dashes) represents the results for the third Z stage position, and (iv) line 815 (dotted line) represents the results for the fourth Z stage position. Further, for clarity, (i) in FIG. 8I, the test offsets are only illustrated near the designed X axis position of 36 millimeters; and (ii) in FIG. 8J, the test offsets are only illustrated near the designed Z axis position of 18 millimeters.

In this example, the first XZ commutation offset can be determined from the absolute value of the X designed position minus the average value of the test offset for each Z stage position using the X axis force. Referring to FIG. 8I, in this simplified example, (i) for the first Z stage position, the test offset is 36.5; (ii) for the second Z stage position, the test offset is 35.5; (iii) for the third Z stage position, the test offset is 35.0; and (iv) for the fourth Z stage position, the test offset is 35.7. In this embodiment, the first XZ commutation offset is 0.325 (|36−((36.5+35.5+35.0+35.7)/4)|=0.325).

Alternatively, in this example, the first XZ commutation offset can be determined the absolute value of the Z designed position minus the average value of the test offset for each Z stage position using the Z axis force. Referring to FIG. 8H, in this simplified example, (i) for the first Z stage position, the test offset is 17.0; (ii) for the second Z stage position, the test offset is 17.5; (iii) for the third Z stage position, the test offset is 17.7; and (iv) for the fourth Z stage position, the test offset is 18.5. In this embodiment, the first XZ commutation offset is 0.675 (|18−((17.0+17.5+17.7+18.5)/4)|=0.675).

In yet another embodiment, the first XZ commutation offset can be the average value of that determined utilizing the X axis force data and the Z axis force data for the plurality of Z positions. In this example, first XZ commutation offset is 0.5 ((0.325+0.675)/2=0.5).

Referring back to FIG. 7, after the first XZ commutation offset $x_{o,XZ1}$ is determined, at step 784, the control system 624 determines if all of the movers 250A-250D have been selected. If not, at step 772, the next mover 250A-250D, e.g. the second XZ mover 250D, can be selected, and the process is repeated to determine the second XZ commutation offset ("$x_{o,XZ2}$"). Again, with the stage held in a substantially constant position through closed loop control of the movers 250A-250D, the control system 224 applies the test force and at step 776, the possible test offsets are sequentially varied.

At step 778, the control system calculates the force commands and the corresponding current amplitudes for each test offset for the selected mover. Stated in another fashion, in the present example, for each possible test offset, current to the U,V, W, phases of the second XZ mover 250D are determined, and the forces are applied to the stage.

Next, at step 780, the actual force output from the test force for each test offset is determined by the force output 674 (illustrated in FIG. 6). At step 782, using the data regarding the force output, the control system determines the second XZ commutation offset for the second XZ mover 250D. The procedures described above can be used to determine the second XZ commutation offset from this data.

As one non-exclusive example, the control system 624 can utilize the X force data, the Z force data or a combination thereof to calculate the second XZ commutation offset.

After the second XZ commutation offset $x_{o,XZ2}$ is determined, at step 784, the control system 624 determines if all of the movers 250A-250D have been selected. If not, at step 772, the next mover 250A-250D, e.g. the first YZ mover 250A, can be selected, and the process is repeated to determine the first YZ commutation offset ("$y_{o,YZ1}$"). Again, with the stage held in a substantially constant position through closed loop control of the movers 250A-250D, the control system 224 applies the Y test force and at step 776, the possible test offsets are sequentially varied.

At step 778, the control system calculates the force commands and the corresponding current amplitudes for each test offset for the selected mover. Stated in another fashion, in the present example, for each possible test offset, current to the U,V, W, phases of the first YZ mover 250A are determined, and the forces are applied to the stage.

Next, at step 780, the actual force output from the test force for each test offset is determined by the force output 674 (illustrated in FIG. 6). It should be noted that for the YZ mover, the Y force and the Z force vary greatly as the test offset varies, while the X force varies only slightly as the test offset varies. At step 782, using the data regarding the force output, the control system determines the first YZ commutation offset for the first YZ mover 250A. Somewhat similar procedures as described above can be used to determine the first YZ commutation offset from this data.

As non-exclusive examples, the control system 624 can utilize the Y axis force data, the Z axis force data or a combination thereof (with or without various X-Y-Z positions) to calculate the first YZ commutation offset.

After the first YZ commutation offset $y_{o,YZ1}$ is determined, at step 784, the control system 624 determines if all of the movers 250A-250D have been selected. If not, at step 772, the next mover 250A-250D, e.g. the second YZ mover 250A, can be selected, and the process is repeated to determine the second YZ commutation offset ("$y_{o,YZ2}$"). Again, with the stage held in a substantially constant position through closed loop control of the movers 250A-250D, the control system 224 applies the Y test force and at step 776, the possible test offsets are sequentially varied.

At step 778, the control system calculates the force commands and the corresponding current amplitudes for each test offset for the selected mover. Stated in another fashion, in the present example, for each possible test offset, current to the U,V, W, phases of the second YZ mover 250B are determined, and the forces are applied to the stage.

Next, at step 780, the actual force output from the test force for each test offset is determined by the force output 674 (illustrated in FIG. 6). At step 782, using the data regarding the force output, the control system determines the second YZ commutation offset for the second YZ mover 250B. Somewhat similar procedures as described above can be used to determine the second YZ commutation offset from this data. As non-exclusive examples, the control system 624 can utilize the Y axis force data, the Z axis force data or a combination thereof (with or without various X-Y-Z positions) to calculate the second YZ commutation offset.

After all of the movers 250A-250D have been selected, this commutation process is completed at step 786. It should be noted that with this procedure, because all the closed-loop parameters, including feedback filter parameters, force distribution matrix, and motor commutations remain the same during the entire calibration process, the system stability and closed-loop performance maintain its good shape without any concern. Furthermore, because the force output is associated with the test force command, any cable force effect can be completely removed from the calibration.

The present invention is also directed to one or more compensation methods that significantly reduce the following error for the stage assemblies 18, 20 (illustrated in FIG. 1). For example, the compensation methods disclosed herein can be used to reduce the following error for a planar motor type stage assembly 220 like that illustrated in FIG. 2A. Alternatively, the compensation methods disclosed herein can be used to reduce the following error for all different types of movers, such as a single axis linear mover, a two axis mover, or a three axis mover. Moreover, the compensation methods disclosed herein can be used in mover designs that utilize coils that are moved relative to magnets, or magnets that are moved relative to coils.

As provided herein, in one embodiment, the compensation method is used by the control system 24 (illustrated in FIG. 1) to generate a separate compensation map for each stage mover assembly 18C, 20C that details the specific characteristics of each stage mover assembly 18C, 20C over their entire range of travel or a portion thereof. Subsequently, the compensation maps are used by the control system 24 to control the respective stage mover assembly 18C, 20C, and position each stage 18A, 20A (illustrated in FIG. 1) with improved accuracy.

Referring back to FIG. 2A, in one embodiment, the stage mover assembly 220C includes four sets of three-phase, two degree of freedom movers 250A, 250B, 250C, 250D. Further, each of the movers 250A, 250B, 250C, 250D generates either an X or Y force, and a Z force. In this embodiment, the control system 224 utilizes eight mover force commands (two for each mover) to control the four movers 250A, 250B, 250C, 250D to position the stage 220A with six degrees of freedom (along the X, Y, and Z axes, and about the X, Y, and Z axes). With this design, there are two redundant Z forces created by the movers 250A, 250B, 250C, 250D that can be used to minimize twisting force and to balance theta Z moment contribution from the X and Y forces. Further, the pitch moments due to the X and Y forces can be cancelled by the mover Z force commands.

Figure 9:
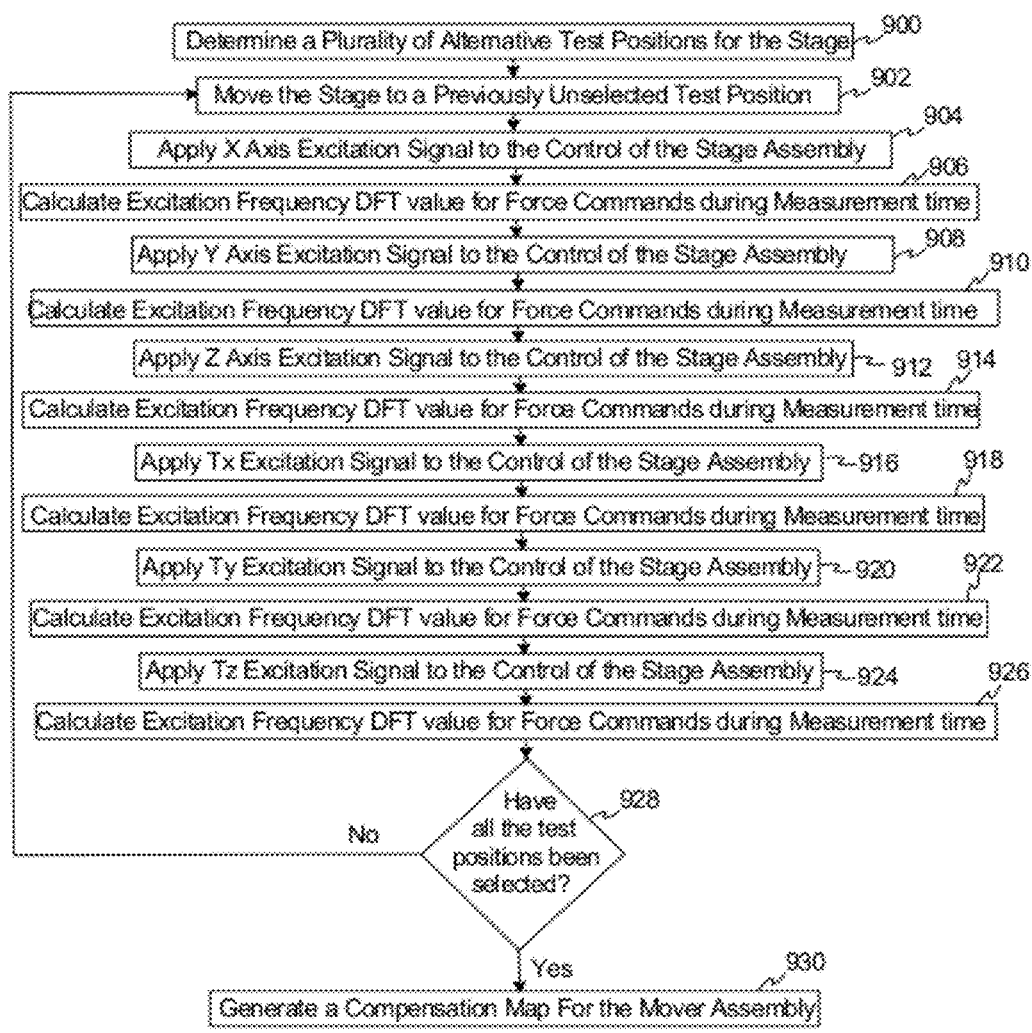
FIG. 9 is a flow chart that illustrates one method of generating a compensation map having features of the present invention.

FIG. 9 is a simplified graph that illustrates the steps that can be performed by the processor of the control system to generate the compensation map. As an overview, in one embodiment, the control system uses one or more, single frequency excitation signals at a plurality of alternative, stage test positions to check force ripples and side force effects on the center of gravity force/moment commands for the mover assembly at each of the test positions. Subsequently, the control system can generate the compensation map from the information of the force/moment commands.

Figure 10A:
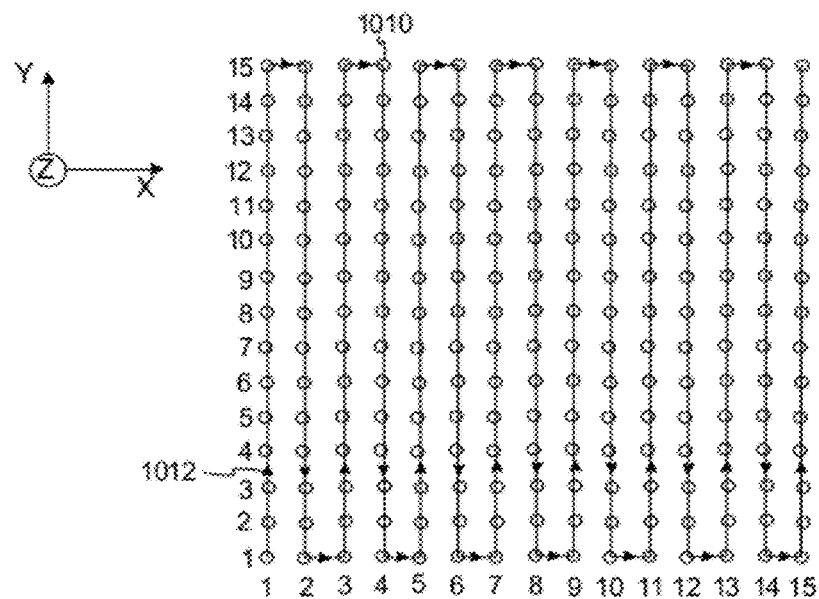
FIG. 10A is a simplified view of a plurality of test positions having features of the present invention.

As provided herein, at step 900, a plurality of alternative test positions are determined. The number of alternative test positions can be varied. Generally speaking, the accuracy of the positioning of the stage increases as the number of alternative test positions is increased. For example, FIG. 10A is a simplified illustration of one non-exclusive example of a plurality of alternative test positions 1010, with each test position 1010 being represented as a small circle. In this example, there are two hundred and twenty-five alternative test positions 1010 that are positioned along a two dimensional, fifteen by fifteen grid (labeled 1-15 for convenience of discussion) that is oriented along the X axis and the Y axis. Typically, the number of different test positions 1010 is greater than two hundred and twenty-five. For example, in alternative non-exclusive examples, there are at least approximately twenty-five hundred, five thousand, ten thousand, or twenty thousand test positions 1010. Alternatively, the number of different test positions can be less than two hundred and twenty-five.

It should noted that any of the test positions 1010 can be referred to as a first, second, third, fourth, etc test position 1010. As a non-exclusive example, (i) the test position 1010 at X=1, Y=1 can be referred to as the first test position; (ii) the test position 1010 at X=1, Y=2 can be referred to as the second test position; and (iii) the test position 1010 at X=1, Y=3 can be referred to as the third test position.

Moreover, in the example illustrated in FIG. 10A, for each of the alternative test positions 1010, a center of gravity of the stage is in approximately the same position along the Z axis, and about the X, Y, and Z axes. Alternatively or additionally, the position of the stage along the Z axis, and/or about the X, Y, and/or Z axes can also be varied between some or all of the test positions 1010.

Figure 10B:
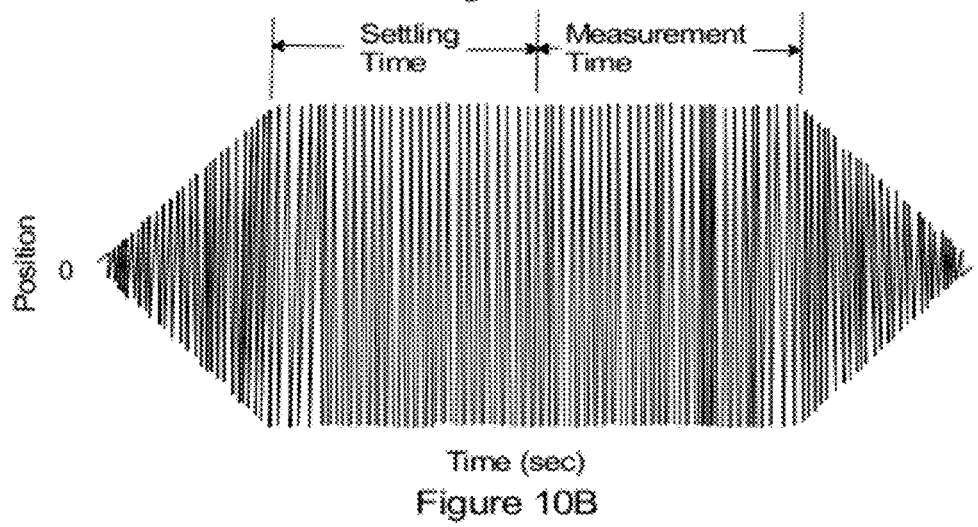
FIG. 10B illustrates position versus time for an excitation signal.
Figure 10C:
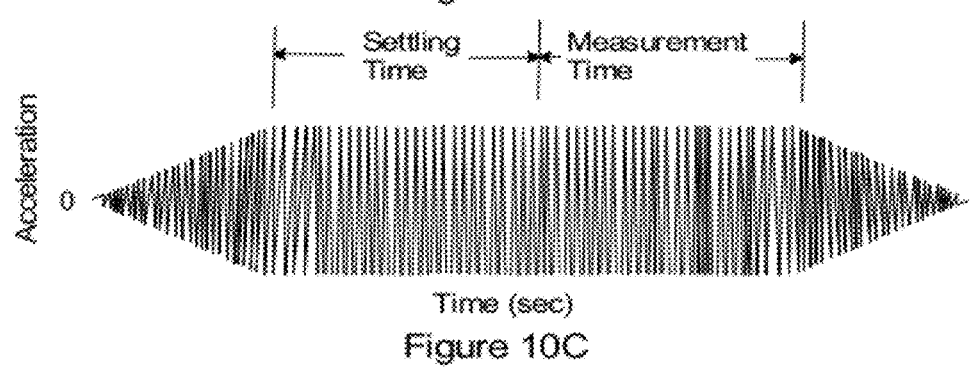
FIG. 10C illustrates acceleration versus time for an excitation signal.

FIGS. 10B and 10C are simplified illustration of an excitation signal. More specifically, FIG. 10B illustrates position versus time for an excitation signal and FIG. 10C illustrates acceleration versus time for the excitation signal. As illustrated in FIGS. 10B, 10C, the excitation signal includes a settling time during which the control of the stage assembly is settling and a measurement time during which useful data can be obtained. For example, as one example, force commands during the measurement time can be utilized to generate the compensation map. As provided herein, the measurement time can be predetermined.

Referring back to FIG. 9, at step 902, the center of gravity of the stage is moved by the stage mover assembly to a previously unselected test position, e.g. the first test position (X1, Y1). With the stage at the first test position, at step 904, the control system applies an X axis excitation signal to the control of the stage mover assembly. The X axis excitation signal is designed to cause the stage mover assembly to move that stage back and forth along the X axis at the selected amplitude and selected frequency of the X axis excitation signal.

Figure 11A:
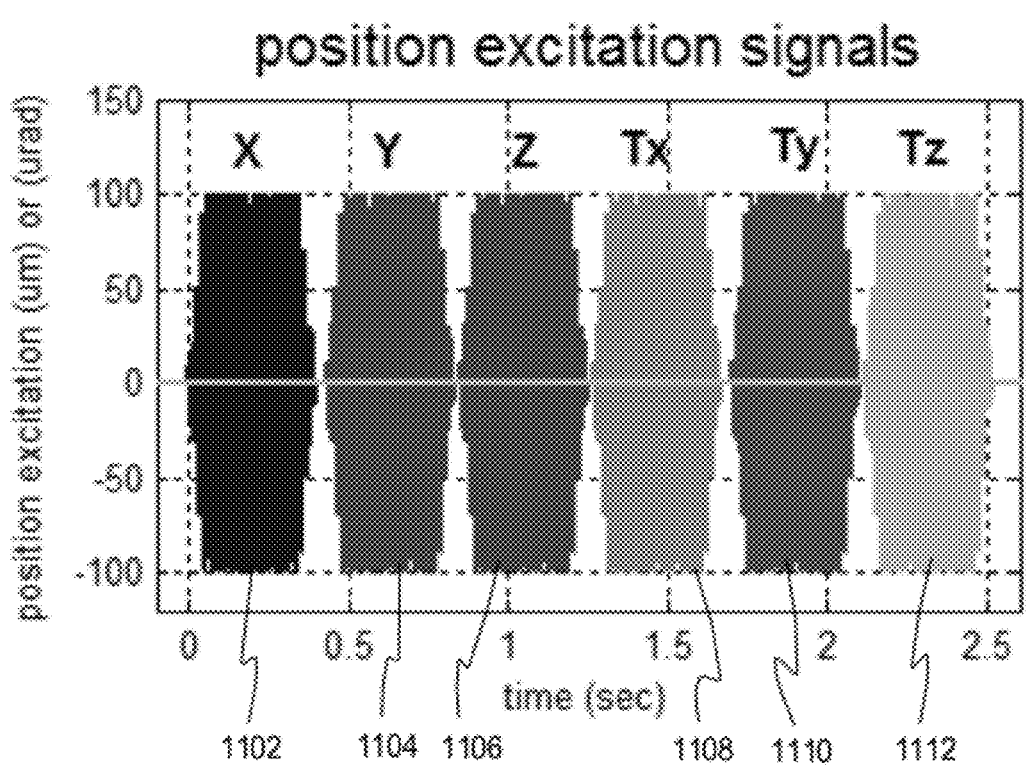
FIG. 11A is a graph that illustrates a plurality of excitation signals versus time.

FIG. 11A is a graph that illustrates a first set of excitation signals that includes six separate excitation signals 1102, 1104, 1106, 1108, 1110, 1112 versus time that are sequentially applied to the control of the mover assembly with the stage positioned at the first test position. Subsequently, the set of six separate excitation signals 1102, 1104, 1106, 1108, 1110, 1112 are sequentially applied to the control of the mover assembly for each subsequent test position of the stage. It should be noted that any of the excitation signals 1102, 1104, 1106, 1108, 1110, 1112 can be referred to as a first, second, third, fourth, fifth, or sixth excitation signal.

FIG. 11B is a graph that illustrates the X axis following error versus time that results from the six excitation signals 1102, 1104, 1106, 1108, 1110, 1112 with the stage at the first stage position; FIG. 11C is a graph that illustrates the Y axis following error versus time that results from the six excitation signals 1102, 1104, 1106, 1108, 1110, 1112 with the stage at the first stage position; FIG. 11D is a graph that illustrates the Z axis following error versus time that results from the six excitation signals 1102, 1104, 1106, 1108, 1110, 1112 with the stage at the first stage position; FIG. 11E is a graph that illustrates the theta X following error versus time that results from the six excitation signals 1102, 1104, 1106, 1108, 1110, 1112 with the stage at the first stage position; FIG. 11F is a graph that illustrates the theta Y following error versus time that results from the six excitation signals 1102, 1104, 1106, 1108, 1110, 1112 with the stage at the first stage position; and FIG. 11G is a graph that illustrates the theta Z following error versus time that results from the six excitation signals 1102, 1104, 1106, 1108, 1110, 1112 with the stage at the first stage position.

Moreover, FIG. 11H is a graph that illustrates the X axis force commands versus time that results from the six excitation signals 1102, 1104, 1106, 1108, 1110, 1112 with the stage at the first stage position; FIG. 11I is a graph that illustrates the Y axis force commands versus time that results from the six excitation signals 1102, 1104, 1106, 1108, 1110, 1112 with the stage at the first stage position; FIG. 11J is a graph that illustrates the Z axis force commands versus time that results from the six excitation signals 1102, 1104, 1106, 1108, 1110, 1112 with the stage at the first stage position; FIG. 11K is a graph that illustrates the theta X moment commands versus time that results from the six excitation signals 1102, 1104, 1106, 1108, 1110, 1112 with the stage at the first stage position; FIG. 11L is a graph that illustrates the theta Y moment commands versus time that results from the six excitation signals 1102, 1104, 1106, 1108, 1110, 1112 with the stage at the first stage position; and FIG. 11M is a graph that illustrates the theta Z moment commands versus time that results from the six excitation signals 1102, 1104, 1106, 1108, 1110, 1112 with the stage at the first stage position. It should be noted that the force/moment commands can be collectively referred to as control commands.

Referring back to FIG. 11A, starting at approximately time=0 seconds and continuing until approximately time=0.35 seconds, the X axis excitation signal 1102 is applied. Referring also to FIGS. 11B-11G, after the X axis excitation signal 1102 (illustrated in FIG. 11A) is initially applied (at approximately time=0) (i) there is a relatively large X axis error (as illustrated in FIG. 11B); (ii) there is a small Y axis error (as illustrated in FIG. 11C); (iii) there is a moderate Z axis error (as illustrated in FIG. 11D); (iv) there is a small theta X error (as illustrated in FIG. 11E); (v) there is a small theta Y error (as illustrated in FIG. 11F); and (vi) there is a small theta Z axis error (as illustrated in FIG. 11G). Thus, after the X axis excitation signal is initially applied, in addition to the movement of the stage back and forth along the X axis, there is also movement of the stage along the Y and Z axes, and about the X, Y, and Z axes. The time during which each excitation signal is initially applied is referred to herein as the "settling time".

Further, FIGS. 11B-11G illustrate that these following errors are reduced during the time the X axis excitation signal 1102 is applied because of the closed loop control of the control system. More specifically, in this example, after approximately time=0.2, the following error that results from the X axis excitation signal for each degree of freedom is relatively small. Stated in another fashion, following error that results from the X axis excitation signal for each degree of freedom is relatively small near the end of the X excitation cycle. The time near the end of each excitation signal is referred to herein as the "measurement time".

During the application of the X axis excitation signal, the control system determines the center of gravity force/moment commands that result from the X axis excitation signal. Referring to FIGS. 11A, and 11H-11M, after the X axis excitation frequency is initially applied (at approximately time=0) (i) there is a relatively large X axis force command (as illustrated in FIG. 11H); (ii) there is a small Y axis force command (as illustrated in FIG. 11I); (iii) there is a small Z axis force command (as illustrated in FIG. 11J); (iv) there is a relatively moderately sized theta X moment command (as illustrated in FIG. 11K); (v) there is a relatively large theta Y moment command (as illustrated in FIG. 11L); and (vi) there is a moderately sized theta Z axis moment command (as illustrated in FIG. 11M). Further, because, in this example, the following errors (as illustrated in FIGS. 11B-11G) are relatively small after approximately time=0.2, the force/moment commands during the measurement time of approximately time=0.2 to time=0.35 (near the end of the X excitation cycle) are very accurate for the X axis excitation signal at this test position. As a result thereof, during this measurement time, the X axis excitation signal causes the desired amplitude and frequency movement of the stage back and forth along the X axis, and almost no movement of the stage along the Y and Z axes, and about the X, Y, and Z axes.

Subsequently, in one embodiment, at step 906 of FIG. 9, the control system can calculate an excitation frequency discrete Fourier transform (DFT) value for each of the six center of gravity (CG) force/moment commands within the measurement time of the X axis excitation signal. This data can be used in the generation of the compensation map as described below.

Next, with the stage still at the first test position, at step 908, the control system applies a Y axis excitation signal to the control of the stage mover assembly. The Y axis excitation signal is designed to cause the stage mover assembly to move that stage back and forth along the Y axis at the amplitude and frequency of the Y axis excitation signal. As illustrated in FIG. 11A, starting at approximately 0.45 seconds and continuing until approximately 0.85 seconds, the Y axis excitation signal 1104 is applied. FIGS. 11B-11G illustrate that after the Y axis excitation signal is initially applied (at approximately time=0.4) (i) there is a relatively large X axis error (as illustrated in FIG. 11B); (ii) there is a relatively large Y axis error (as illustrated in FIG. 11C); (iii) there is a small sized Z axis error (as illustrated in FIG. 11D); (iv) there is a relatively small theta X error (as illustrated in FIG. 11E); (v) there is a relatively large theta Y error (as illustrated in FIG. 11F); and (vi) there is a relatively small theta Z axis error (as illustrated in FIG. 11G). Further, FIGS. 11B-11G illustrate that these errors are generally reduced during the time the Y axis excitation signal is applied because of the closed loop control of the control system. More specifically, after approximately time=0.6, the following error for each degree of freedom is relatively small.

During the application of the Y axis excitation signal, the control system determines the center of gravity force/moment commands that result from the Y axis excitation signal. FIGS. 11H-11M illustrate that after the Y axis excitation signal is initially applied (at approximately time=0.45) (i) there is a relatively small X axis force command (as illustrated in FIG. 11H); (ii) there is a relatively large Y axis force command (as illustrated in FIG. 11I); (iii) there is a small sized Z axis force command (as illustrated in FIG. 11J); (iv) there is a relatively large sized theta X moment command (as illustrated in FIG. 11K); (v) there is a moderately sized theta Y moment command (as illustrated in FIG. 11L); and (vi) there is a small sized theta Z axis moment command (as illustrated in FIG. 11M). Further, because, in this example, the following errors (as illustrated in FIGS. 11B-11G) are relatively small after approximately time=0.6, the force and moment commands during the measurement time of approximately time=0.6 to time=0.75 (near the end of the Y excitation cycle) are very accurate for the Y axis excitation signal at this test position. As a result thereof, during this measurement time, the Y axis excitation signal causes the desired amplitude and frequency movement of the stage back and forth along the Y axis, and almost no movement of the stage along the X and Z axes, and about the X, Y, and Z axes.

Subsequently, in one embodiment, at step 910 of FIG. 9, the control system can calculate an excitation frequency discrete Fourier transform (DFT) value for each of the six center of gravity (CG) force/moment commands within the measurement time of the Y axis excitation signal.

Next, with the stage still at the first test position, at step 912, the control system applies a Z axis excitation signal to the control of the stage mover assembly. The Z axis excitation signal is designed to cause the stage mover assembly to move that stage back and forth along the Z axis at the amplitude and frequency of the Z axis excitation signal. As illustrated in FIG. 11A, starting at approximately time=0.8 seconds, the Z axis excitation signal 1106 is applied. FIGS. 11B-11G illustrate the respective following errors that result from the application of the Z axis excitation signal. Further, FIGS. 11B-11G illustrate that these errors are generally reduced during the time the Z axis excitation signal is applied because of the closed loop control of the control system. More specifically, the following error for each degree of freedom is relatively small near the end of the application of the Z axis excitation signal.

During the application of the Z axis excitation signal, the control system determines the center of gravity force/moment commands that result from the Z axis excitation signal. FIGS. 11H-11M illustrate the force and moment commands that result from the Z axis excitation signal. Further, because, the following errors (as illustrated in FIGS. 11B-11G) are relatively small near the end of the Z axis excitation cycle, the force and moment commands during this measurement time are very accurate for the Z axis excitation signal at this test position.

Subsequently, in one embodiment, at step 914 of FIG. 9, the control system can calculate an excitation frequency discrete Fourier transform (DFT) value for each of the six center of gravity (CG) force/moment commands within the measurement time of the Z axis excitation signal.

Next, with the stage still at the first test position, at step 916, the control system applies a theta X excitation signal to the control of the stage mover assembly. The theta X excitation signal is designed to cause the stage mover assembly to move that stage back and forth about the X axis at the amplitude and frequency of the theta X excitation signal. FIGS. 11B-11G illustrate the respective following errors that result from the application of the theta X excitation signal. Further, FIGS. 11B-11G illustrate that these errors are generally reduced during the time the theta X excitation signal is applied because of the closed loop control of the control system. More specifically, the following error for each degree of freedom is relatively small near the end of the application of the theta X excitation signal.

During the application of the theta X excitation signal, the control system determines the center of gravity force/moment commands that result from the theta X excitation signal. FIGS. 11H-11M illustrate the force and moment commands that result from the theta X excitation signal. Further, because, in this example, the following errors (as illustrated in FIGS. 11B-11G) are relatively small near the end of the theta X excitation cycle, the force and moment commands during this measurement time are very accurate for the theta X excitation signal at this test position.

Subsequently, in one embodiment, at step 918 of FIG. 9, the control system can calculate an excitation frequency discrete Fourier transform (DFT) value for each of the six center of gravity (CG) force/moment commands within the measurement time of the theta X excitation signal.

Next, with the stage still at the first test position, at step 920, the control system applies a theta Y excitation signal to the control of the stage mover assembly. The theta Y excitation signal is designed to cause the stage mover assembly to move that stage back and forth about the Y axis at the amplitude and frequency of the theta Y excitation signal. FIGS. 11B-11G illustrate the respective following errors that result from the application of the theta Y excitation signal. Further, FIGS. 11B-11G illustrate that these errors are generally reduced during the time the theta Y excitation signal is applied because of the closed loop control of the control system. More specifically, the following error for each degree of freedom is relatively small near the end of the application of the theta Y excitation signal.

During the application of the theta Y excitation signal, the control system determines the center of gravity force/moment commands that result from the theta Y excitation signal. FIGS. 11H-11M illustrate the force and moment commands that result from the theta Y excitation signal. Further, because, in this example, the following errors (as illustrated in FIGS. 11B-11G) are relatively small near the end of the theta Y excitation cycle, the force and moment commands during this measurement time are very accurate for the theta Y excitation signal at this test position.

Subsequently, in one embodiment, at step 922 of FIG. 9, the control system can calculate an excitation frequency discrete Fourier transform (DFT) value for each of the six center of gravity (CG) force/moment commands within the measurement time of the theta Y excitation signal.

Next, with the stage still at the first test position, at step 924, the control system applies a theta Z excitation signal to the control of the stage mover assembly. The theta Z excitation signal is designed to cause the stage mover assembly to move that stage back and forth about the Z axis at the amplitude and frequency of the theta Z excitation signal. FIGS. 11B-11G illustrate the respective following errors that result from the application of the theta Z excitation signal. Further, FIGS. 11B-11G illustrate that these errors are generally reduced during the time the theta Z excitation signal is applied because of the closed loop control of the control system. More specifically, the following error for each degree of freedom is relatively small near the end of the application of the theta Z excitation signal.

During the application of the theta Z excitation signal, at step 926, the control system determines the center of gravity force/moment commands that result from the theta Z excitation signal. FIGS. 11H-11M illustrate the force and moment commands that result from the theta Z excitation signal. Further, because, in this example, the following errors (as illustrated in FIGS. 11B-11G) are relatively small near the end of the theta Z excitation cycle, the force and moment commands during this measurement time are very accurate for the theta Z excitation signal at this test position.

Subsequently, in one embodiment, at step 926 of FIG. 9, the control system can calculate an excitation frequency discrete Fourier transform (DFT) value for each of the six center of gravity (CG) force/moment commands within the measurement time of the theta Z excitation signal.

Next, at step 928, the control system evaluates if all of the test positions have been selected. If not, the center of gravity of the stage is moved to the next test position (e.g. the second test position), and the X, Y, Z, theta X, theta Y, and theta Z excitation signals are sequentially applied and the six force/moment commands are determined for each of the six excitation signals. Subsequently, the center of gravity of the stage is moved to the next test position (e.g. the third test position), and the X, Y, Z, theta X, theta Y, and theta Z excitation signals are sequentially applied and the six force/moment commands are determined for each of the six excitation signals.

This process is repeated until the X, Y, Z, theta X, theta Y, and theta Z excitation signals are sequentially applied and the resulting six force/moment commands are determined for each of the six excitation signals for each of the test positions. After that is done, the compensation map can be generated at step 930.

The selected magnitude and selected frequency of each excitation signal 1101, 1104, 1106, 1108, 1110, 1112 can be varied to suit the design requirements of the stage assembly. For example, the magnitude of each excitation signal can cause a position excitation of approximately one hundred microns along the X, Y or Z axis, or rotation of approximately one hundred microrads about the X, Y, or Z axis. Alternatively, one or more of the excitation signals can cause a position excitation of greater than or lesser than these amounts. In certain embodiments, the frequency of the excitation signal is lower than the closed loop bandwidth of the control system. For example, if system has a closed loop bandwidth of approximately one hundred hertz, the excitation frequency can be selected to be approximately fifty hertz. As alternative, non-exclusive examples, the excitation frequency can be a sine wave of approximately 20, 40, 60, 80, 100, 200, 300, 400, or 500 hertz.

Further, the duration of the excitation signal 1101, 1104, 1106, 1108, 1110, 1112 should be long enough to achieve good force/moment commands. As non-exclusive examples, each excitation cycle can have a duration of approximately 0.25, 0.3, 0.4, 0.5, or 0.6 seconds. However, the duration can be greater to less than these amounts.

Moreover, it should be noted that the present compensation method can utilize less than six excitation signals per test position. For example, the method can utilize (i) just three (e.g. the X, Y, and Z axes) of the excitation signals at each test position, (ii) just two (e.g. the X, and Y axes) of the excitation signals at each test position, or (iii) just one (e.g. the X axis) of the excitation signals at each test position.

Additionally, referring to FIG. 10, it should be noted that the order in which the test positions 1010 are evaluated can be varied. In FIG. 10, arrow 1012 illustrates one, non-exclusive example of the order in which the test positions 1010 can evaluated. In this example, the test positions 1010 with an X value of 1 are sequentially tested moving from Y=1 to Y=15. Next, the second column are sequentially tested, X=2 and moving from Y=15 to Y=1. This pattern is repeated for the entire grid. Alternatively, another order can be utilized.

Figure 12:
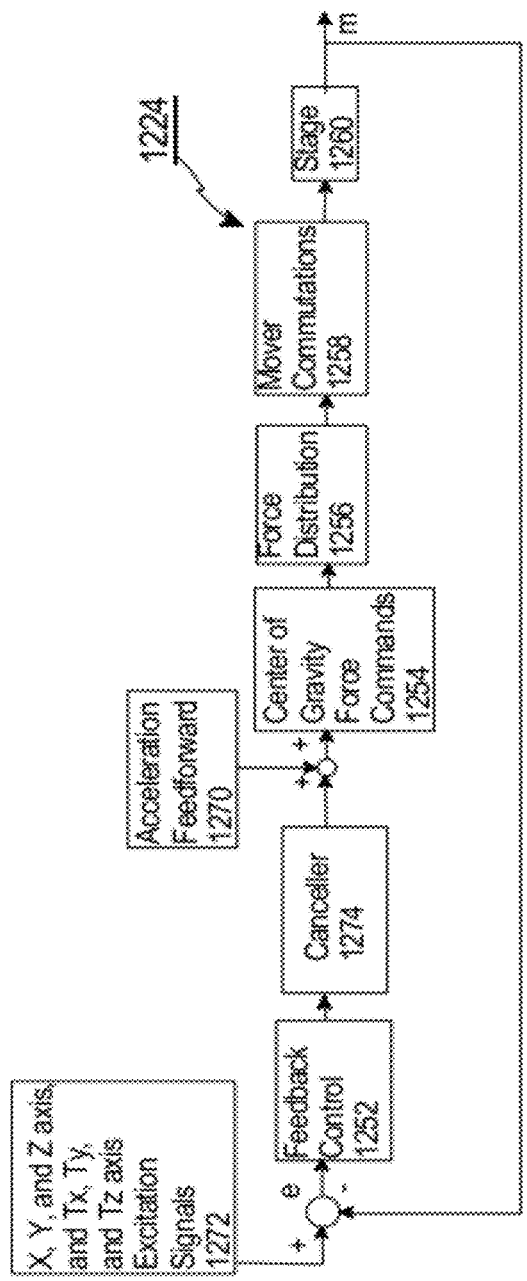
FIG. 12 is a simplified schematic of another embodiment of control system that can be used to generate a compensation map.

FIG. 12 is a simplified control block diagram of a control system 1224 that can be used to apply the sequential excitation signals, determine force/moment commands for each of the test positions, and generate the information for the compensation map for the mover assembly of FIG. 2A. With this design, the control system 1224 is able to make the feedback of the system approximately perfect at the selected frequency of the excitation signals. In FIG. 12, the control block diagram 1224 is somewhat similar to the control block diagram illustrated in FIG. 3. However, in FIG. 12, the control system 1224 includes an acceleration feedforward block 1270, an excitation signal block 1272, and a canceller block 1274.

In FIG. 12 (similar to FIG. 3), (i) "m" represents the measured, actual momentary, position; and (ii) "e" represents a following error. Further, starting at the left side of the control block diagram 1224, the excitation signal 1272 is fed into the control system 624 along with the measured position "m". Next, the control system 1224 determines the following error "e". Subsequently, the following error "e" is fed into a feedback control 1252 of the control system 1224. Further, if one or more of the movers do not push through the center of gravity of the stage, the control system 1224 can include a center of gravity force compensation map 1254 that compensates for this. Next, a force distribution 1256 determines the force commands for each of the movers necessary to correct the following error. Subsequently, the mover commutations 1258 are utilized to determine the currents that movers. Next, at block 1260, the movers move the stage.

In the design illustrated in FIG. 12, the acceleration feedforward block 1270 is used to reduce the transient delay in the movement of the stage. During movement of the stage, the desired trajectory of the stage and the mass of the stage are known. The feedforward block 1270 is used to inject a force proportional to desired acceleration that is needed to move the stage moving towards its desired destination. This reduces the transient delay of the system.

The excitation signal block 1272 is used to sequentially apply the excitation signals (e.g. the X, Y, Z, theta X, theta Y, and theta Z excitation signals) to the control of the mover assembly for each of the test positions. In one embodiment, the excitation signals can be represented by the following equations:

$x_d + A(t)\sin(wt)$ for the X excitation signal;     Equation (7)

$y_d + A(t)\sin(wt)$ for the Y excitation signal;     Equation (8)

$z_d + A(t)\sin(wt)$ for the Z excitation signal;     Equation (9)

$Tx_d + A(t)\sin(wt)$ for the theta X excitation signal;     Equation (10)

$Ty_d + A(t)\sin(wt)$ for the theta Y excitation signal; and     Equation (11)

$Tz_d + A(t)\sin(wt)$ for the theta Z excitation signal.     Equation (12)

In these equations, (i) $x_d$ is the stage X axis reference position before excitations; (ii) $y_d$ is the stage Y axis reference position before excitations; (iii) $z_d$ is stage Z axis reference position before excitations; (iv) $Tx_d$ is the stage theta X axis reference position before excitations; (v) $Ty_d$ is the stage theta Y axis reference position before excitations; (vi) $Tz_d$ is the stage theta Z axis reference position before excitations; (vii) A is the position excitation magnitude; and (viii) w is the position excitation frequency.

Further, for each test position, the canceller 1274 is used to determine the six force/moment commands for each of the six excitation signals. As provided herein, the canceller 1274 is applied to the feedback control 1252 for each degree of freedom to achieve nearly perfect control force at the excitation frequency. The design of the canceller 1274 can be varied pursuant to the teachings provided herein. In one non-exclusive embodiment, the canceller 1274 is a filter that is approximately opposite to a notch filter. In one embodiment, the canceller 1274 is a fixed parameter transfer function that is described by the following equations:

$$C_C(s) = 1 + g_c \cdot \frac{\cos(\theta_c) \cdot s + \sin(\theta_c) \cdot w_c}{s^2 + w_c^2} \quad \text{Equation (13)}$$

$$C_C(s) = \frac{s^2 + g_c\cos(\theta_c) \cdot s + g_c\sin(\theta_c) \cdot w_c + w_c^2}{s^2 + w_c^2} \quad \text{Equation (14)}$$

$$\theta_C = \angle T_{closed-loop}(w_c) \quad \text{Equation (15)}$$

$$g_C = 2d_c w_c \quad \text{Equation (16)}$$

In these equations, (i) $C_C$ is the transfer function of the canceller; (ii) is the complex argument for Laplace transform; (iii) $g_C$ is the canceller gain; (iv) $\theta_C$ is the canceller phase; (v) $w_C$ is the canceller frequency, which is selected as same as the excitation frequency $w_c = w$; (vi) $\angle T_{closed-loop}(w_c)$ is the phase of closed-loop system at the canceller frequency; and (vii) $d_C$ is numerator damping ratio of the canceller transfer function.

As provided above, for each test position, the information obtained near the end (during the measurement time) of each excitation cycle regarding the force/moment commands for each excitation signal can be subsequently used to control the stage with improved accuracy. For each test position, (i) the X, Y, Z, Tx, Ty, and Tz force/moment commands near the end (during the measurement time) of the X excitation cycle can be referred to as a X set of control commands, (ii) the X, Y, Z, Tx, Ty, and Tz force/moment commands near the end (during the measurement time) of the Y excitation cycle can be referred to as a Y set of control commands, (iii) the X, Y, Z, Tx, Ty, and Tz force/moment commands near the end (during the measurement time) of the Z excitation cycle can be referred to as a Z set of control commands, (iv) the X, Y, Z, Tx, Ty, and Tz force/moment commands near the end (during the measurement time) of the theta X excitation cycle can be referred to as a theta X set of control commands, (v) the X, Y, Z, Tx, Ty, and Tz force/moment commands near the end (during the measurement time) of the theta Y excitation cycle can be referred to as a theta Y set of control commands, and (vi) the X, Y, Z, Tx, Ty, and Tz force/moment commands near the end (during the measurement time) of the theta Z excitation cycle can be referred to as a theta Z set of control commands. Further, any of these sets can be referred to as a first, second, third, fourth, fifth, or sixth set of control commands.

Additionally, the information from the sets of control commands can be used in a number of different fashions. For example, the sets of control commands for each test position can be used to generate a compensation map that is used to subsequently control the stage with improved accuracy. Alternatively, the end of cycle force/moment commands can be used to generate motor ripple and side force information that can be used to subsequently control the stage.

In the specific example described in detail herein, for each test position, there are six separate excitation signals (namely X, Y, Z, Tx, Ty, and Tz excitation signals), and each excitation signal has six corresponding force/moment commands (X, Y, Z force commands and Tx, Ty, and Tz moment commands). This results in thirty six sets of control commands for each test position. Further, this information can be complied into a six by six matrix for each test position.

As provided above, in one non-exclusive embodiment, information regarding the force/moment commands for each test position can be used to generate a compensation map for the mover assembly. The actual procedure used to generate the compensation map can be varied. In one embodiment, a discrete Fourier transform (DFT) is used to transform the six by six matrix of control commands for each test position into a compensation map for the mover assembly. Thus, the discrete Fourier transform is used to convert force/moment commands to force constant. Stated in another fashion, a single frequency Discrete Fourier Transform is performed on all six axis force commands for good signal quality at the test excitation frequency. In one embodiment, the frequency of the Discrete Fourier Transform is the same as the frequency of the excitation signal. With this design, the good quality force/moment command information can be used to generate a very accurate and clean ripple/side force compensation map. The equation below illustrates the computation of CG force compensation ratios from X axis to all 6 axes at every test position $(x_i, y_j)$. Similar equations may be derived for CG force command compensation ratios from the other five axes to all 6 axes.

$$\begin{bmatrix} K_{XX}(x_i, y_j) \\ K_{YX}(x_i, y_j) \\ K_{ZX}(x_i, y_j) \\ K_{T_xX}(x_i, y_j) \\ K_{T_yX}(x_i, y_j) \\ K_{T_zX}(x_i, y_j) \end{bmatrix} = \text{real} \begin{bmatrix} \frac{1}{\frac{1}{NM}\sum_{i=1}^{N}\sum_{j=1}^{M} U_x(x_i, y_j)} \cdot \begin{bmatrix} U_X(x_i, y_j) \\ U_Y(x_i, y_j) \\ U_Z(x_i, y_j) \\ U_{T_x}(x_i, y_j) \\ U_{T_y}(x_i, y_j) \\ U_{T_z}(x_i, y_j) \end{bmatrix} \end{bmatrix}$$

Equation (17)

In this equation (i) $K_{XX}(x_i, y_j)$ represents the force command compensation ratio from X axis to X axis; (ii) $K_{YX}(x_i, y_j)$ represents the force command compensation ratio from X axis to Y axis; (iii) $K_{ZX}(x_i, y_j)$ represents the force command compensation ratio from X axis to Z axis; (iv) $K_{T_xX}(x_i, y_j)$ represents the force command compensation ratio from X axis to theta X axis; (v) $K_{T_yX}(x_i, y_j)$ represents the force command compensation ratio from X axis to theta Y axis; (vi) $K_{T_zX}(x_i, y_j)$ represents the force command compensation ratio from X axis to theta Z axis; (vii) $U_x(x_i, y_j)$ is the X force command DFT at position $(x_i, y_j)$; (viii) $U_y(x_i, y_j)$ is the Y force command DFT at position $(x_i, y_j)$; (ix) $U_z(x_i, y_j)$ is the Z force command DFT at position $(x_i, y_j)$; (x) $U_{Tx}(x_i, y_j)$ is the theta X force command DFT at position $(x_i, y_j)$; (xi) $U_{Ty}(x_i, y_j)$ is the theta Y force command DFT at position $(x_i, y_j)$; (xii) $U_{Tz}(x_i, y_j)$ is the theta Z force command DFT at position $(x_i, y_j)$; (xiii) N is the number of calibration positions along stage X axis; and (xiv) M is the number of calibration positions along stage Y axis.

With this design, the ratios of all-axes force command DFT are calculated, and the excitation-axis force commands DFT are averaged and normalized at all test positions.

Further, in certain embodiments, a two dimensional fast Fourier transform (or other method) can be used on the compensation map to remove potential non-smooth offset between two measurement columns, caused by hysteresis of the stage electrical cables and cooling tubes.

Figure 13A:
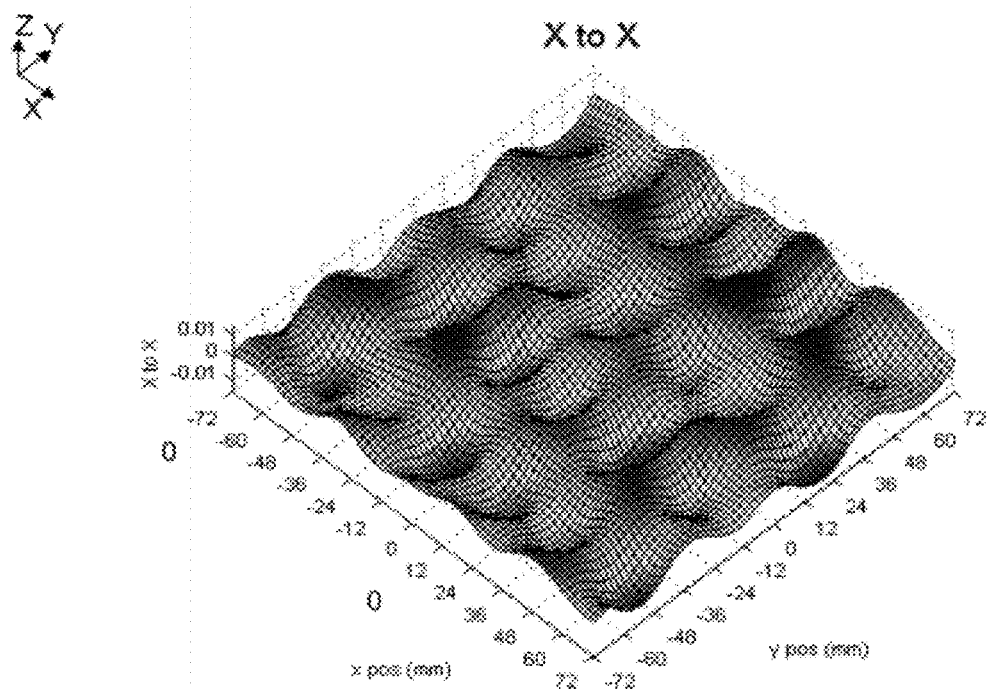
FIGS. 13A-13F illustrate compensation ratios versus a plurality of test positions.
Figure 13B:
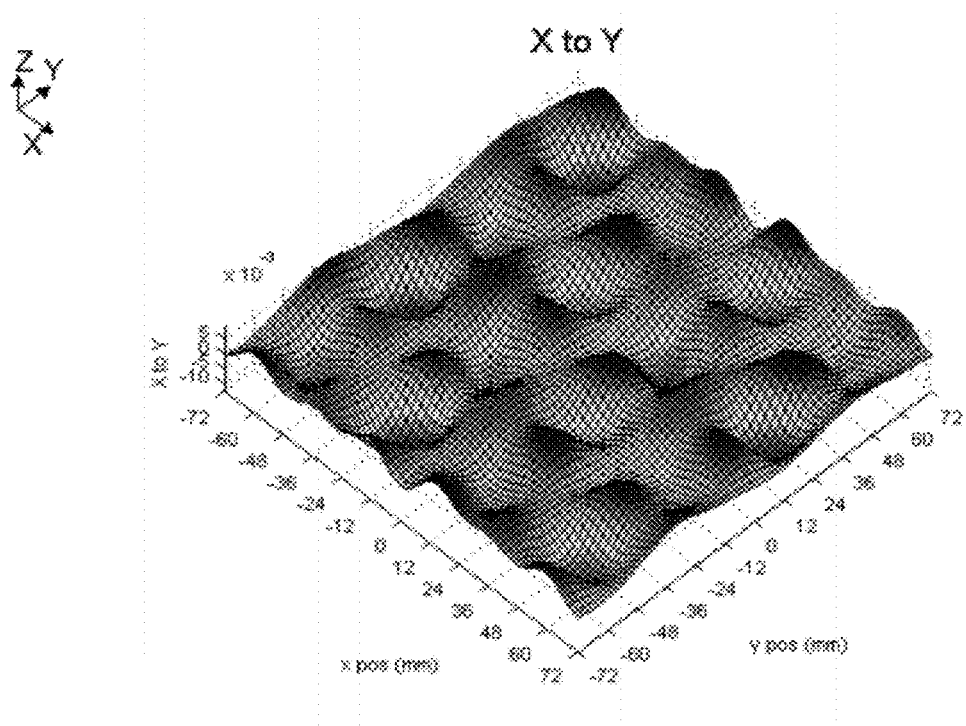
Figure 13C:
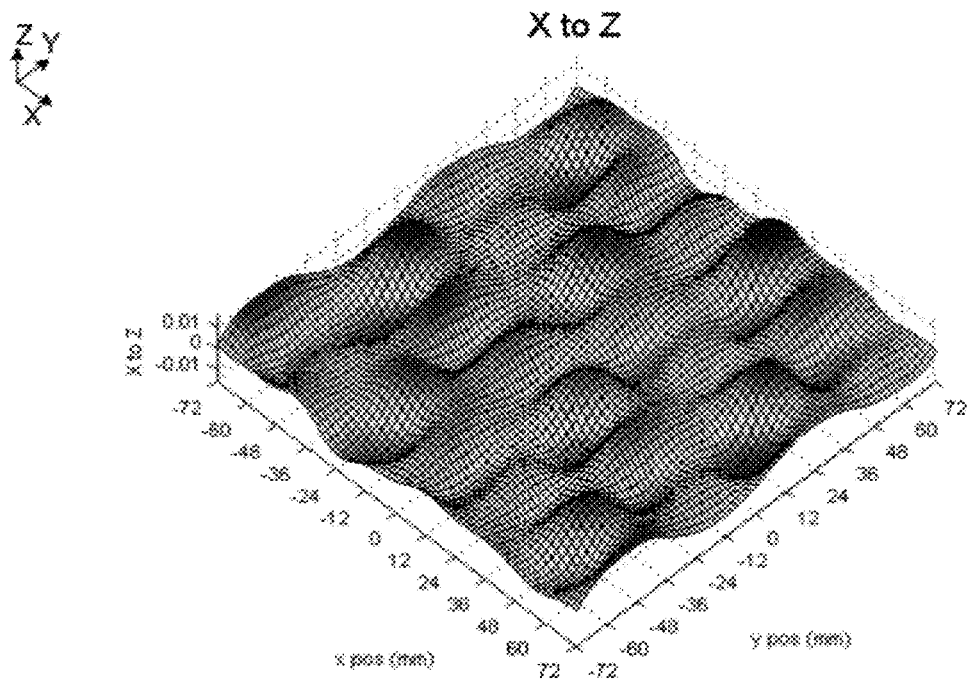
Figure 13D:
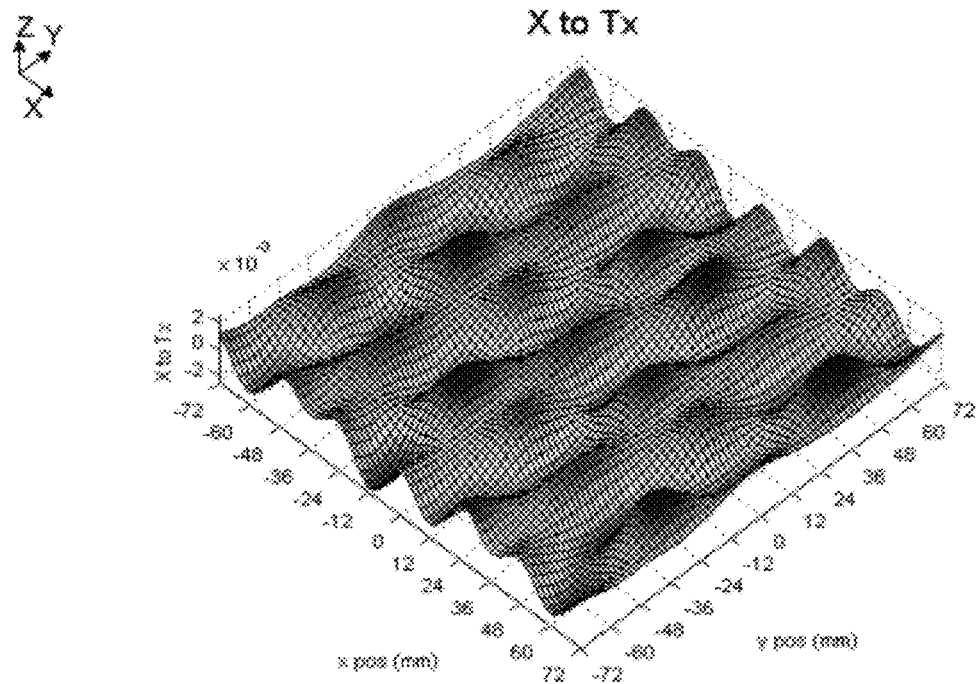
Figure 13E:
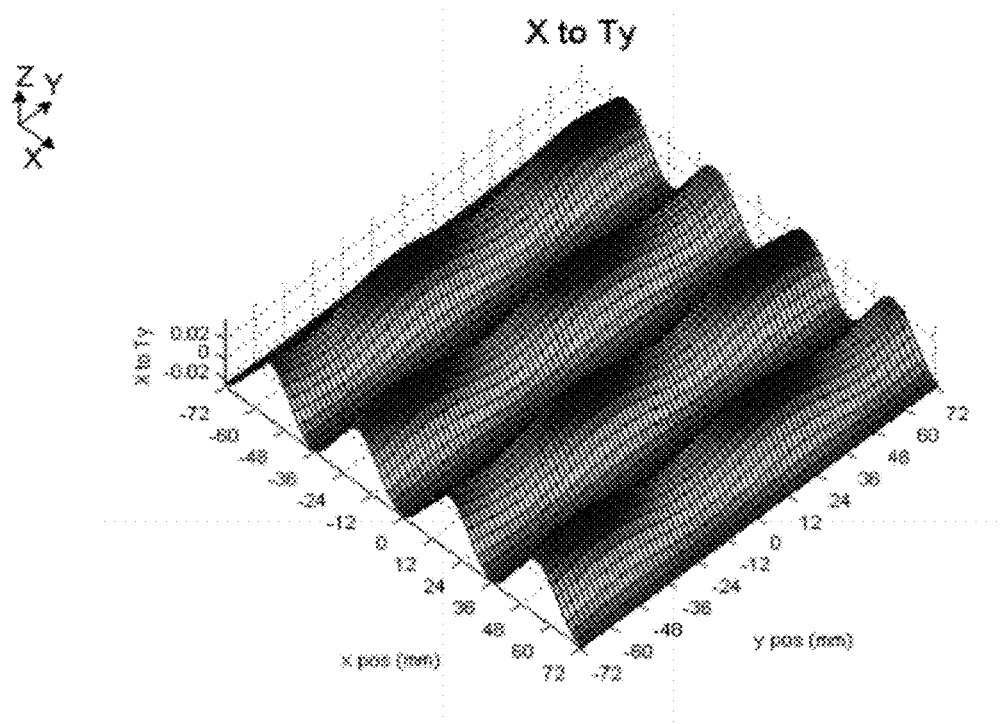
Figure 13F:
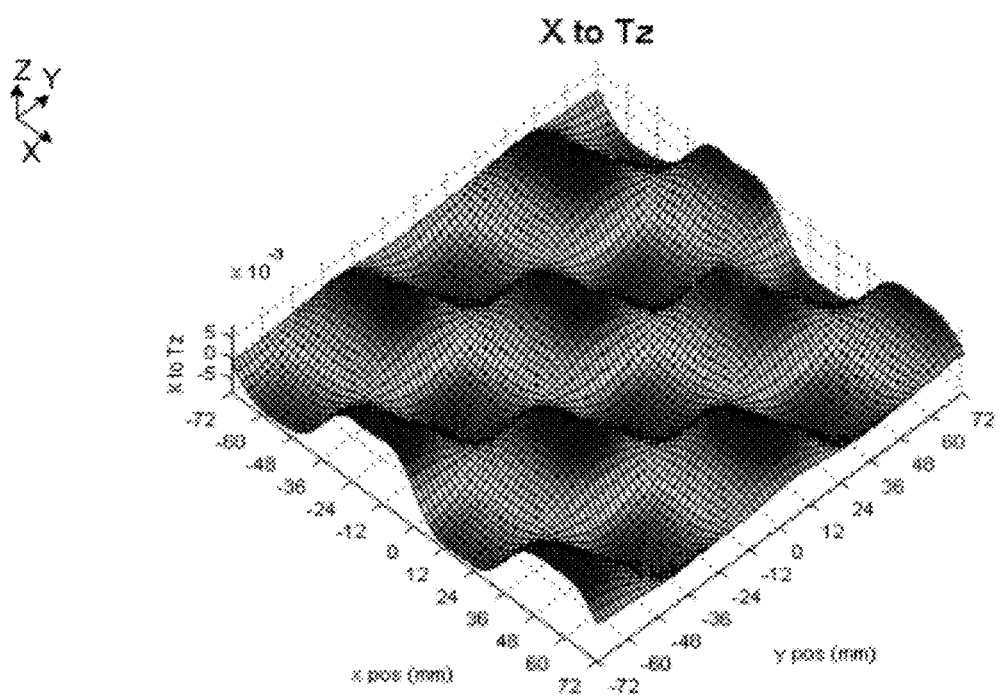

FIG. 13A is a plot that illustrates one non-exclusive example of the resulting compensation ratio for the X axis excitation signal for the X axis for the plurality of test positions; FIG. 13B is a plot that illustrates one non-exclusive example of the resulting compensation ratio for the X axis excitation signal for the Y axis for the plurality of test positions; FIG. 13C is a plot that illustrates one non-exclusive example of the resulting compensation ratio for the X axis excitation signal for the Z axis for the plurality of test positions; FIG. 13D is a plot that illustrates one non-exclusive example of the resulting compensation ratio for the X axis excitation signal for the theta X for the plurality of test positions; FIG. 13E is a plot that illustrates one non-exclusive example of the resulting compensation ratio for the X axis excitation signal for the theta Y for the plurality of test positions; and FIG. 13F is a plot that illustrates one non-exclusive example of the resulting compensation ratio for the X axis excitation signal for the theta Z for the plurality of test positions. In each Figure, the X and Y axes represents X and Y test positions of the stage, and the Z axis represents the corresponding, calculated compensation value for each test position.

The FIG. 13A plot can be generated utilizing the DFT on the X force commands near the end of the X excitation cycle for the plurality of test positions; the FIG. 13B plot can be generated utilizing the DFT on the Y force commands near the end of the X excitation cycle for the plurality of test positions; the FIG. 13C plot can be generated utilizing the DFT on the Z force commands near the end of the X excitation cycle for the plurality of test positions; the FIG. 13D plot can be generated utilizing the DFT on the theta X moment commands near the end of the X excitation cycle for the plurality of test positions; the FIG. 13E plot can be generated utilizing the DFT on the theta Y moment commands near the end of the X excitation cycle for the plurality of test positions; and the FIG. 13F plot can be generated utilizing the DFT on the theta Z moment commands near the end of the X excitation cycle for the plurality of test positions.

In this embodiment, the X sets of control commands (that result from the X excitation cycle) for each test position is used to generate six separate X plots (illustrated in FIGS. 13A-13F) that form part of the compensation map. Further, it should be noted that six separate plots can be generated for each of the other five (Y, Z, Tx, Ty, Tz) excitation signals. More specifically, (i) the Y sets of control commands for each test position can be used to generate six separate Y plots; (ii) the Z sets of control commands for each test position can be used to generate six separate Z plots; (iii) the theta X sets of control commands for each test position can be used to generate six separate theta X plots; (iv) the theta Y sets of control commands for each test position can be used to generate six separate theta Y plots; and (v) the theta Z sets of control commands for each test position can be used to generate six separate theta Z plots.

FIG. 14A is a plot that illustrates one, non-exclusive example of a resulting force compensation map 1402 for all of the test positions and all of the excitation signals. In this example, the compensation map is a six by six force compensation map 1402 that includes thirty six plots, namely (i) six X plots (the left most column 1404 of the compensation map 1402) that result from the application of the X excitation signals; (ii) six Y plots (the second from the left column 1406 of the compensation map 1402) that result from the application of the Y excitation signals; (iii) six Z plots (the third from the left column 1408 of the compensation map 1402) that result from the application of the Z excitation signals; (iv) six Tx plots (the fourth from the left column 1410 of the compensation map 1402) that result from the application of the theta X excitation signals; (v) six Ty plots (the fifth from the left column 1412 of the compensation map 1402) that result from the application of the theta Y excitation signals; and (vi) six Tz plots (the right most column 1414 of the compensation map 1402) that result from the application of the theta Z excitation signals.

Figure 14B:
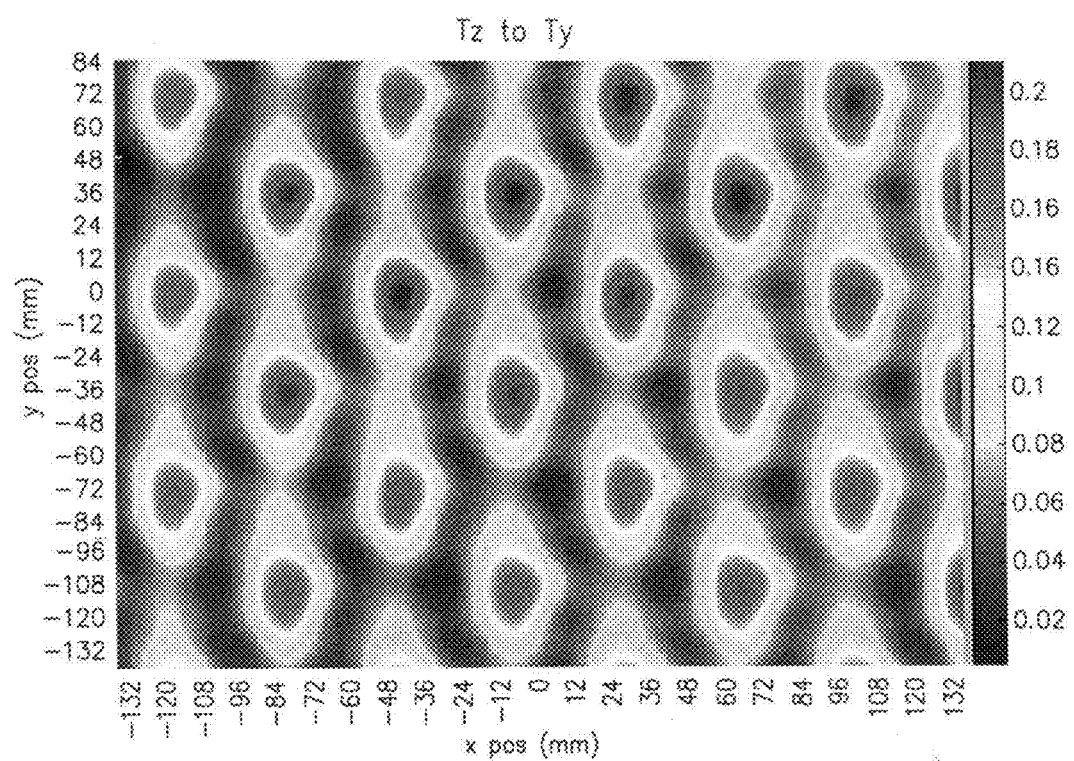
FIG. 14B is an enlarged illustration of a portion of the compensation map of FIG. 14A.

FIG. 14B is an enlarged illustration of a portion of the compensation map of FIG. 14A. More specifically, FIG. 14B illustrates the To Ty From Tz plot. This plot represents the force compensation plot for the theta Y that results from the application of the theta Z excitation signals. In FIG. 14B, each of test positions has a Y position value and an X position value. Further, for each test position has a force compensation value that is represented a shade of gray in FIG. 14B. In this Figure, the scale for each shade of gray is illustrated along the right side of the plot.

Further, it should be noted that similar to the plot illustrated in FIG. 14B, for each plot illustrated in FIG. 14A, the X axis represents the location along the X axis of the test position, the Y axis represents the location along the Y axis of the test position, and shade represents the associated compensation value.

Figure 15A:
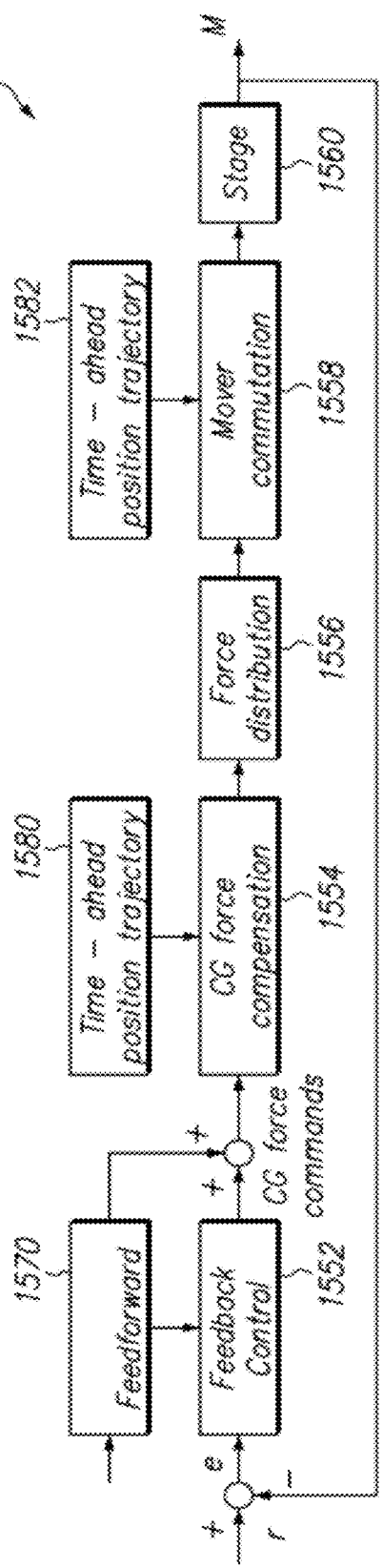
FIG. 15A is a simplified schematic of another embodiment of control system that can be used to control the mover assembly.

FIG. 15A is a simplified control block diagram of a control system 1524 that can use the compensation map 1402 (illustrated in FIG. 14A) to control the mover assembly to position the stage with improved accuracy. In FIG. 15A, the control block diagram 1524 is somewhat similar to the control block diagram illustrated in FIG. 3. However, in FIG. 15A, the control system 1524 includes the feedforward control block 1570 that is similar to but more general than the corresponding block described above and illustrated in FIG. 12, a first time-ahead position trajectory block 1580, and a second time-ahead position trajectory block 1582.

In FIG. 15A (similar to FIG. 3), (i) "r" represents a desired position; (ii) "m" represents the measured, actual momentary, position; and (iii) "e" represents a following error. Further, starting at the left side of the control block diagram 1254, the desired position is fed into the control system 1224 along with the measured position "m". Next, the control system 1224 determines the following error "e". Subsequently, the following error "e" is fed into a feedback control 1552. In one embodiment, the identified compensation map 1402 (illustrated in FIG. 14) can be used in the CG force compensation 1554 to compensate for motor force ripple, side forces and other cross-axes couplings that have been also picked up by the calibration procedure. Next, a force distribution 1556 determines the force commands for each of the movers necessary to correct the following error. Subsequently, the mover commutations 1558 are utilized to determine the currents that movers. Next, at block 1560, the movers move the stage.

In the design illustrated in FIG. 15A, feedforward block 1570 is used to provide approximately the right force command for the movement of the stage. In certain designs, the feedforward block 1570 can be an acceleration feedforward. Alternatively, the feedforward can be more general.

Further, to accommodate the system time delay generally embedded in the control system, time ahead position trajectory can be used in the CG force compensate map 1554 and motor commutation 1558 such that their outputs will happen at the correct time. The first time-ahead position trajectory 1580 is fed into the center of gravity force compensation 1554. Additionally, the information from the compensation map is used in the center of gravity force compensation 1554. The first time-ahead position trajectory 1580 is used to look where the stage position is going to be when the current is directed to the mover assembly. Thus, with the time-ahead position trajectory 1580, the correct compensation ratio from the compensation map is utilized for when the current is actually directed to the mover assembly.

Moreover, the second time-ahead position trajectory 1582 is fed into the motor commutation 1558. The second time-ahead position trajectory 1582 makes the motor currents have the correct phases.

Figure 15B:
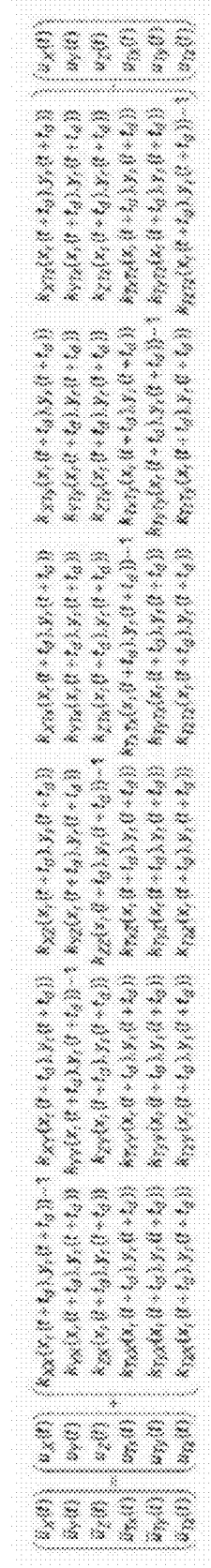
FIG. 15B is a simplified illustration of a six by six force compensation matrix.

FIG. 15B illustrates a six by six force compensation matrix. As provided herein, in certain embodiments, the generated compensation map 1402 (one example illustrated in FIG. 14A) is used in the CG force compensation block 1554 (illustrated in FIG. 15A) as a six by six, two dimensional look-up table. Utilizing interpolation methods, the look-up table provides six by six compensation matrix in FIG. 15B for every stage position.

In FIG. 15B (i) "$u_x$"—represents CG force command along the X axis; (ii) "$u_y$"—CG force command along the Y axis; (iii) "$u_z$"—represents the CG force command along the Z axis; (iv) "$u_{tx}$"—represents CG force command along the Theta-X axis; (v) "$u_{ty}$"—represents the CG force command along the Theta-Y axis; (vii) "$u_{tz}$"—represents the CG force command along the Theta-Z axis; (viii) "$k_{XX}$"—represents the force command compensation ratio from X axis to X axis; (ix) "$k_{YX}$"—represents the force command compensation ratio from X axis to Y axis; (x) "$k_{ZX}$"—represents the force command compensation ratio from X axis to Z axis; (x) "$k_{T_xX}$"—represents the force command compensation ratio from X axis to Theta-X axis; (xi) "$k_{T_yX}$"—represents the force command compensation ratio from X axis to Theta-Y axis; (xii) "$k_{T_zX}$"—represents the force command compensation ratio from X axis to Theta-Z axis; (xiii) "Xr"—represents the X axis reference position; (xiv) "Yr"—represents the Y axis reference position; (xv) "t" represents time; (xvi) "td" represents the system delay; and (xvii) "Xr(t+td)"—represents the time-ahead X axis reference position to accommodate the system time delay.

The formula used in the motor commutation 1558 for the XZ and YZ movers to transform the mover horizontal and vertical force commands to the three-phase current commands are described in Equations (1), (2), (3) and (4).

Figure 16:
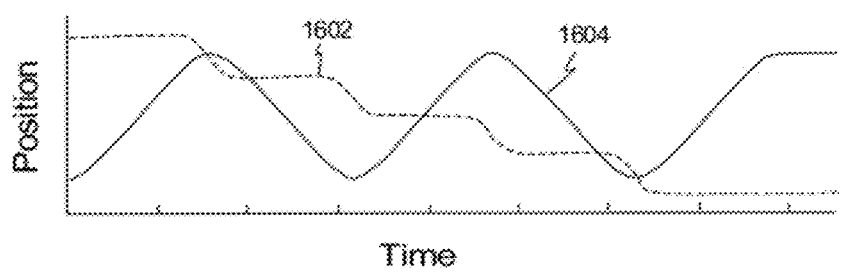
FIG. 16 is a simplified graph that illustrates position versus time.
Figure 17A:
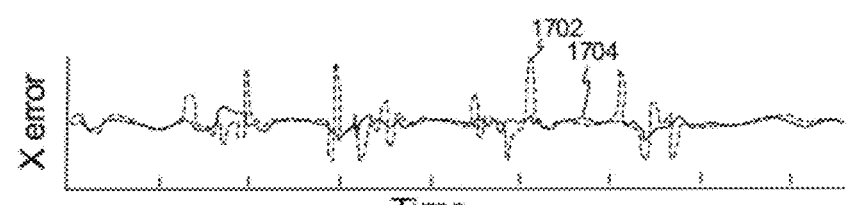
FIGS. 17A-17F are simplified graphs that illustrate following error versus time.
Figure 17B:
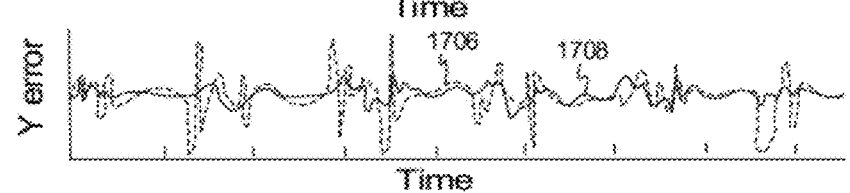
Figure 17C:
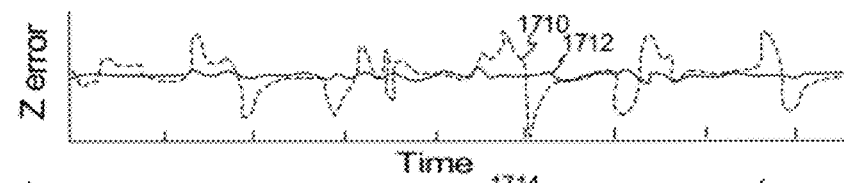
Figure 17D:
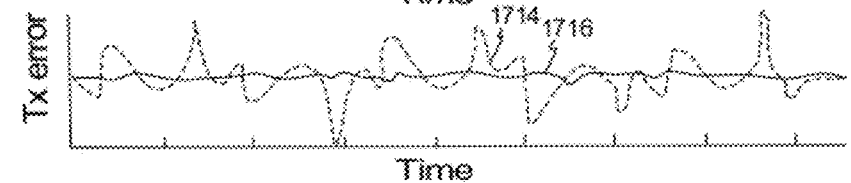
Figure 17E:
Figure 17F:
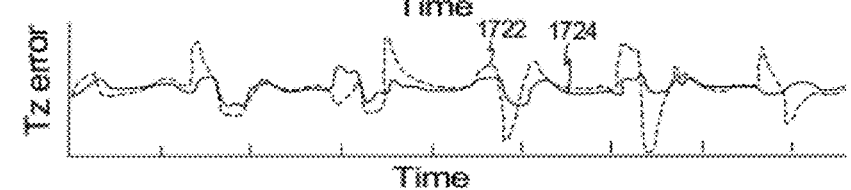

FIG. 16 is a graph that includes (i) dashed line 1602 that represents the X position of the stage versus time, and (ii) solid line 1604 that represents the Y position of the stage versus time during movement of the stage. FIG. 17A is a graph that includes (i) dashed line 1702 that represents the X following error versus time without the compensation provided herein, and (ii) solid line 1704 that represents the X following error versus time with the compensation provided for the movement illustrated in FIG. 16. FIG. 17B is a graph that includes (i) dashed line 1706 that represents the Y following error versus time without the compensation provided herein, and (ii) solid line 1708 that represents the Y following error versus time with the compensation provided for the movement illustrated in FIG. 16. FIG. 17C is a graph that includes (i) dashed line 1710 that represents the Z following error versus time without the compensation provided herein, and (ii) solid line 1712 that represents the Z following error versus time with the compensation provided for the movement illustrated in FIG. 16. FIG. 17D is a graph that includes (i) dashed line 1714 that represents the Tx following error versus time without the compensation provided herein, and (ii) solid line 1716 that represents the Tx following error versus time with the compensation provided for the movement illustrated in FIG. 16. FIG. 17E is a graph that includes (i) dashed line 1718 that represents the Ty following error versus time without the compensation provided herein, and (ii) solid line 1720 that represents the Ty following error versus time with the compensation provided for the movement illustrated in FIG. 16. FIG. 17F is a graph that includes (i) dashed line 1722 that represents the Tz following error versus time without the compensation provided herein, and (ii) solid line 1724 that represents the Tz following error versus time with the compensation provided for the movement illustrated in FIG. 16. These Figures illustrate that the stage following errors in all six degrees of freedom are highly reduced by use of the compensation methods disclosed herein.

It should also be noted even with the CG force compensation provided herein, that there can still be some smaller residual stage following errors during stepping and scanning motion due to other disturbances such as electrical cables, cooling tubes, etc.

Figure 18A:
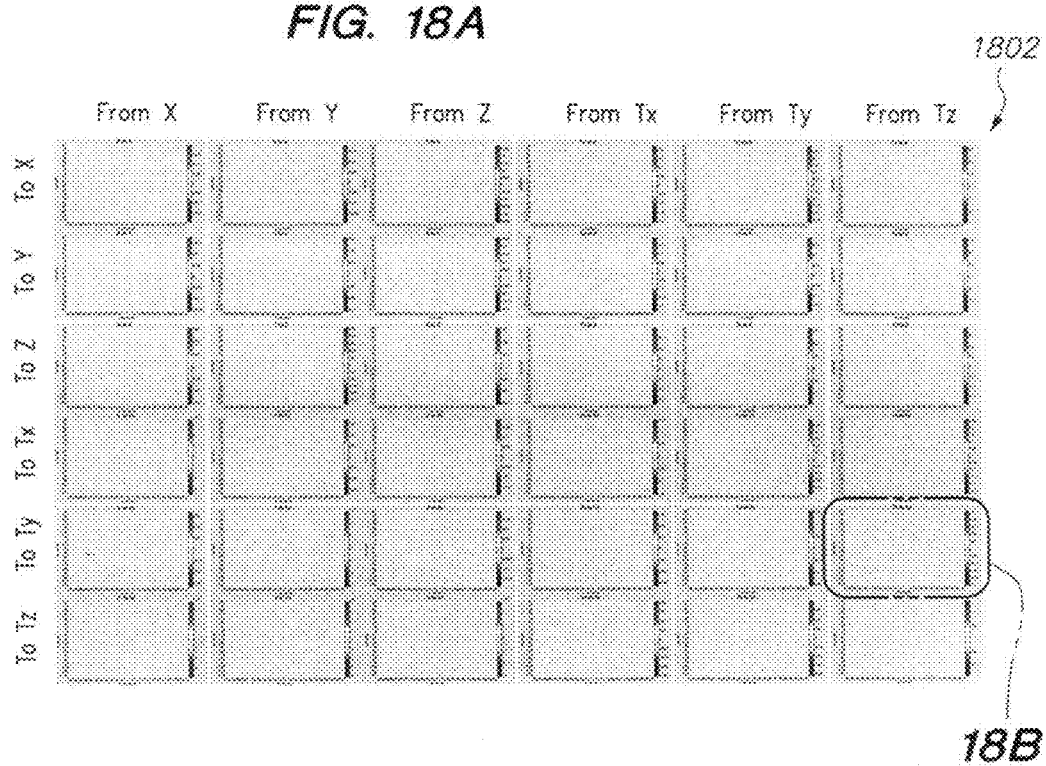
FIG. 18A is a map that illustrates the residual force compensation ratios with the application of the center of gravity force compensation.

FIG. 18A is a map 1802 that illustrates the residual force compensation ratios with the application of the center of gravity force compensation. More specifically, with the CG force compensation applied, the same calibration procedure (using multiple excitation signals at multiple measurement positions) can be used measure the residual force compensation ratios again to verify the effectiveness of the applied compensation. A comparison of the map 1802 provided in FIG. 18A with that in FIG. 14A (without compensation), illustrates the force couplings among axes after compensation are much less. The scales are the same in FIGS. 18A and 14A. Thus, FIG. 18A illustrates the effectiveness of the compensation for motor force ripples and side forces.

Figure 18B:
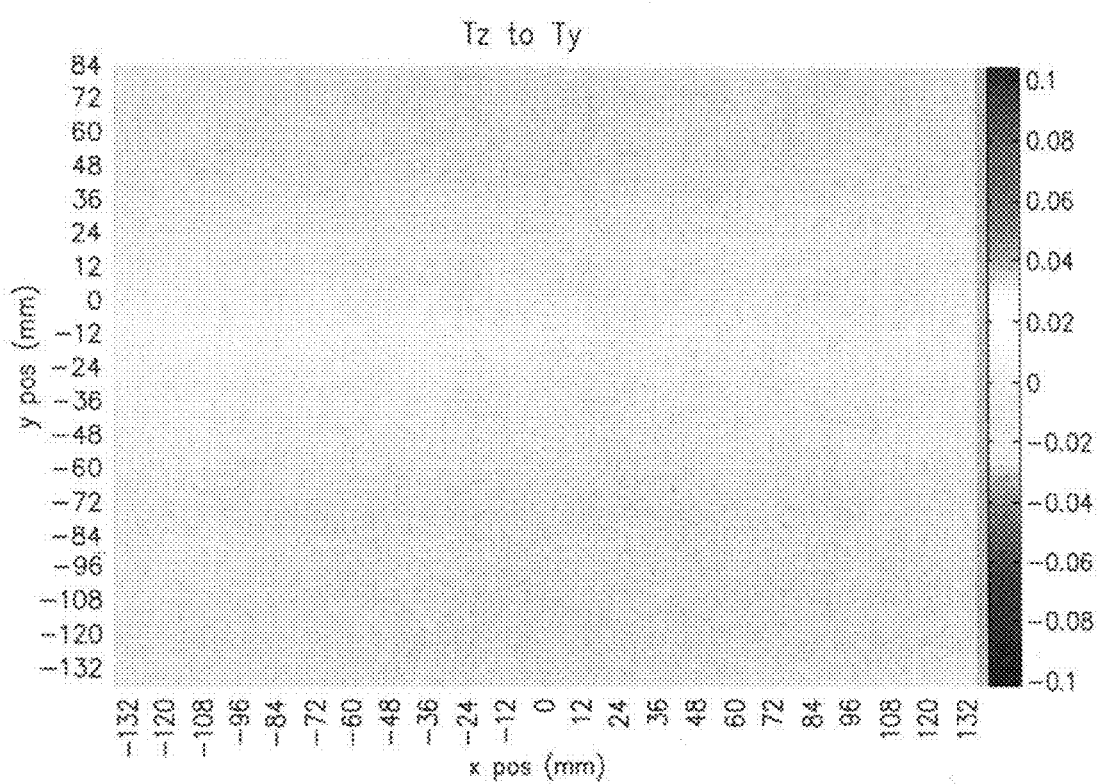
FIG. 18B is an enlarged illustration of a portion of the map of FIG. 18A.

FIG. 18B is an enlarged illustration of a portion of the map of FIG. 18A. More specifically, FIG. 18B illustrates the To Ty From Tz plot. This plot represents the plot for the theta Y that results from the application of the theta Z excitation signals. In FIG. 18B, each of test positions has a Y position value and an X position value. Further, for each test position has a force compensation value that is represented a shade of gray in FIG. 18B. In this Figure, the scale for each shade of gray is illustrated along the right side of the plot. It should be noted that for the values in this plot, the shade is approximately the same and is approximately equal to zero.

Further, it should be noted that similar to the plot illustrated in FIG. 18B, for each plot illustrated in FIG. 18A, the X axis represents the location along the X axis of the test position, the Y axis represents the location along the Y axis of the test position, and shade represents the associated compensation value.

Figure 19A:
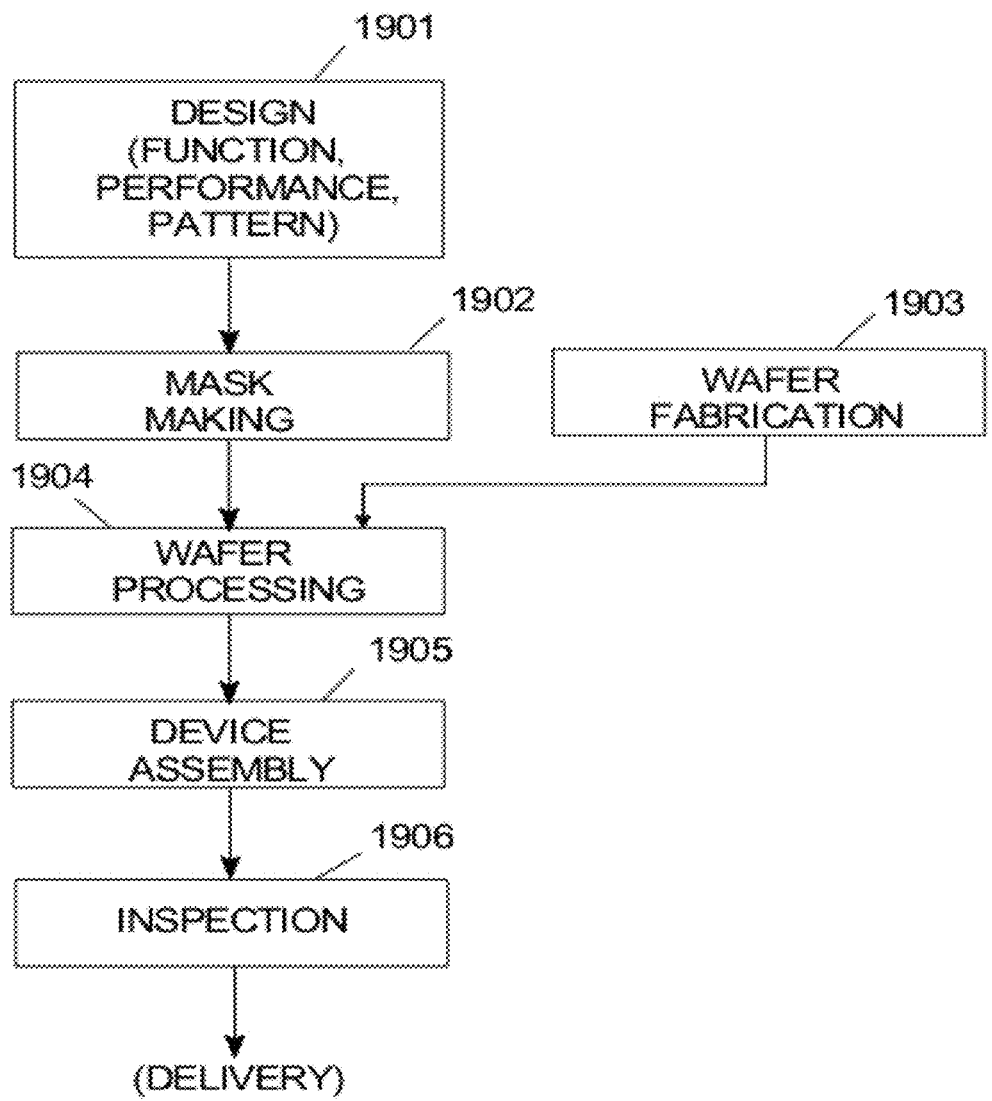
FIG. 19A is a flow chart that outlines a process for manufacturing a device in accordance with the present invention.

Semiconductor devices can be fabricated using the above described systems, by the process shown generally in FIG. 19A. In step 1901 the device's function and performance characteristics are designed. Next, in step 1902, a mask (reticle) having a pattern is designed according to the previous designing step, and in a parallel step 1903 a wafer is made from a silicon material. The mask pattern designed in step 1902 is exposed onto the wafer from step 1903 in step 1904 by a photolithography system described hereinabove in accordance with the present invention. In step 1905, the semiconductor device is assembled (including the dicing process, bonding process and packaging process), finally, the device is then inspected in step 1906.

Figure 19B:
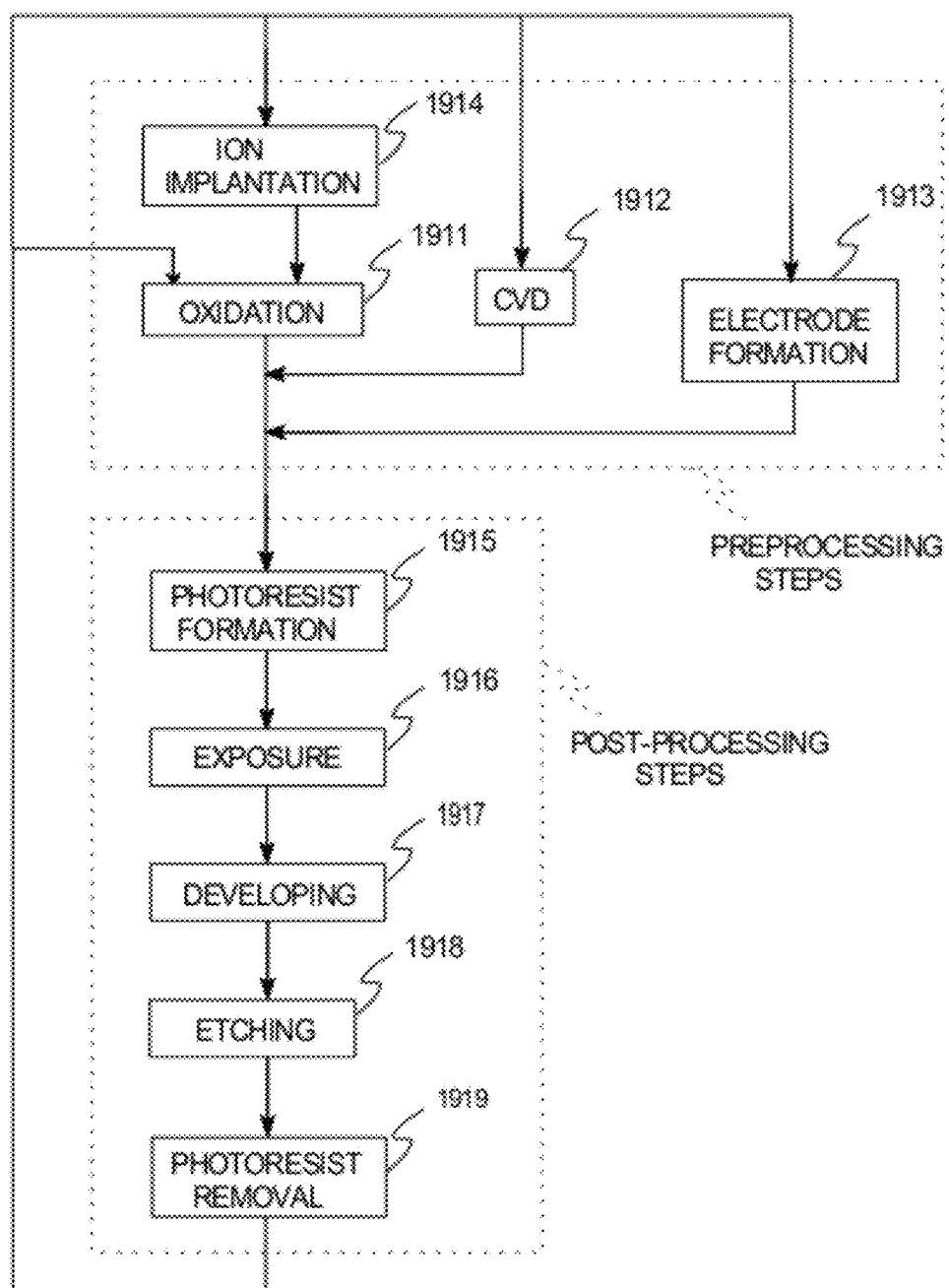
FIG. 19B is a flow chart that outlines device processing in more detail.

FIG. 19B illustrates a detailed flowchart example of the above-mentioned step 1904 in the case of fabricating semiconductor devices. In FIG. 19B, in step 1911 (oxidation step), the wafer surface is oxidized. In step 1912 (CVD step), an insulation film is formed on the wafer surface. In step 1913 (electrode formation step), electrodes are formed on the wafer by vapor deposition. In step 1914 (ion implantation step), ions are implanted in the wafer. The above mentioned steps 1911-1914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1915 (photoresist formation step), photoresist is applied to a wafer. Next, in step 1916 (exposure step), the above-mentioned exposure device is used to transfer the circuit pattern of a mask (reticle) to a wafer. Then in step 1917 (developing step), the exposed wafer is developed, and in step 1918 (etching step), parts other than residual photoresist (exposed material surface) are removed by etching. In step 1919 (photoresist removal step), unnecessary photoresist remaining after etching is removed. Multiple circuit patterns are formed by repetition of these preprocessing and post-processing steps.

It is to be understood that movers disclosed herein are merely illustrative of the presently preferred embodiments of the invention and that no limitations are intended to the details of construction or design herein shown other than as described in the appended claims.

What is claimed is:

1. A method for determining a commutation offset for a mover of a mover assembly that moves and positions a stage relative to a stage base along a plane including a first axis, the mover including a coil array and a magnet array that interacts with the coil array, the method comprising the steps of:
   measuring a measured position of stage with a measurement system and generating feedback regarding the measured position of the stage;
   controlling the mover with a control system using the feedback from the measurement system to levitate the stage above the stage base along a second axis that is vertically oriented relative to the plane, the control system including a processor;
   controlling the mover with the control system using feedback from the measurement system to maintain the position of the stage along the first axis and along the second axis; and
   obtaining information of a commutation offset for the mover, while the stage is levitated above the stage base with the mover and while controlling the mover with the control system using feedback from the measurement system to maintain the position of the stage along the first axis and along the second axis, utilizing the steps of (i) directing current to the coil array with the control system so that the mover imparts a disturbance on the stage, and (ii) evaluating one or more forces generated by the mover under the control of the control system and required to maintain the measured position of the stage along the first axis and along the second axis as a result of the disturbance on the stage to obtain information of the commutation offset, wherein the commutation offset represents an adjustment to a position of the coil array relative to the magnet assembly at the time the disturbance is imparted on the stage.

2. The method of claim 1 wherein the step of directing current includes determining the current directed to the coil array utilizing a plurality of alternative, possible commutation offsets in a motor commutation with the control system, while the stage is levitated above the stage base with the mover, and while controlling the mover with the control system using feedback from the measurement system to maintain the position of the stage along the first axis and along the second axis.

3. The method of claim 2 further comprising the step of determining a separate, second axis force command with the control system that is necessary to maintain the position of the stage along the second axis after imparting the disturbance on the stage for each possible commutation offset.

4. The method of claim 3 wherein the step of evaluating includes the step of selecting the possible commutation offset that corresponds to approximately the smallest second axis force command as the commutation offset.

5. The method of claim 2 further comprising the step of determining a separate, second axis current amplitude with the control system that is necessary to maintain the position of the stage along the second axis after imparting the disturbance on the stage for each possible commutation offset.

6. The method of claim 5 wherein the step of evaluating includes the step of selecting the possible commutation offset that corresponds to approximately the smallest, second axis current amplitude as the commutation offset.

7. The method of claim 2 further comprising the step of determining a separate, first axis force command with the control system that is necessary to maintain the position of the stage along the first axis after imparting the disturbance on the stage for each possible commutation offset.

8. The method of claim 7 wherein the step of evaluating includes the step of selecting the possible commutation offset that corresponds to the first axis force command that is approximately equal to zero.

9. The method of claim 2 further comprising the step of determining a separate, first axis current amplitude with the control system that is necessary to maintain the position of the stage along the first axis after imparting the disturbance on the stage for each possible commutation offset.

10. The method of claim 9 wherein the step of evaluating includes the step of selecting the possible commutation offset that corresponds to the first axis current amplitude that is approximately equal to zero.

11. The method of claim 1 wherein the step of directing current includes the steps of (i) inputting a test force command with the control system to the control of the mover, and (ii) utilizing a plurality of alternative, test offsets in a commutation equation with the control system to determine the current to be directed to the coil array.

12. The method of claim 11 wherein the step of evaluating includes (i) determining an actual first axis force generated by the mover on the stage for each test offset with the control system, and (ii) determining the commutation offset utilizing the actual first axis force for each test offset.

13. The method of claim 11 wherein the step of evaluating includes (i) determining an actual second axis force generated by the mover on the stage for each test offset with the control system, and (ii) determining the commutation offset utilizing the actual second axis force for each test offset.

14. The method of claim 11 wherein the step of evaluating includes (i) determining an actual first axis force and an actual second axis force generated by the mover on the stage for each test offset with the control system, and (ii) determining the commutation offset utilizing the actual first axis force and the second axis force for each test offset.

15. A method for making an exposure apparatus for transferring an image to a workpiece, the method comprising the steps of providing an optical assembly, securing the workpiece to a stage, and moving the stage relative to the optical assembly with a mover assembly including a coil array and a magnet array that interacts with the coil array, and determining the commutation offset for the mover with the method of claim 1.

16. A method for manufacturing a device comprising the steps of providing a substrate, and forming an image to the substrate with the exposure apparatus made by the method of claim 15.

17. A method for initializing a stage assembly that includes a plurality of movers, the method comprising the step of determining the commutation offset for each of the movers by the method of claim 1.

18. A mover assembly that moves and positions a stage relative to a stage base, the mover assembly comprising:
a first mover that moves and positions the stage along a plane including a first axis, and levitates and positions the stage above the stage base along a second axis that is vertically oriented relative to the plane, the first mover including a coil array and a magnet array that interacts with the coil array; and
a measurement system that measures a measured position of the stage and generates feedback regarding the measured position of the stage; and
a control system including a processor that determines a commutation offset for the first mover while controlling the first mover to maintain the position of the stage, the control system (i) directing current to the coil array so that the first mover imparts a disturbance on the stage while the stage is levitated above the stage base with the first mover and while controlling the mover to maintain the position of the stage along the first axis and along the second axis using feedback from the measurement system, and (ii) evaluating one or more forces generated by the first mover under the control of the control system and required to maintain the measured position of the stage along the first axis and along the second axis as a result of the disturbance on the stage to obtain information of the commutation offset, wherein the commutation offset represents an adjustment to a position of the coil array relative to the magnet assembly at the time the disturbance is imparted on the stage.

19. The mover assembly of claim 18 wherein the control system determines the current directed to the coil array utilizing a plurality of alternative, possible commutation offsets.

20. The mover assembly of claim 19 wherein the control system determines a second axis force command necessary to maintain the position of the stage along the second axis after imparting the disturbance on the stage for each possible commutation offset.

21. The mover assembly of claim 19 wherein the control system determines a second axis current amplitude necessary to maintain the position of the stage along the second axis after imparting the disturbance on the stage for each possible commutation offset.

22. The mover assembly of claim 19 wherein the control system determines a first axis force command necessary to maintain the position of the stage along the first axis after imparting the disturbance on the stage for each possible commutation offset.

23. The mover assembly of claim 19 wherein the control system determines a first axis current amplitude necessary to maintain the position of the stage along the first axis after imparting the disturbance on the stage for each possible commutation offset.

24. The mover assembly of claim 18 wherein the control system (i) inputs a test force command to the control of the first mover, and (ii) utilizes a plurality of alternative, test offsets to determine the current to be directed to the coil array.

25. The mover assembly of claim 24 wherein the control system (i) determines an actual first axis force generated by the first mover on the stage for each test offset, and (ii) determines the commutation offset utilizing the actual first axis force for each test offset.

26. The mover assembly of claim 24 wherein the control system (i) determines an actual second axis force generated by the first mover on the stage for each test offset, and (ii) determines the commutation offset utilizing the actual second axis force for each test offset.

27. The mover assembly of claim 18 further comprising a second mover that cooperates with the first mover to form at least a portion of a planar motor.

28. An exposure apparatus including an illumination system and the mover assembly of claim 18 that moves a stage relative to the illumination system.

29. A process for manufacturing a device that includes the steps of providing a substrate and forming an image to the substrate with the exposure apparatus of claim 28.

30. The method of claim 1 further comprising the step of determining a second axis force command with the control system that is necessary to maintain the position of the stage along the second axis after imparting the disturbance on the stage.

31. The method of claim 1 wherein the step of evaluating includes evaluating one or more second axis forces generated by the mover necessary to maintain the position of the stage along the second axis after imparting the disturbance on the stage.

32. The method of claim 1 further comprising the step of determining a second axis current amplitude with the control system that is necessary to maintain the position of the stage along the second axis after imparting the disturbance on the stage.

33. The method of claim 1 further comprising the step of determining a first axis force command with the control system that is necessary to maintain the position of the stage along the first axis after imparting the disturbance on the stage.

34. The method of claim 1 further comprising the step of determining a first axis current amplitude with the control system that is necessary to maintain the position of the stage along the first axis after imparting the disturbance on the stage.

35. The mover assembly of claim 18 wherein the control system determines a second axis force command necessary to maintain the position of the stage along the second axis after imparting the disturbance on the stage.

36. The mover assembly of claim 18 wherein the control system evaluates one or more forces generated by the first mover necessary to maintain the position of the stage along the second axis after imparting the disturbance on the stage.

37. The mover assembly of claim 18 wherein the control system determines a second axis current amplitude necessary to maintain the position of the stage along the second axis after imparting the disturbance on the stage.

38. The mover assembly of claim 18 wherein the control system determines a first axis force command necessary to maintain the position of the stage along the first axis after imparting the disturbance on the stage.

39. The mover assembly of claim 18 wherein the control system determines a first axis current amplitude necessary to maintain the position of the stage along the first axis after imparting the disturbance on the stage.

40. The mover assembly of claim 18 wherein the control system determines the current to be directed to the coil array utilizing the following commutations:

$$\begin{pmatrix} I_{u,YZ1} \\ I_{v,YZ1} \\ I_{w,YZ1} \end{pmatrix} = \begin{pmatrix} \sin\left(2\pi \cdot \frac{y+y_{o,YZ1}}{L}\right) & \cos\left(2\pi \cdot \frac{y+y_{o,YZ1}}{L}\right) \\ \sin\left(2\pi \cdot \frac{y+y_{o,YZ1}}{L} + \frac{2\pi}{3}\right) & \cos\left(2\pi \cdot \frac{y+y_{o,YZ1}}{L} + \frac{2\pi}{3}\right) \\ \sin\left(2\pi \cdot \frac{y+y_{o,YZ1}}{L} + \frac{4\pi}{3}\right) & \cos\left(2\pi \cdot \frac{y+y_{o,YZ1}}{L} + \frac{4\pi}{3}\right) \end{pmatrix} \cdot \begin{pmatrix} A_{y,YZ1} \\ A_{z,YZ1} \end{pmatrix}$$

wherein (i) $I_{u,YZ1}$ is a current command directed to a U phase coil of the coil array; (ii) $I_{v,YZ1}$ is a current command directed to a V phase coil of the coil array, (iii) $I_{w,YZ1}$ is a current command directed to a W phase coil of the coil array; (iv) y is a measured position along the first axis of the coil array; (v) $Y_{o,YZ1}$ is the commutation offset of the coil array; (vi) L is an associated motor commutation pitch; (vii) $A_{y,ZY1}$ is a current amplitude required to produce a desired force along the first axis and is equal to $$A_{y,YZ1} = \frac{F_{Y1}}{k_{y,YZ1}};$$

(vi) $A_{z,ZY1}$ is a current amplitude required to produce a desired force along the second axis and is equal to $$A_{z,YZ1} = \frac{F_{Z1}}{k_{z,YZ1}};$$

(ix) $k_{y,YZ1}$ is a motor force constant of the mover along the first axis; (x) $k_{z,YZ1}$ is a motor force constant along the second axis of the mover; (xi) $F_{Y1}$ is a motor force command along the first axis; and (xii) $F_{Z1}$ is a motor force command along the second axis.

41. The method of claim 1 further comprising the step of determining the current to be directed to the coil array utilizing the following commutations:

$$\begin{pmatrix} I_{u,YZ1} \\ I_{v,YZ1} \\ I_{w,YZ1} \end{pmatrix} = \begin{pmatrix} \sin\left(2\pi \cdot \frac{y+y_{o,YZ1}}{L}\right) & \cos\left(2\pi \cdot \frac{y+y_{o,YZ1}}{L}\right) \\ \sin\left(2\pi \cdot \frac{y+y_{o,YZ1}}{L} + \frac{2\pi}{3}\right) & \cos\left(2\pi \cdot \frac{y+y_{o,YZ1}}{L} + \frac{2\pi}{3}\right) \\ \sin\left(2\pi \cdot \frac{y+y_{o,YZ1}}{L} + \frac{4\pi}{3}\right) & \cos\left(2\pi \cdot \frac{y+y_{o,YZ1}}{L} + \frac{4\pi}{3}\right) \end{pmatrix} \cdot \begin{pmatrix} A_{y,YZ1} \\ A_{z,YZ1} \end{pmatrix}$$

wherein (i) $I_{u,YZ1}$ is a current command directed to a U phase coil of the coil array; (ii) $I_{v,YZ1}$ is a current command directed to a V phase coil of the coil array, (iii) $I_{w,YZ1}$ is a current command directed to a W phase coil of the coil array; (iv) y is a measured position along the first axis of the coil array; (v) $Y_{o,YZ1}$ is the commutation offset of the coil array; (vi) L is an associated motor commutation pitch; (vii) $A_{y,ZY1}$ is a current amplitude required to produce a desired force along the first axis and is equal to $$A_{y,YZ1} = \frac{F_{Y1}}{k_{y,YZ1}};$$

(viii) $A_{z,ZY1}$ is a current amplitude required to produce a desired force along the second axis and is equal to $$A_{z,YZ1} = \frac{F_{Z1}}{k_{z,YZ1}};$$

(ix) $k_{y,YZ1}$ is a motor force constant of the mover along the first axis; (x) $k_{z,YZ1}$ is a motor force constant along the second axis of the mover; (xi) $F_{Y1}$ is a motor force command along the first axis; and (xii) $F_{Z1}$ is a motor force command along the second axis.

* * * * *